United States Patent
Makimura et al.

(10) Patent No.: US 10,340,444 B2
(45) Date of Patent: Jul. 2, 2019

(54) SEMICONDUCTOR ELEMENT WITH HALL ELEMENT AND SEALING RESIN

(71) Applicant: ROHM CO., LTD., Kyoto-shi, Kyoto (JP)

(72) Inventors: Yuji Makimura, Kyoto (JP); Takaaki Masaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/847,532

(22) Filed: Dec. 19, 2017

(65) Prior Publication Data
US 2018/0182953 A1   Jun. 28, 2018

(30) Foreign Application Priority Data

Dec. 28, 2016  (JP) .................................. 2016-255722
Jan. 12, 2017  (JP) .................................. 2017-003330
Oct. 20, 2017  (JP) .................................. 2017-203336

(51) Int. Cl.
*H01L 43/04* (2006.01)
*G01R 33/07* (2006.01)
*H01L 43/14* (2006.01)
*H01L 43/06* (2006.01)

(52) U.S. Cl.
CPC .............. *H01L 43/04* (2013.01); *G01R 33/07* (2013.01); *H01L 43/065* (2013.01); *H01L 43/14* (2013.01)

(58) Field of Classification Search
None
See application file for complete search history.

(56) References Cited

U.S. PATENT DOCUMENTS

| 4,186,481 | A | * | 2/1980 | Noguchi | ............... | G11B 5/1335 |
| | | | | | | 29/603.16 |
| 4,644,643 | A | * | 2/1987 | Sudo | ..................... | H02K 29/08 |
| | | | | | | 156/273.9 |
| 2005/0086794 | A1 | * | 4/2005 | Fukunaka | .............. | G01R 33/07 |
| | | | | | | 29/603.01 |
| 2017/0271575 | A1 | * | 9/2017 | Hioka | ................... | H01L 43/065 |

FOREIGN PATENT DOCUMENTS

| JP | 2006-156674 A | 6/2006 |
| JP | 2013-197386 A | 9/2013 |

* cited by examiner

*Primary Examiner* — Dung A. Le
(74) *Attorney, Agent, or Firm* — Hamre, Schumann, Mueller & Larson, P.C.

(57) ABSTRACT

A semiconductor device includes a Hall element, a sealing resin and at least one mount surface. The Hall element includes a functional surface and at least one electrode provided on the functional surface. The sealing resin includes a resin obverse surface and a resin reverse surface spaced apart from each other in a thickness direction, and covers at least a portion of the Hall element. The mount surface is electrically connected to the electrode of the Hall element and exposed from the resin reverse surface. The Hall element includes an exposed surface opposite to the functional surface. The exposed surface is flush with either one of the resin obverse surface and the resin reverse surface.

20 Claims, 52 Drawing Sheets

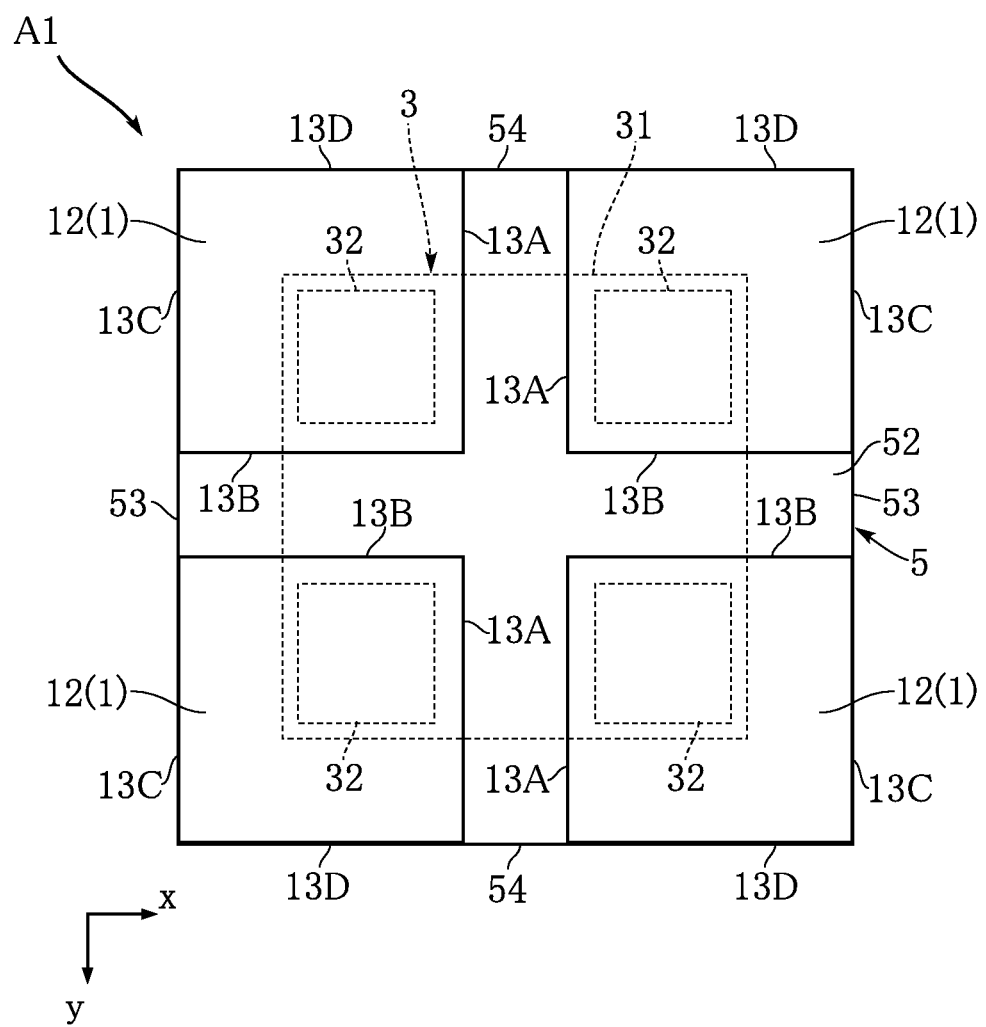

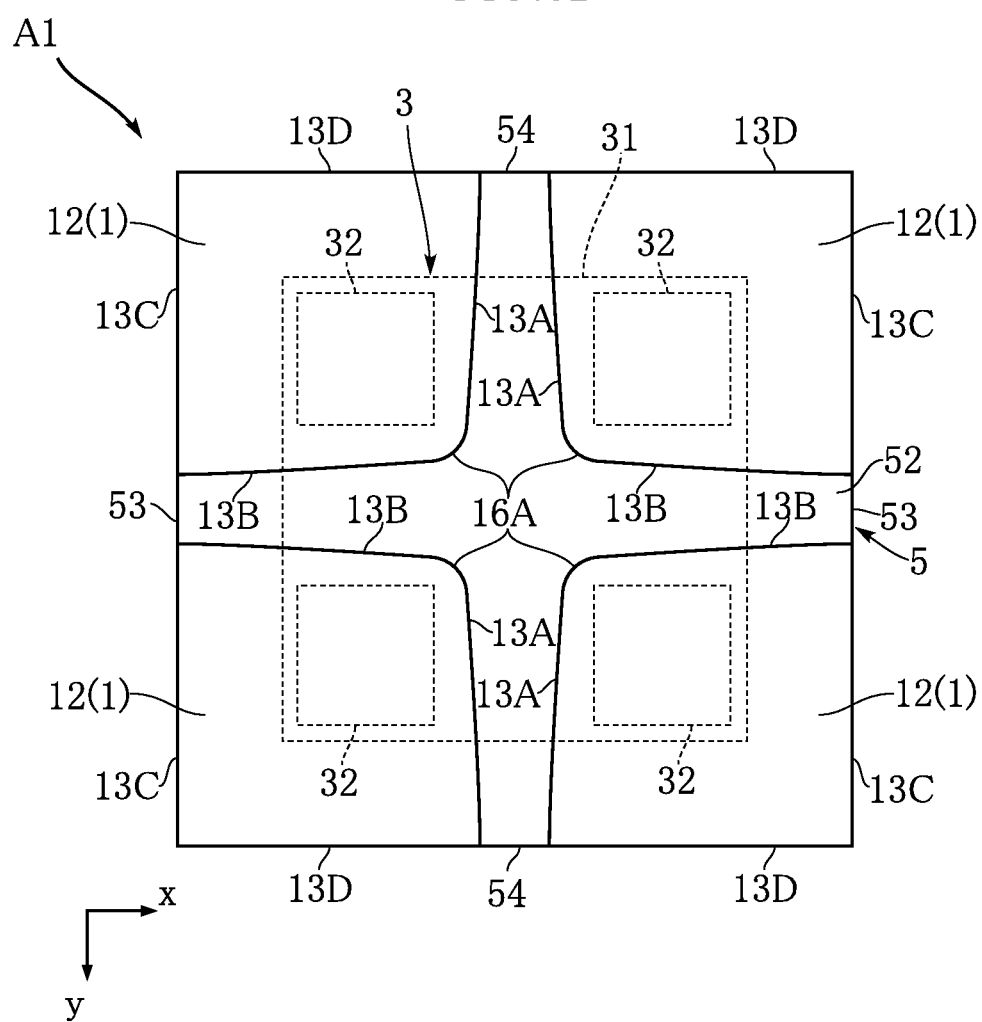

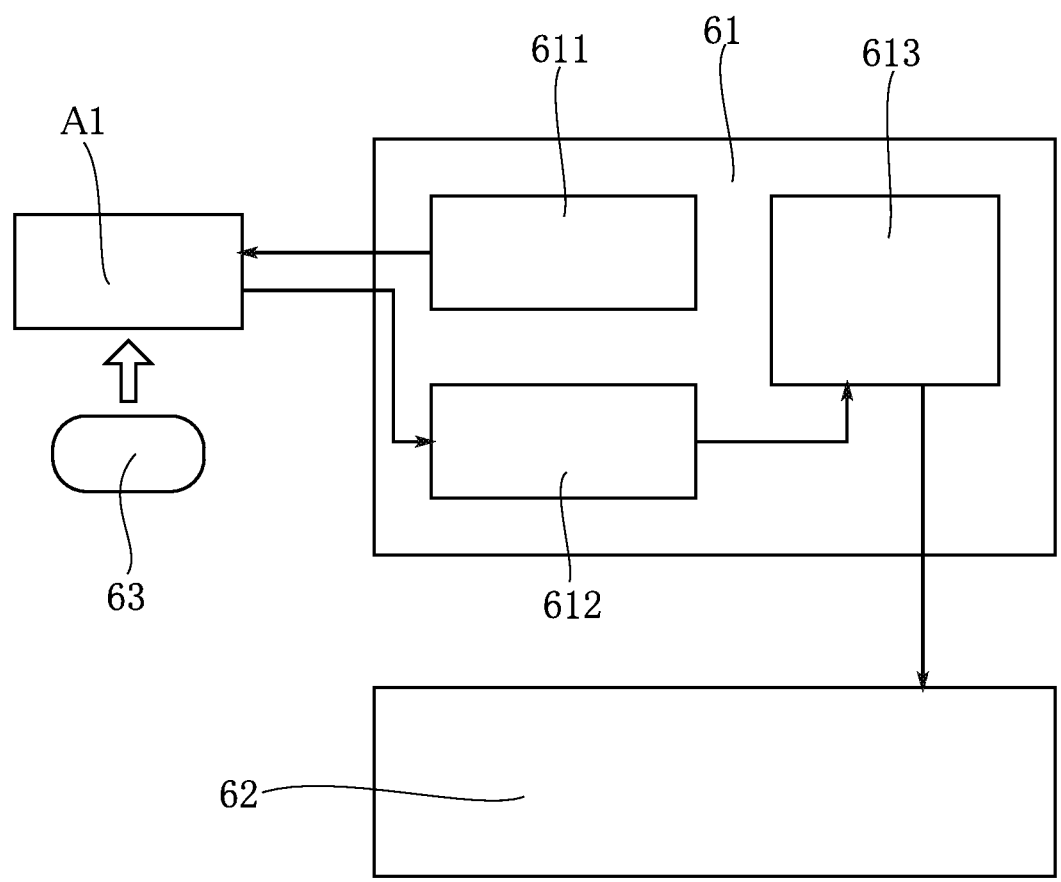

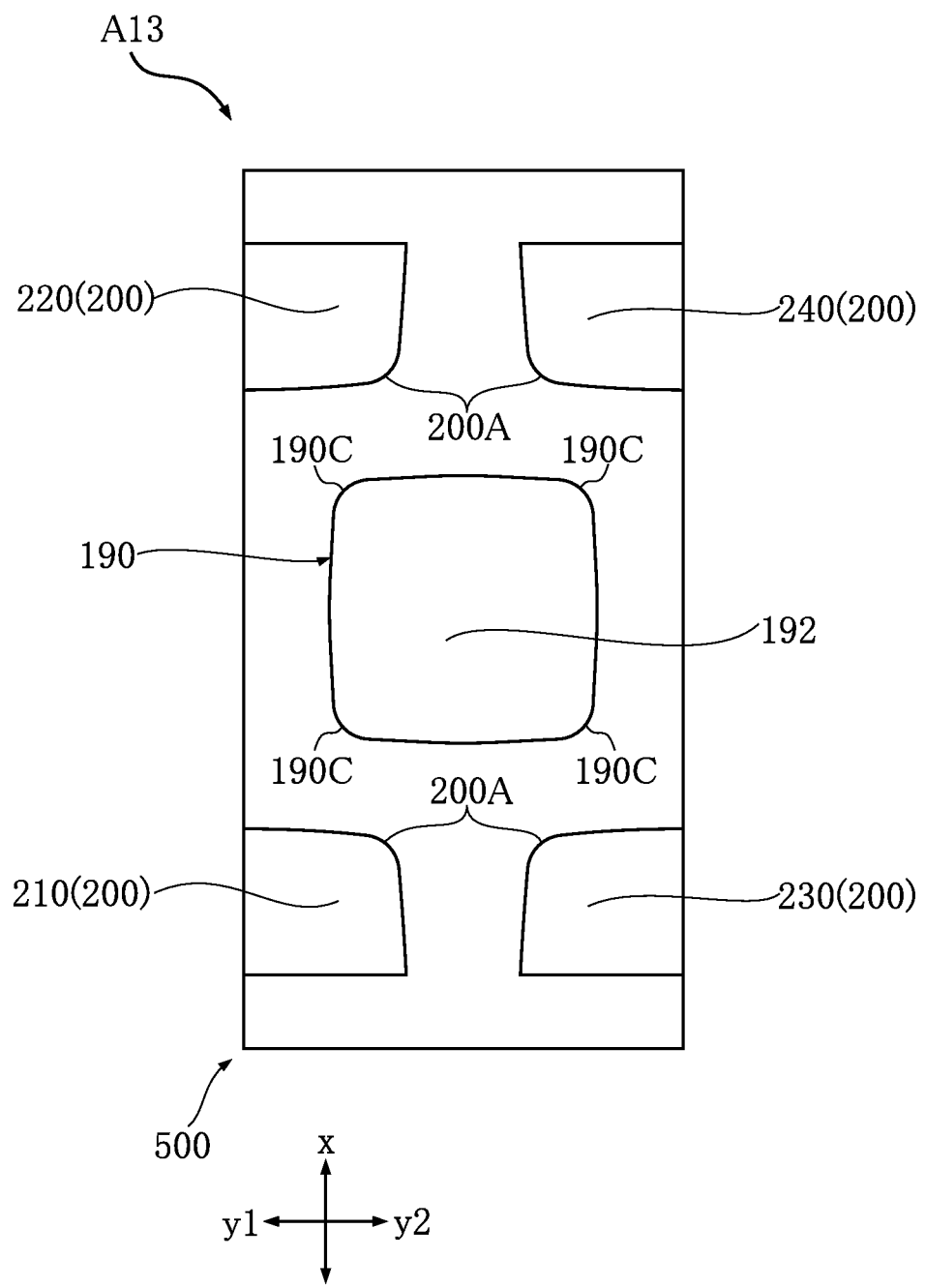

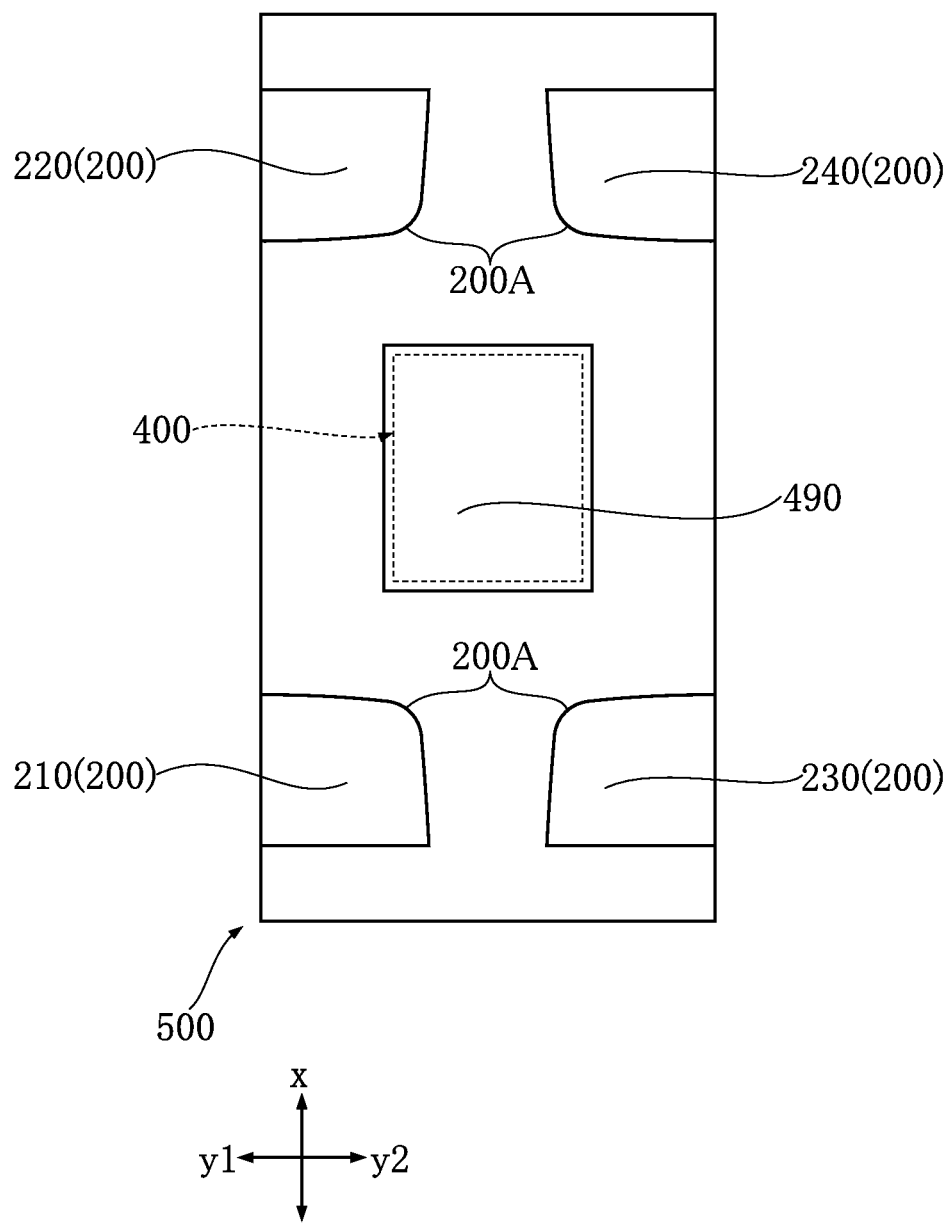

SEMICONDUCTOR ELEMENT WITH HALL ELEMENT AND SEALING RESIN

FIELD

The present disclosure relates to a semiconductor device and a method for manufacturing a semiconductor device.

BACKGROUND

As is well known, a Hall element can be used as a sensor of various forms due to the Hall effect. For example, incorporating a Hall element into a mobile phone makes it possible to detect opening or closing of the main body of the mobile phone.

As an example, JP-A-2013-197386 discloses a semiconductor device in which a Hall element is mounted. This semiconductor device includes, in addition to the Hall element, a lead electrically connected to the Hall element, and a sealing resin covering the Hall element and the lead.

In recent years, there is an increasing demand for thickness reduction of semiconductor devices. For the semiconductor device disclosed in the above-described document, the thickness of the sealing resin covering the Hall element adds to the thickness of the entire device. Such a structure still has a room for improvement in terms of thickness reduction.

SUMMARY

In light of the above circumstances, an object of the present disclosure is to provide a semiconductor device that can achieve thickness reduction.

A semiconductor device provided according to a first aspect of the present disclosure includes a Hall element including a functional surface and at least one electrode provided on the functional surface, a sealing resin including a resin obverse surface and a resin reverse surface spaced apart from each other in a thickness direction and covering at least a portion of the Hall element, and at least one mount surface electrically connected to the electrode and exposed from the resin reverse surface. The Hall element includes an exposed surface opposite to the functional surface, and the exposed surface is flush with either one of the resin obverse surface and the resin reverse surface.

A method for manufacturing a semiconductor device, which is provided according to a second aspect of the present disclosure, includes the steps of preparing a lead frame including at least one terminal, bonding an electrode provided on a functional surface of a Hall element to the terminal with a conductive bonding material, covering an entirety of the Hall element and at least a portion of the terminal with a resin material, and grinding the resin material and the Hall element from a side opposite to the functional surface. In the grinding step, an exposed surface is formed at the Hall element, and a resin obverse surface is formed at the resin material. At that time, the exposed surface of the Hall element and the resin obverse surface are made flush with each other.

Other features and advantages of the present disclosure become apparent from the detailed description given below with reference to the accompanying drawings.

BRIEF DESCRIPTION OF THE DRAWINGS

FIG. 3A is a bottom view of the semiconductor device shown in FIG. 1;

FIG. 3B is a bottom view showing a variation of the structure shown in FIG. 3A;

FIG. 6 is a block diagram of a circuit using the semiconductor device shown in FIG. 1;

FIG. 42B is a bottom view showing a variation of the structure shown in FIG. 42A;

FIG. 45B is a bottom view showing a variation of the structure shown in FIG. 45A;

DESCRIPTION OF THE PREFERRED EMBODIMENTS

Figure 1:
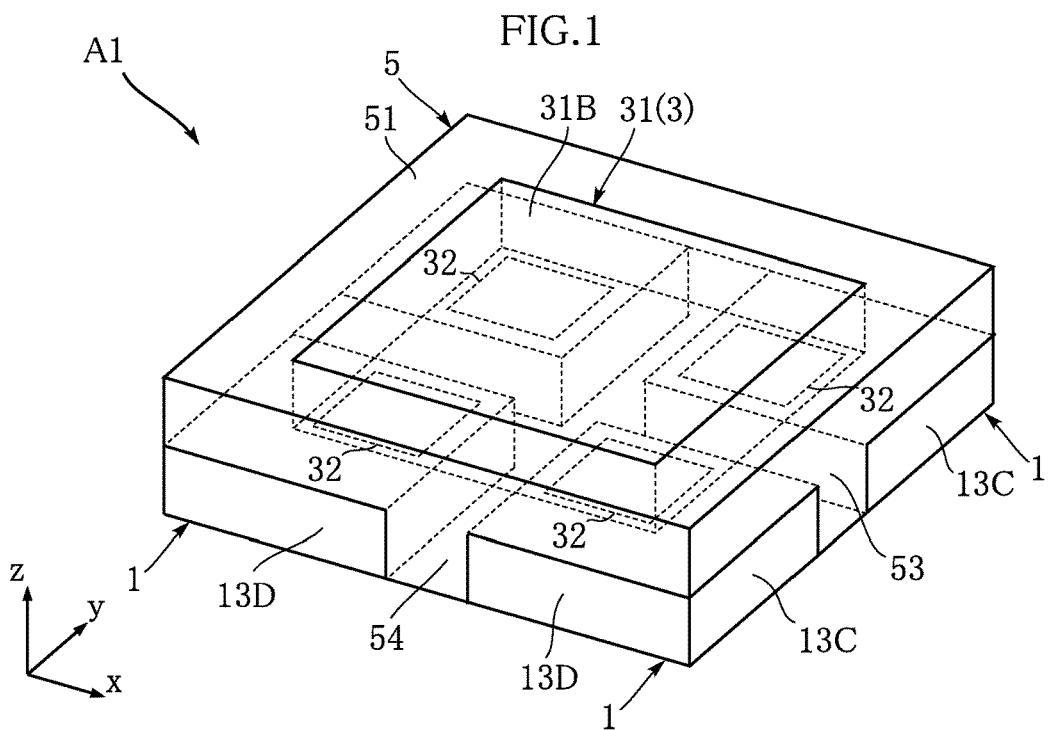
FIG. 1 is a perspective view of a semiconductor device according to a first embodiment.

Various embodiments of the present disclosure are described below with reference to the accompanying drawings.

Referring to FIGS. 1-5, a semiconductor device A1 according to a first embodiment is described. The semiconductor device A1 includes four terminals 1, a Hall element 3 and a sealing resin 5.

The semiconductor device A1 is rectangular as viewed in the z direction (as viewed in plan), having a pair of sides along the x direction and a pair of sides along the y direction. The semiconductor device A1 is 0.3 to 1.0 mm in dimension in the x direction, 0.3 to 1.0 mm in dimension in the y direction, and 0.1 to 0.3 mm in dimension in the z direction (thickness). However, the dimensions of the semiconductor device A1 are not limited to these.

The four terminals 1 may be formed by appropriately cutting a lead frame that has been made of a metal and subjected to etching for patterning. The materials for the terminals 1 are not limited and may be Cu or Cu alloy, for example. The thickness of the terminals 1 is 0.06 to 0.1 mm, for example. The terminals 1 may have surfaces partially provided with a plating layer. Examples of the material for the plating layer include Ni, Ag, Pd and Au. Instead of being made of a lead frame, the terminals 1 may be made by forming a metal layer on a predetermined support substrate through electroplating.

The four terminals 1 are spaced apart from each other. In the semiconductor device A1, the terminals 1 are rectangular as viewed in the z direction. Each terminal 1 includes an obverse surface 11, a mount surface 12, a first side surface 13A, a second side surface 13B, a third side surface 13C and a fourth side surface 13D.

Figure 5:
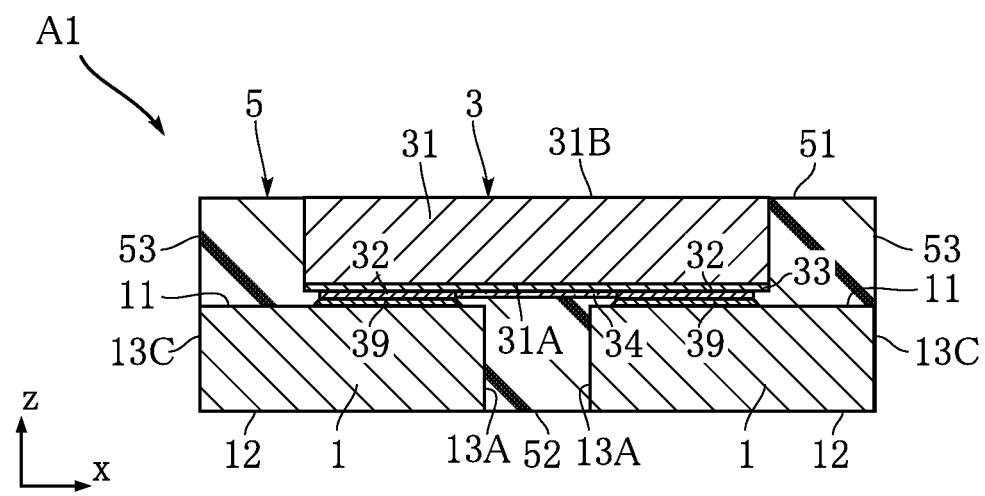
FIG. 5 is a sectional view taken along line V-V in FIG. 2A.

In FIG. 5, the obverse surfaces 11 face upward, and the mount surfaces 12 face downward. The mount surfaces 12 are exposed from the sealing resin 5 and used in mounting the semiconductor device A1 onto a wiring board. The obverse surfaces 11 and the mount surfaces 12 are perpendicular to the z direction.

All of the first side surface 13A, the second side surface 13B, the third side surface 13C and the fourth side surface 13D stand in the z direction and are connected to the obverse surface 11. In the semiconductor device A1, all of the first side surface 13A, the second side surface 13B, the third side surface 13C and the fourth side surface 13D are connected to the mount surface 12 as well.

The first side surface 13A and the third side surface 13C are spaced apart from each other and face away from each other in the x direction. The second side surface 13B and the fourth side surface 13D are spaced apart from each other and face away from each other in the y direction.

In the x direction, respective first side surfaces 13A of adjacent terminals 1 face each other. In the y direction, respective second side surfaces 13B of adjacent terminals 1 face each other. The first side surfaces 13A and the second side surfaces 13B are covered with the sealing resin 5.

In the semiconductor device A1, the third side surfaces 13C and the fourth side surfaces 13D are exposed from the sealing resin 5.

Figure 2A:
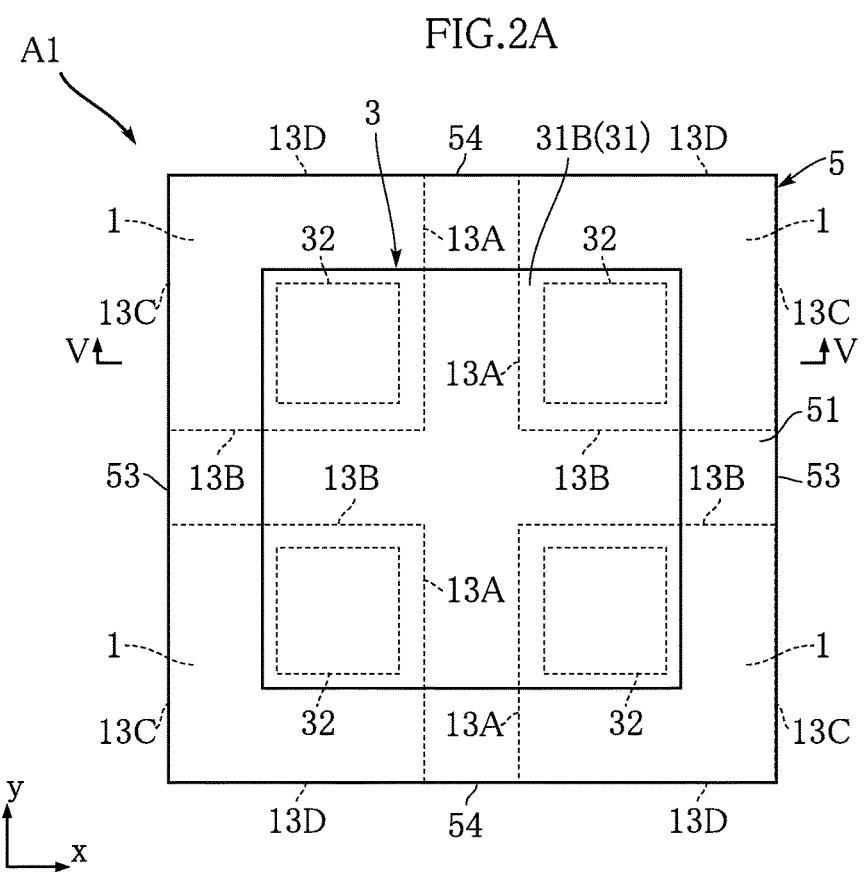
FIG. 2A is a plan view of the semiconductor device shown in FIG. 1.
Figure 2B:
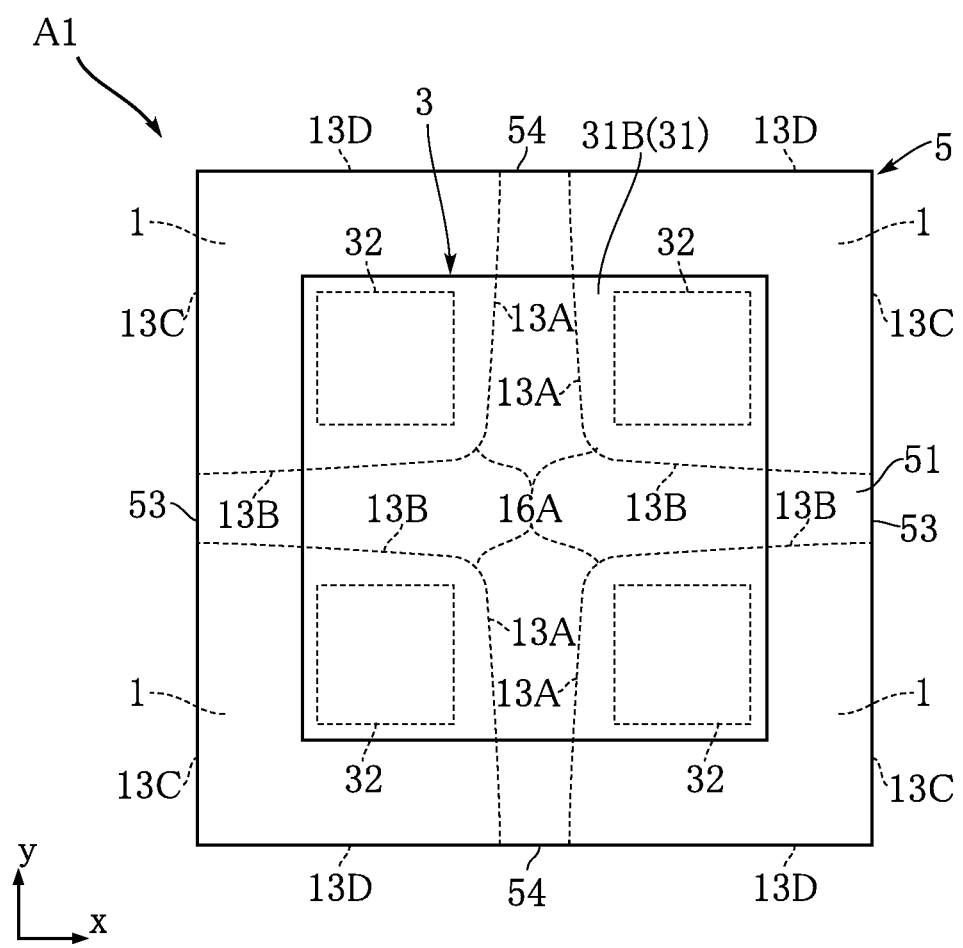
FIG. 2B is a plan view showing a variation of the structure shown in FIG. 2A.
Figure 4:
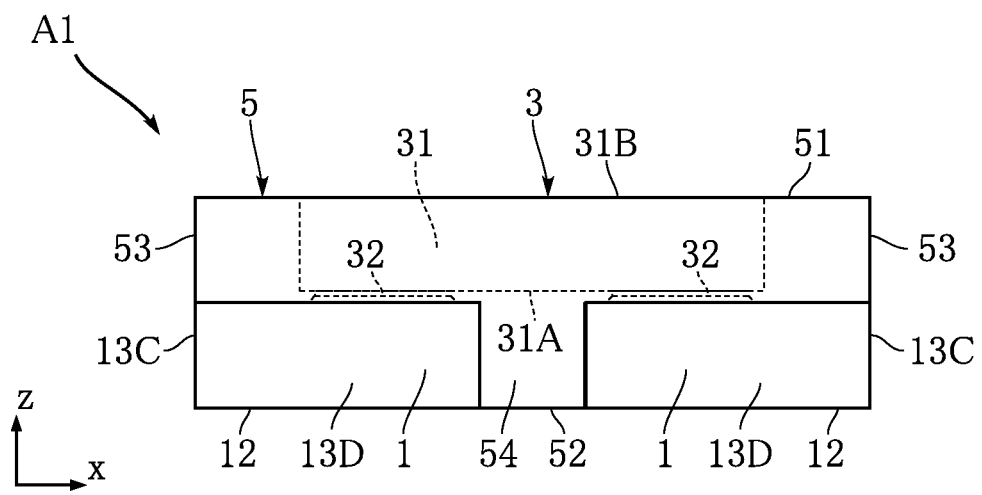
FIG. 4 is a front view of the semiconductor device shown in FIG. 1.

As shown in the variation of FIGS. 2B and 3B, in the semiconductor device A1, each terminal 1 may have a first curved portion 16A. The first curved portion 16A may be a chamfered portion of the terminal 1 and is positioned at the boundary between the first side surface 13A and the second side surface 13B.

The Hall element 3 includes an element body 31, four electrodes (electrode pads) 32, a magnetosensitive layer 33 and an insulating layer 34, and is rectangular as viewed in the z direction. In the semiconductor device A1, the Hall element 3 includes a pair of sides along the x direction and a pair of sides along the y direction. These sides of the Hall element 3 are all equal in length, which may be 0.19 mm, for example.

The element body 31 is made of a semiconductor material such as GaAs. The element body 31 has a functional surface 31A and an exposed surface 31B. The functional surface 31A and the exposed surface 31B face away from each other in the z direction. The functional surface 31A and the exposed surface 31B are perpendicular to the z direction. The functional surface 31A is formed with the magnetosensitive layer 33. The magnetosensitive layer 33 is made of a semiconductor material such as GaAs and exhibits Hall effect. The four electrodes 32 are electrically connected to the magnetosensitive layer 33 and made up of two electrodes 32 for inputting a driving current to the magnetosensitive layer 33 and two electrodes 32 for outputting a Hall voltage. The insulating layer 34 protects the magnetosensitive layer 33 and is made of an electrically insulating material.

In the semiconductor device A1, the four electrodes 32 and (the obverse surfaces 11 of) the four terminals 1 overlap with each other as viewed in the z direction and bonded to each other with a conductive bonding material 39. This type of bonding that does not use a wire is called flip chip bonding. The conductive bonding material 39 is an electrically conductive bonding material and may be solder or Ag paste, for example.

The sealing resin 5 covers at least a portion of each of the four terminals 1 and a portion of the Hall element 3. The sealing resin 5 is made of an electrically insulating synthetic resin (e.g. an epoxy resin mixed with a filler). The sealing resin 5 includes an obverse surface 51, a reverse surface 52, a pair of first side surfaces 53 and a pair of second side surfaces 54. The sealing resin 5 is rectangular as viewed in the z direction, having a pair of sides along the x direction and a pair of sides along the y direction.

The obverse surface 51 and the reverse surface 52 of the sealing resin 5 are spaced apart from each other in the z direction. Specifically, in the z direction, the obverse surface 51 faces the same direction as the obverse surfaces 11 of the terminals 1 and the exposed surface 31B of the element body 31. The reverse surface 52 of the sealing resin 5 faces away from the obverse surface 51 in the z direction. The paired first side surfaces 53 stand in the z direction and are spaced apart from each other and face away from each other in the x direction. The paired second side surfaces 54 stand in the z direction and are spaced apart from each other and face away from each other in the y direction.

In the semiconductor device A1, the exposed surface 31B of the element body 31 is exposed from the obverse surface 51 of the sealing resin 5. The exposed surface 31B and the obverse surface 51 are flush with each other.

In the semiconductor device A1, the mount surfaces 12 of the four terminals 1 are exposed from the reverse surface 52 of the sealing resin 5. The mount surfaces 12 and the reverse surface 52 are flush with each other.

In the semiconductor device A1, the third side surfaces 13C of the terminals 1 are exposed from the first side surfaces 53 of the sealing resin 5. The third side surfaces 13C are flush with the first side surfaces 53.

In the semiconductor device A1, the fourth side surfaces 13D of the terminals 1 are exposed from the second side surfaces 54 of the sealing resin 5. The fourth side surfaces 13D are flush with the second side surfaces 54.

In the semiconductor device A1, the Hall element 3 is similar in shape to the sealing resin 5 as viewed in the z direction. In the semiconductor device A1, each of the Hall element 3 and the sealing resin 5 is square as viewed in the z direction.

Referring next to FIG. 6, an example of a circuit using the semiconductor device A1 is described.

As shown in FIG. 6, the circuit is made up of a semiconductor device A1, an integrated circuit 61 and a control target 62. For example, the control target 62 may be a light source of a display of a cellular phone or a DC motor. The integrated circuit 61 includes a device driving circuitry 611, a voltage detecting circuitry 612 and a controlling circuitry 613. The device driving circuitry 611 is configured to apply a current (Hall current) to the magnetosensitive layer 33 of the Hall element 3. The voltage detecting circuitry 612 is configured to detect the electromotive force (Hall voltage) generated at the magnetosensitive layer 33 due to Hall effect. The controlling circuitry 613 is configured to control the operation of the control target 62. When a magnet is brought closer to the semiconductor device A1, the magnetic flux density changes, so that an electromotive force occurs at the Hall element 3 due to Hall effect. The electromotive force is detected by the voltage detecting circuitry 612. The voltage detecting circuitry 612 transmits the detection results to the controlling circuitry 613. The controlling circuitry 613 controls the operation of the control target 62 (e.g. activates or stops the control target) based on the transmitted detection results.

Referring next to FIGS. 7A-11, an example of a method for manufacturing the semiconductor device A1 is described.

Figure 7A:
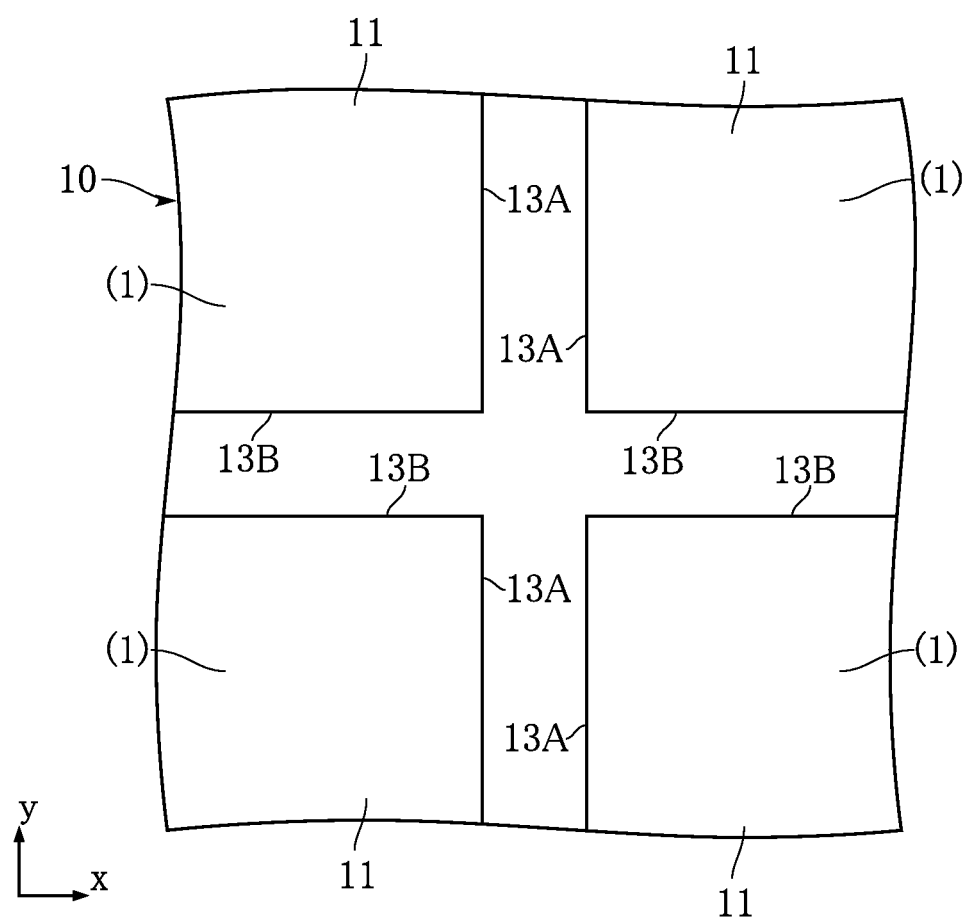
FIG. 7A is a plan view for describing an example of a manufacturing method of the semiconductor device shown in FIG. 1.
Figure 7B:
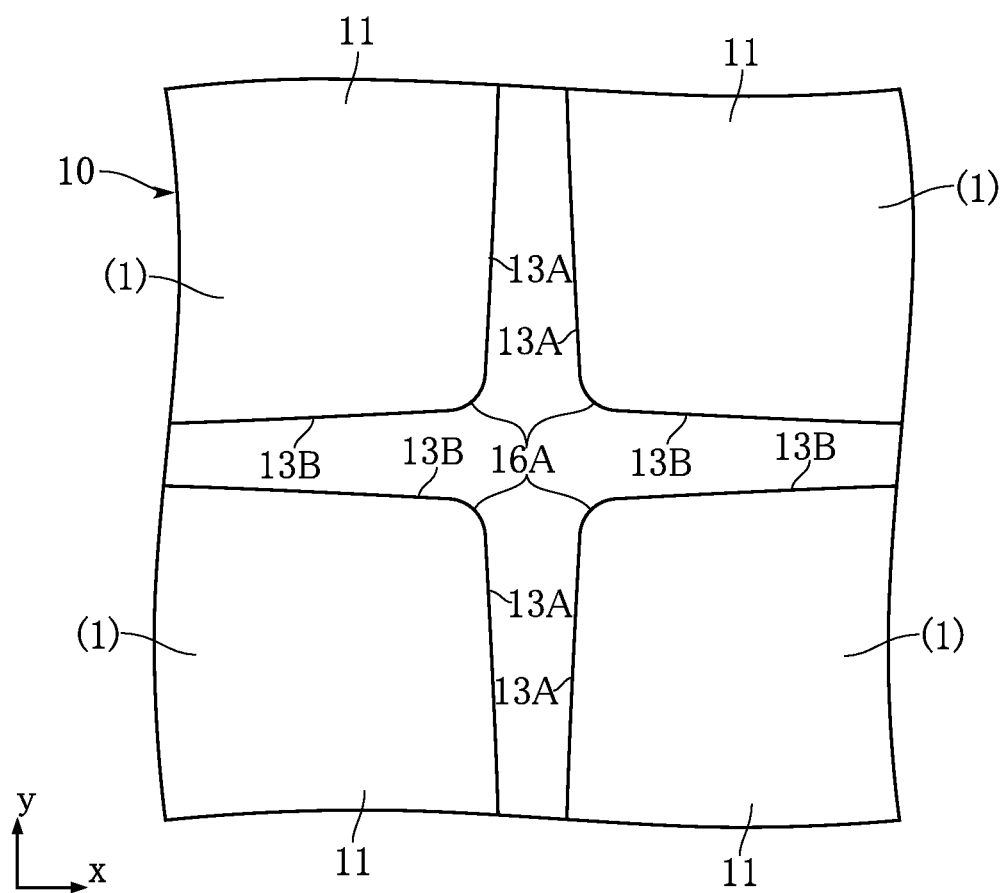
FIG. 7B is a plan view showing a variation of the structure shown in FIG. 7A.

As shown in FIG. 7A, a lead frame 10 is prepared. The lead frame 10 may be made of Cu or Cu alloy, for example. The lead frame 10 has portions to become the four terminals 1, and has an obverse surface 11, amount surface 12, first side surfaces 13A and second side surfaces 13B. The lead frame 10 may have first curved portions 16A, as shown in FIG. 7B (and FIG. 8B).

Figure 8A:
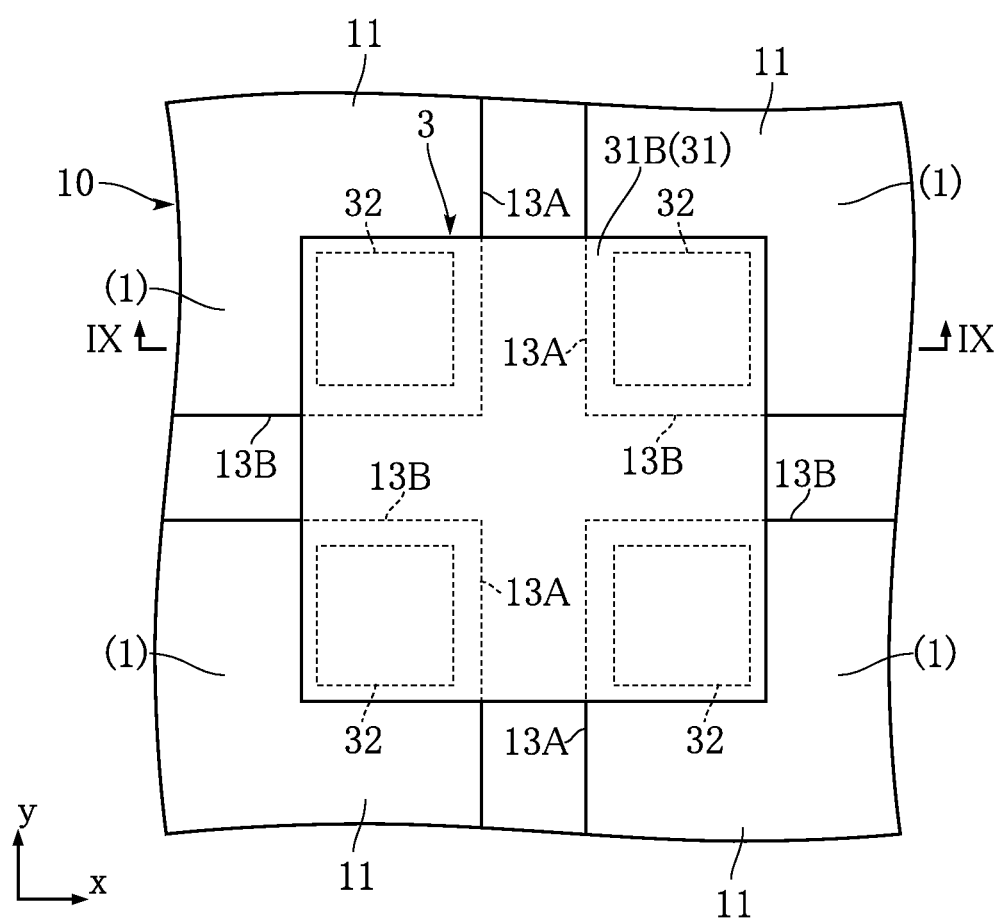
FIG. 8A is a plan view for describing the example of the manufacturing method of the semiconductor device shown in FIG. 1.
Figure 8B:
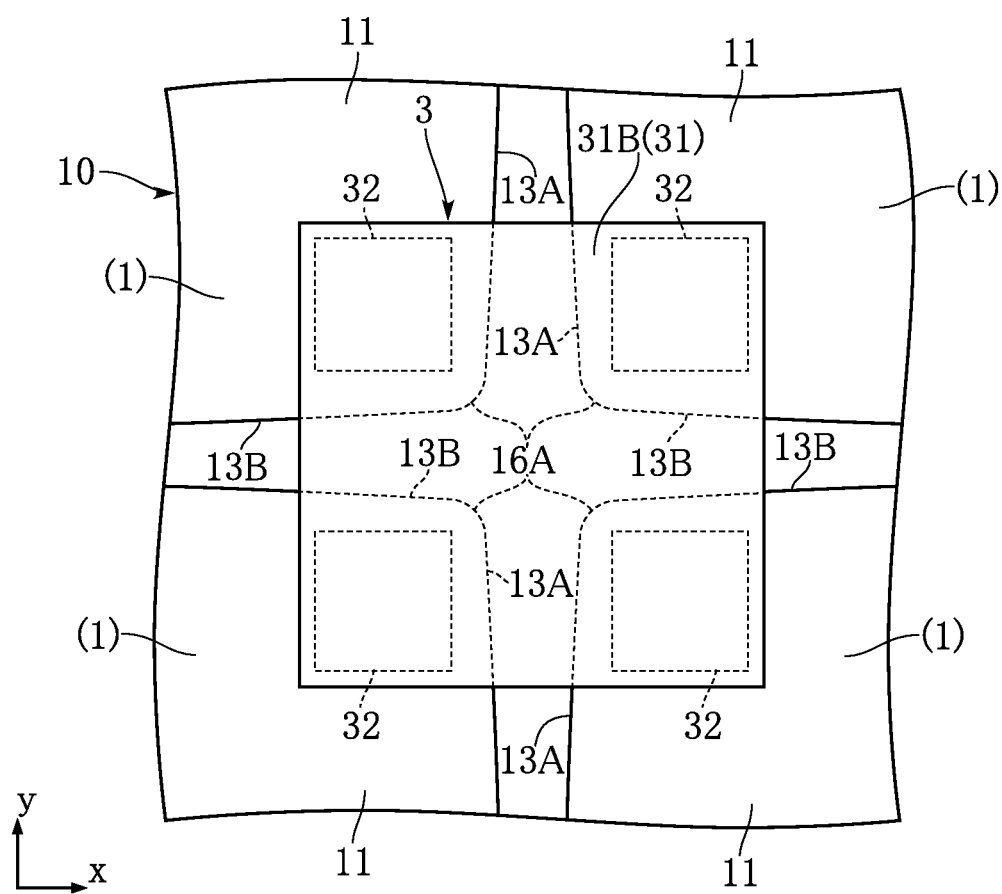
FIG. 8B is a plan view showing a variation of the structure shown in FIG. 8A.
Figure 9:
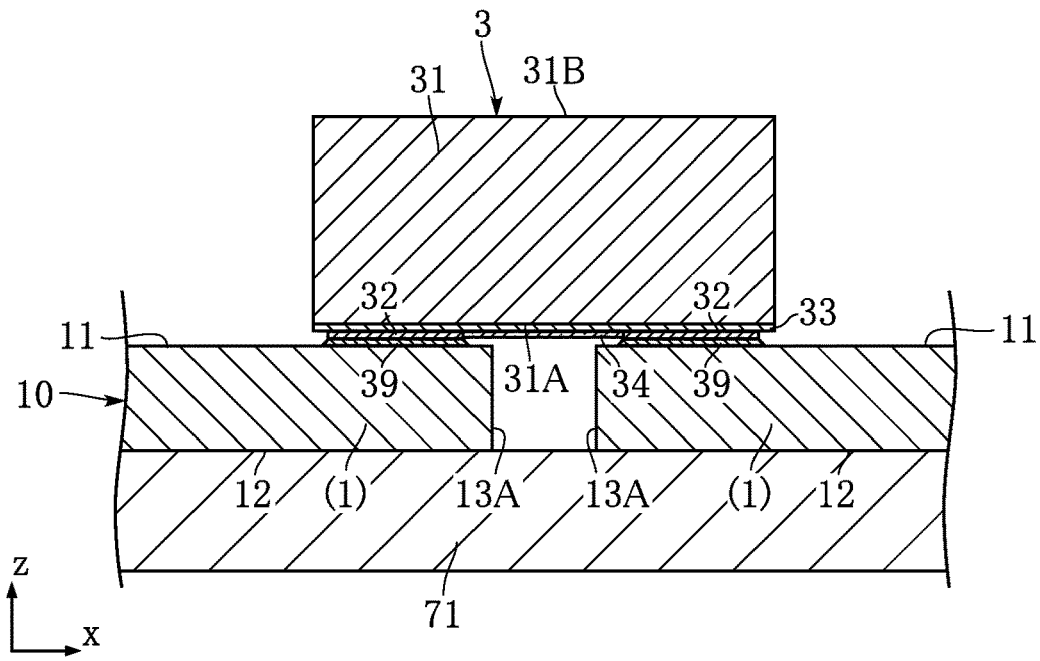
FIG. 9 is a sectional view taken along line IX-IX in FIG. 8A.

Then, as shown in FIGS. 8A and 9, a Hall element 3 is mounted on the lead frame 10. At this stage, the element body 31 of the Hall element 3 has a thickness larger than that of the element body 31 shown in FIGS. 1-5. Specifically, the Hall element 3 is mounted by bonding the four electrodes 32 of the Hall element 3 to the obverse surfaces 11 of the portions to become the four terminals 1, respectively, with the conductive bonding material 39. In the method for manufacturing the semiconductor device A1, a support member 71 may be used. The support member 71 is bonded to the mount surface 12 of the lead frame 10 with a bonding material such as a tape.

Figure 10:
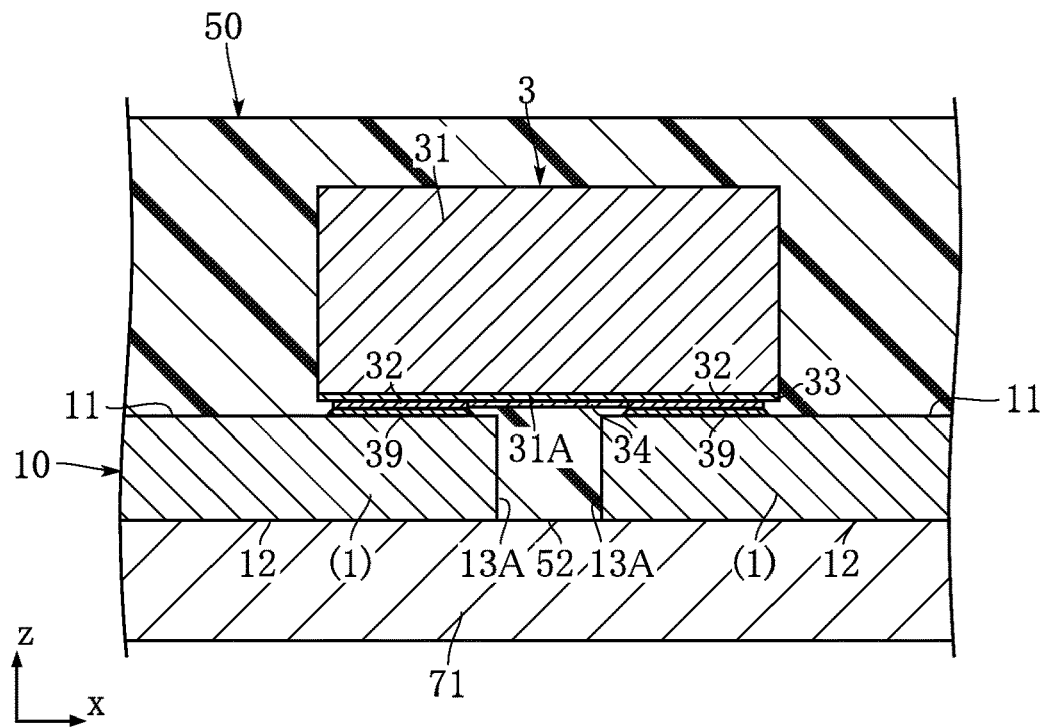
FIG. 10 is a sectional view for describing the example of the manufacturing method of the semiconductor device shown in FIG. 1.

Then, a resin layer 50 is formed, as shown in FIG. 10. Specifically, the resin layer 50 may be formed by hardening a liquid resin material, for example. The resin layer 50 covers the entirety of the Hall element 3. In particular, the resin layer 50 covers the upper surface of the Hall element 3.

Figure 11:
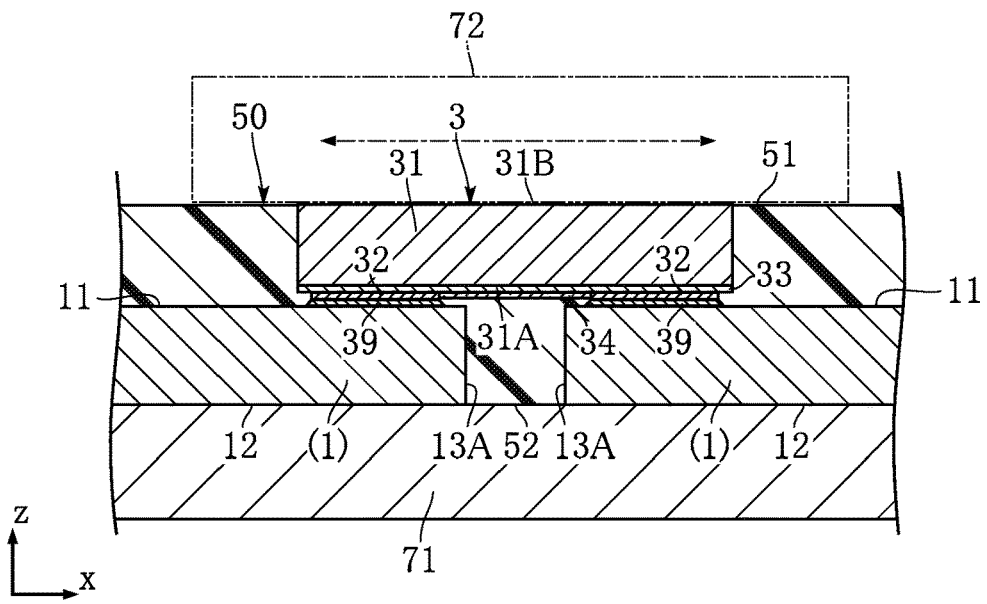
FIG. 11 is a sectional view for describing the example of the manufacturing method of the semiconductor device shown in FIG. 1.

Then, the resin layer 50 and the Hall element 3 are ground as shown in FIG. 11. Specifically, the resin layer 50 and the Hall element 3 are collectively ground in the z direction from the side opposite the functional surface 31A by using a grinding means 72 (including e.g. a grinding pad or a grinding tool). By this process, the dimensions of the resin layer 50 and the element body 31 of the Hall element 3 in the z direction are reduced, and the obverse surface 51 is formed at the resin layer 50, while the exposed surface 31B is formed at the element body 31. The exposed surface 31B is exposed from the obverse surface 51 and flush with the obverse surface 51. The thickness of the element body 31 after the grinding is about 65 to 120 μm, for example.

Thereafter, cutting of the lead frame 10 and resin layer 50 and removal of the support member 71 are performed to provide the semiconductor device A1.

The advantages of the method for manufacturing the semiconductor device A1 are described below.

In the semiconductor device A1, the upper surface (exposed surface 31B) of the Hall element 3 is exposed from the sealing resin 5 and flush with the upper surface of the sealing resin 5. That is, the sealing resin 5 does not include a portion positioned above the exposed surface 31B. This contributes to the thickness reduction of the semiconductor device A1.

According to the method for manufacturing the semiconductor device A1, the thickness of the Hall element 3 remains larger than the final thickness until the step shown in FIG. 10. Thus, the process from the step of manufacturing the Hall element 3 till the step of mounting the Hall element 3 onto the lead frame 10 is reliably performed. Since a portion of the element body 31 is removed in the grinding step shown in FIG. 11, the thickness of the semiconductor device A1 is reduced.

The four terminals 1 overlap with the Hall element 3 as viewed in the z direction. This allows the dimension of the semiconductor device A1 (the dimensions in the x direction and the y direction) to be reduced.

Figure 12:
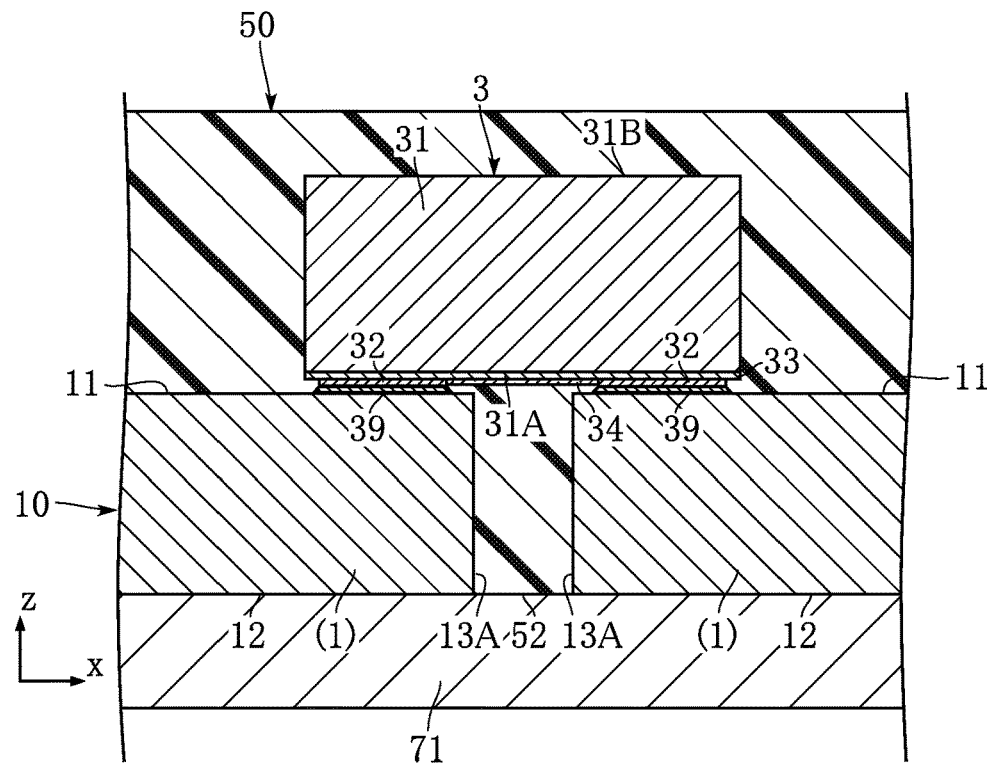
FIG. 12 is a sectional view for describing another example of a manufacturing method of the semiconductor device shown in FIG. 1.
Figure 13:
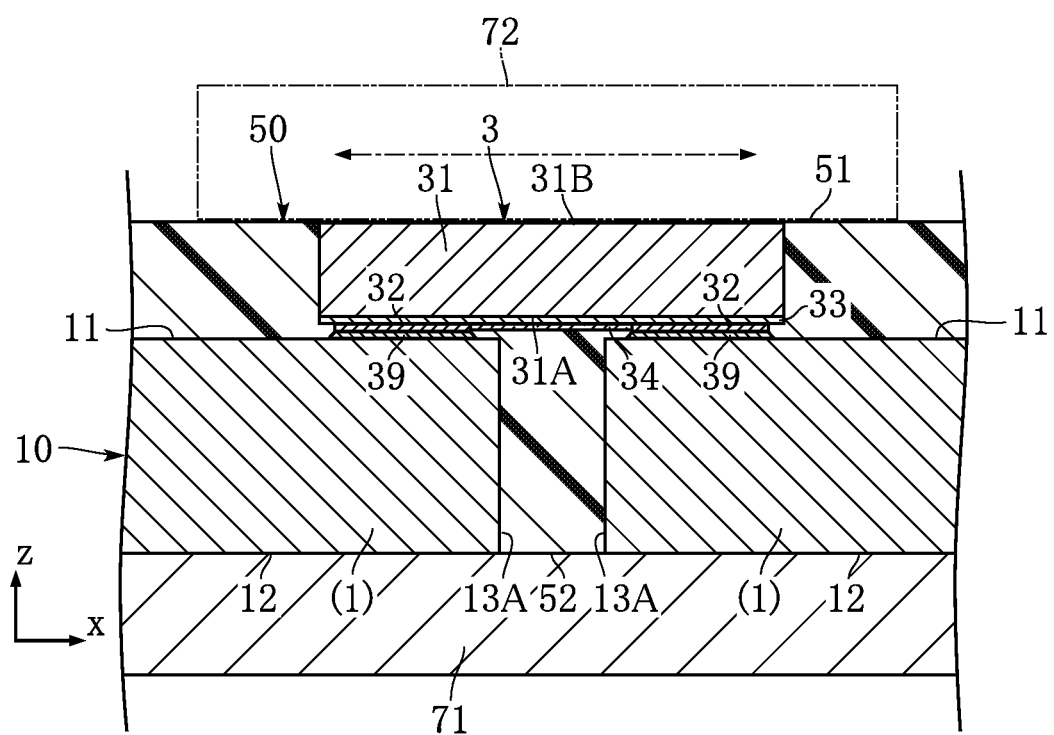
FIG. 13 is a sectional view for describing said another example of the manufacturing method of the semiconductor device shown in FIG. 1.
Figure 14:
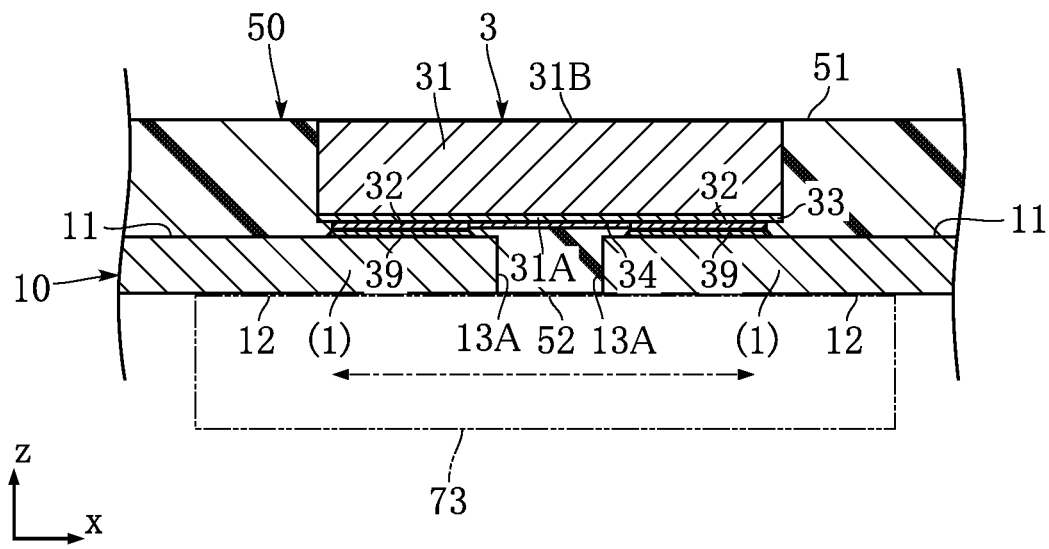
FIG. 14 is a sectional view for describing said another example of the manufacturing method of the semiconductor device shown in FIG. 1.

Referring next to FIGS. 12-14, another example of a method for manufacturing the semiconductor device A1 is described.

As shown in FIG. 12, a Hall element 3 is mounted on a lead frame 10, and a resin layer 50 is formed. At this stage, the thicknesses of the Hall element 3, resin layer 50 and lead frame 10 are larger than the thicknesses of the Hall element 3, sealing resin 5 and terminals 1 of the completed semiconductor device A1.

Then, the resin layer 50 and the Hall element 3 are ground as shown in FIG. 13 by using a grinding means 72. By this process, the obverse surface 51 is formed at the resin layer 50, and the exposed surface 31B is formed at the element body 31 of the Hall element 3. In this example again, the obverse surface 51 and the exposed surface 31B are flush with each other.

Subsequently, the resin layer 50 and the lead frame 10 are ground as shown in FIG. 14 by using a grinding means 73 (which may be similar to the grinding means 72). This step may be performed, with a support member similar to the support member 71 bonded to the obverse surface 51 and the exposed surface 31B. By this grinding step, the mount surface 12 and the reverse surface 52 that are flush with each other are formed.

The semiconductor device A1 manufactured by this method also has a reduced thickness. In particular, according to the manufacturing method of this example, the terminals 1 are formed by grinding the lead frame 10. This allows further reduction of the thickness of the terminals 1, which contributes to the thickness reduction of the semiconductor device A1.

Figure 15:
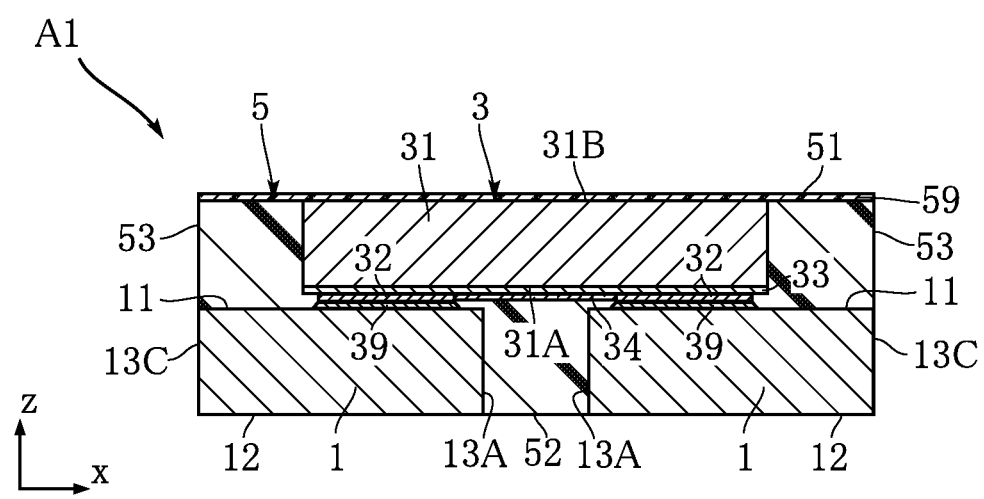
FIG. 15 is a sectional view according to a variation of the semiconductor device shown in FIG. 1.

Referring next to FIG. 15, a variation of the semiconductor device A1 is described.

The semiconductor device A1 of this variation includes a protective layer 59. The protective layer 59 covers the obverse surface 51 of the sealing resin 5 and the exposed surface 31B of the element body 31 of the Hall element 3. The material for the protective layer 59 is not particularly limited and may be ultraviolet-curable silicone resin or polyimide, for example.

According to this variation again, the thickness of the semiconductor device A1 can be reduced. As will be understood from this variation, the exposed surface 31B of the element body 31 may not be exposed to the outside in the final state.

Figure 16A:
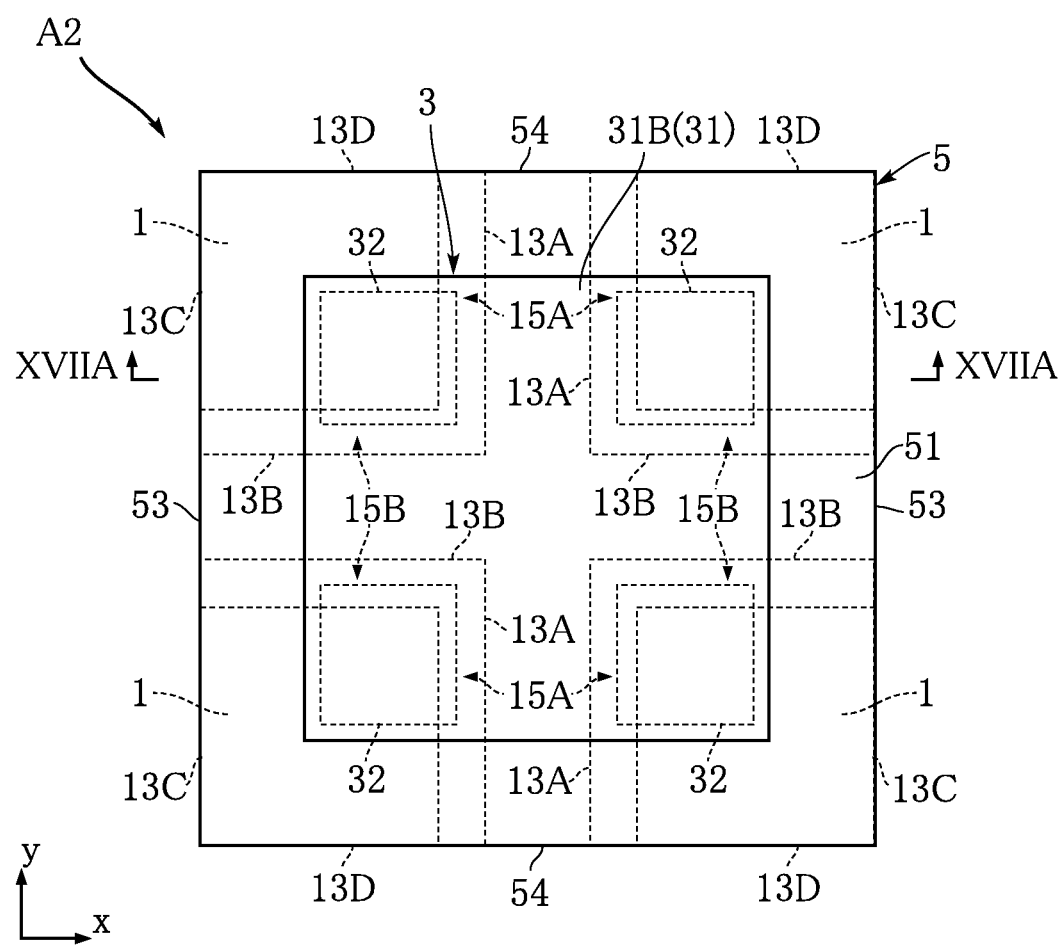
FIG. 16A is a plan view of a semiconductor device according to a second embodiment.
Figure 17A:
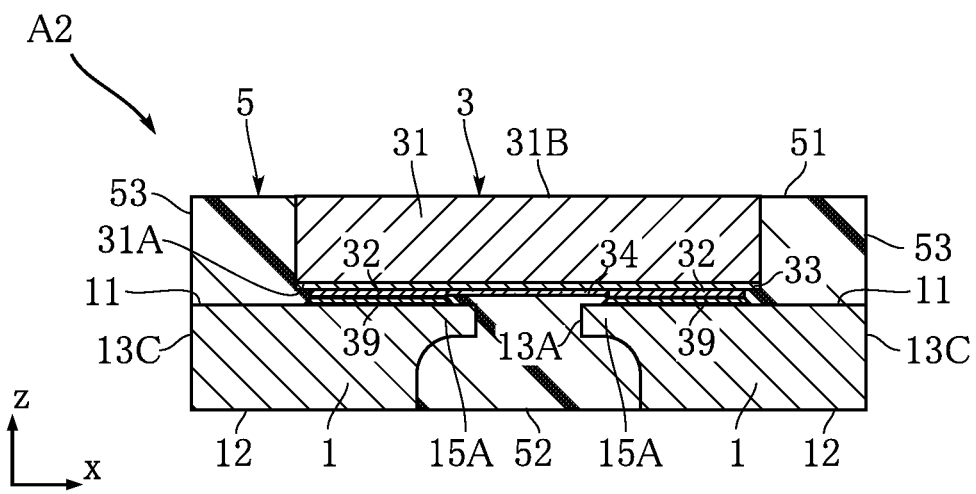
FIG. 17A is a sectional view taken along line XVIIA-XVIIA in FIG. 16A.
Figure 17B:
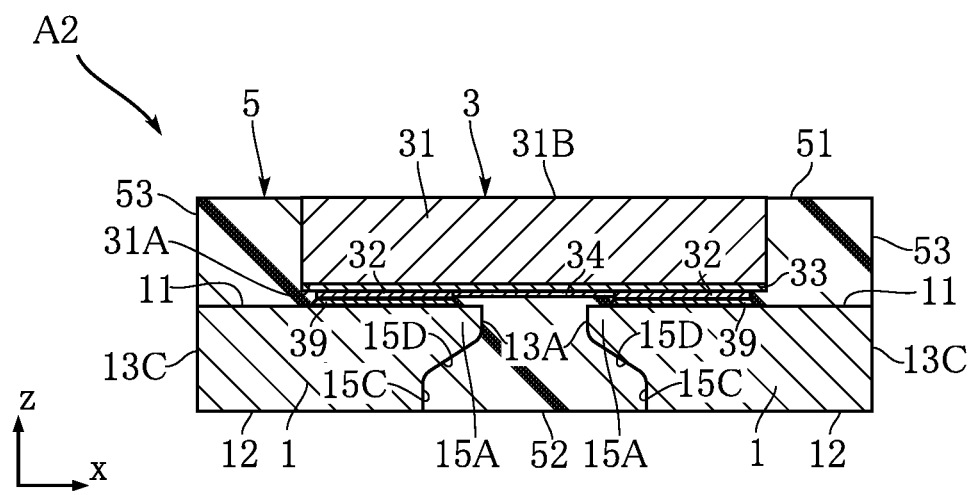
FIG. 17B is a sectional view taken along line XVIIB-XVIIB in FIG. 16B.

Referring to FIGS. 16A and 17B, a semiconductor device A2 according to a second embodiment is described. In these figures, the elements that are identical or similar to those of the foregoing semiconductor device A1 are denoted by the same reference signs, and the overlapping description is omitted.

In the semiconductor device A2, each of the terminals 1 has a first thin portion 15A (see FIG. 17A) and a second thin portion 15B. The first thin portion 15A is formed along the first side surface 13A. The thickness of the first thin portion 15A is smaller than the distance between the functional surface 31A and the exposed surface 31B. The first thin portion 15A is covered with the sealing resin 5.

The second thin portion 15B is formed along the second side surface 13B. The thickness of the second thin portion 15B is smaller than the distance between the functional surface 31A and the exposed surface 31B. Similarly to the first thin portion 15A, the second thin portion 15B is covered with the sealing resin 5.

In the semiconductor device A2, as viewed in the z direction, each electrode 32 partially overlaps with the corresponding first thin portion 15A and the corresponding second thin portion 15B. As viewed in the z direction, portions of each electrode 32 that do not overlap with the first thin portion 15A or the second thin portion 15B overlap with the mount surface 12.

Figure 16B:
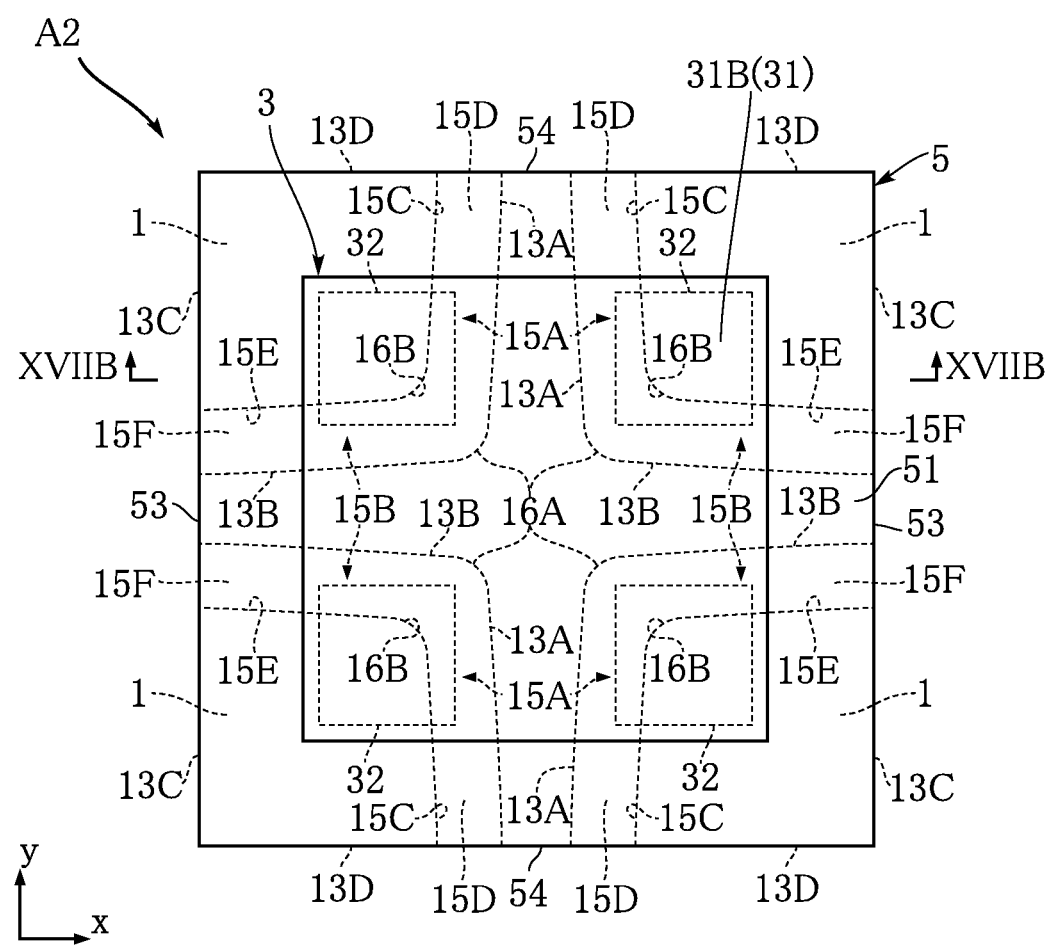
FIG. 16B is a plan view showing a variation of the structure shown in FIG. 16A.

As shown in FIG. 16B, in the semiconductor device A2, each terminal 1 may have a second curved portion 16B. The second curved portion 16B may be a chamfered portion of the terminal 1 and is positioned at the boundary between a first inner side surface 15C and a second inner side surface 15E. Further, as shown in FIGS. 16B and 17B, each terminal 1 of the semiconductor device A2 may have a first inner side surface 15C, a first intermediate surface 15D, a second inner side surface 15E and a second intermediate surface 15F. For example, the first inner side surface 15C stands from a side (inner side) along the y direction of the mount surface 12. The first intermediate surface 15D is connected to both of the first inner side surface 15C and the first side surface 13A. The boundary between the first inner side surface 15C and the first intermediate surface 15D corresponds to the base portion of the first thin portion 15A. The first intermediate surface 15D corresponds to the lower surface of the first thin portion 15A.

The second inner side surface 15E stands from a side (inner side) along the x direction of the mount surface 12. The second intermediate surface 15F is connected to both of the second inner side surface 15E and the second side surface 13B. The boundary between the second inner side surface 15E and the second intermediate surface 15F corresponds to the base portion of the second thin portion 15B. The second intermediate surface 15F corresponds to the lower surface of the second thin portion 15B.

The advantages of the semiconductor device A2 are described below.

The semiconductor device A2 also achieves thickness reduction of the device. Moreover, since the terminal 1 is formed with the first thin portion 15A and the second thin portion 15B, the terminal 1 is prevented from becoming detached through the reverse surface 52 of the sealing resin 5. Unlike the above, the structure including either one of the first thin portion 15A and the second thin portion 15B may be employed. At least one of the first thin portion 15A and the second thin portion 15B may be employed as appropriate in the semiconductor devices A3-A6 described below. In the semiconductor devices A3-A6, when the third side surface 13C is covered with the sealing resin 5, a portion similar to the first thin portion 15A may be formed along the third side surface 13C. Similarly, in the semiconductor devices A3-A6, when the fourth side surface 13D is covered with the sealing resin 5, a portion similar to the second thin portion 15B may be formed along the fourth side surface 13D.

In addition to achieving reduction in thickness and size of the device, the semiconductor device A2 achieves proper formation of the sealing resin 5 (e.g. so as not to include a defect such as a void). Specifically, in the semiconductor device A2, each electrode 32 partially overlaps with the corresponding first thin portion 15A, as viewed in the z direction. Thus, in the x direction, the distance between the respective mount surfaces 12 of adjacent terminals 1 is longer than the distance between adjacent electrodes 32. Similarly, each electrode 32 partially overlaps with the corresponding second thin portion 15B as viewed in the z direction, so that, in the y direction, the distance between the respective mount surfaces 12 of adjacent terminals 1 is longer than the distance between adjacent electrodes 32. This arrangement is suitable for properly injecting liquid sealing resin between adjacent terminals 12, and inclusion of a defect such as a void in the formed sealing resin 5 is avoided. The electrodes 32 can be formed precisely by thin film forming, for example. Thus, the distance between adjacent electrodes can be made short.

Figure 18A:
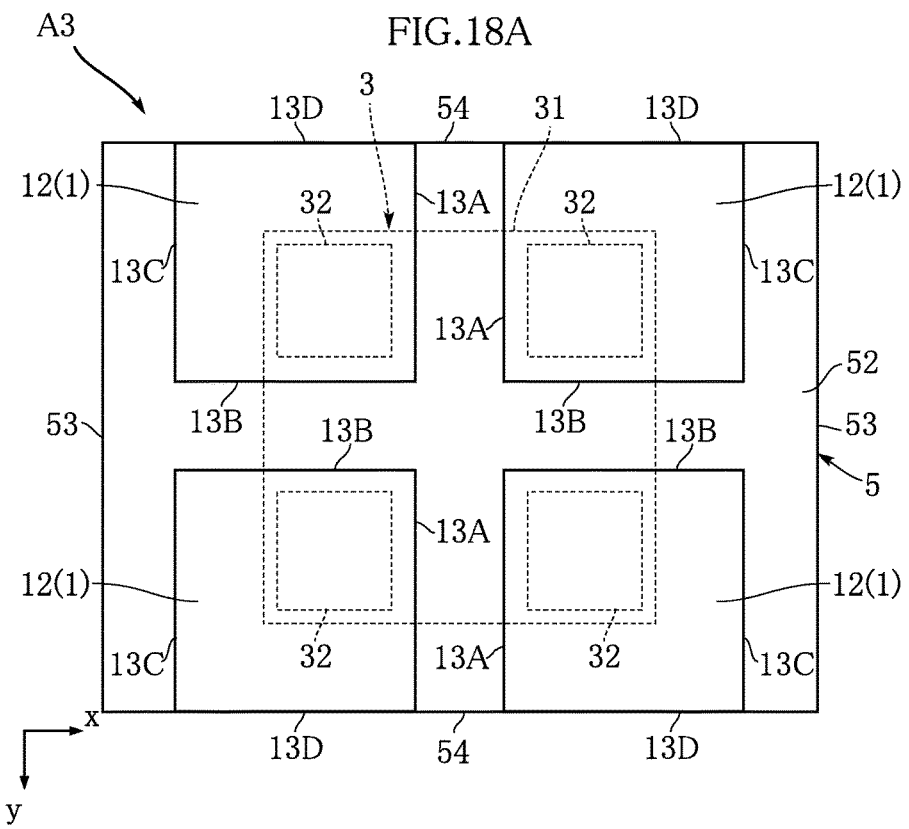
FIG. 18A is a bottom view of a semiconductor device according to a third embodiment.

Referring to FIG. 18A (and FIG. 18B), a semiconductor device A3 according to a third embodiment is described. In these figures, the elements that are identical or similar to those of the foregoing semiconductor device A1 are denoted by the same reference signs, and the overlapping description is omitted.

Figure 18B:
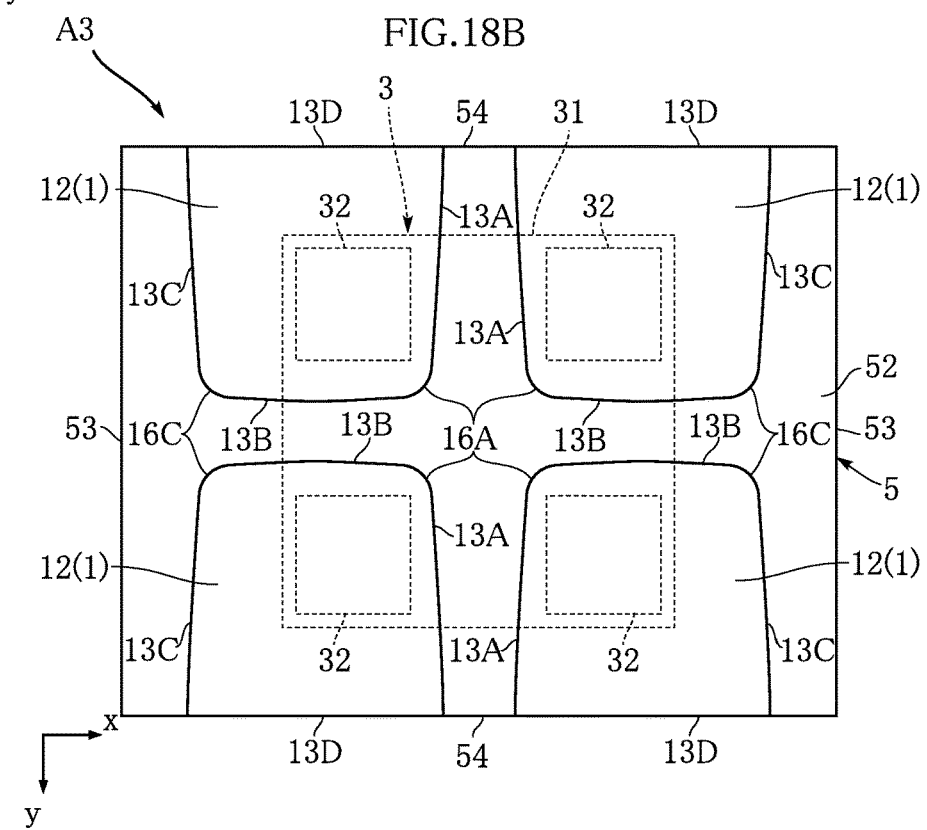
FIG. 18B is a bottom view showing a variation of the structure shown in FIG. 18A.

In the semiconductor device A3, the first side surface 13A, the second side surface 13B and the third side surface 13C of each terminal 1 are covered with the sealing resin 5. The fourth side surface 13D of each terminal 1 is exposed from the sealing resin 5 and flush with the second side surface 54. As shown in FIG. 18B, in the semiconductor device A3, each terminal 1 may have a third curved portion 16C. The third curved portion 16C may be a chamfered portion of the terminal 1 and is positioned at the boundary between the second side surface 13B and the third side surface 13C.

The advantages of the semiconductor device A3 are described below.

The semiconductor device A3 also achieves thickness reduction of the device. Moreover, since the third side surface 13C of each terminal 1 is covered with the sealing resin 5, the terminal 1 is prevented from becoming detached from the sealing resin 5 in the x direction.

Figure 19A:
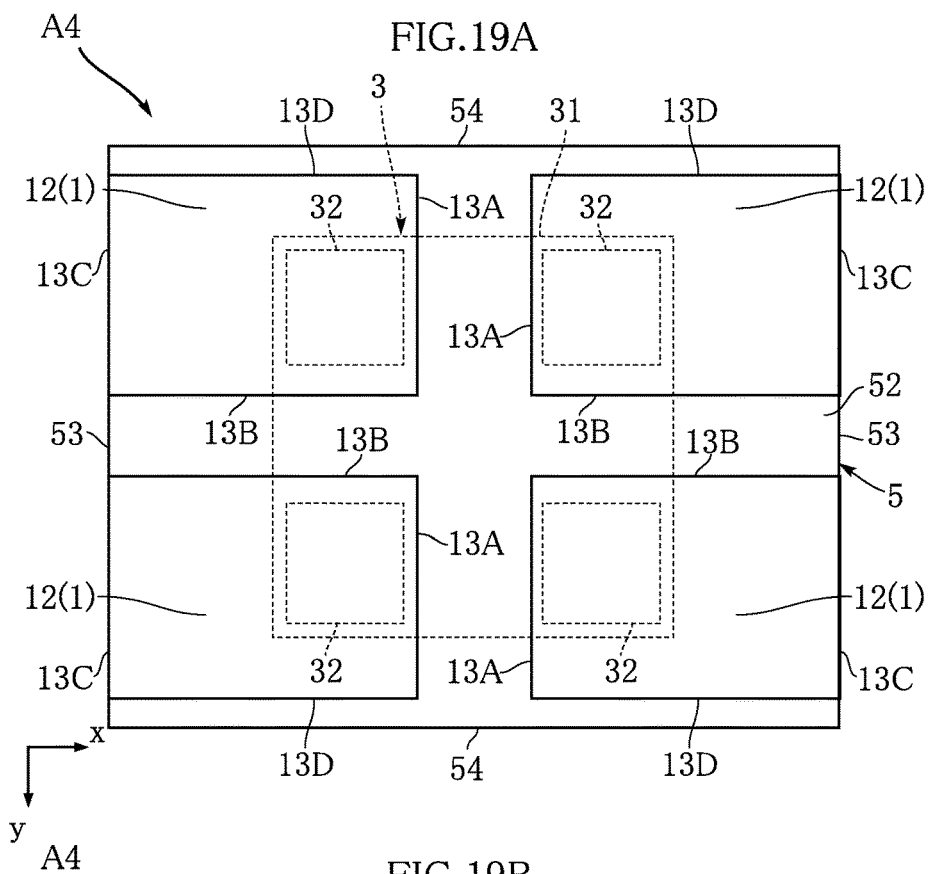
FIG. 19A is a bottom view of a semiconductor device according to a fourth embodiment.

Referring to FIG. 19A (and FIG. 19B), a semiconductor device A4 according to a fourth embodiment is described. In these figures, the elements that are identical or similar to those of the foregoing semiconductor device A1 are denoted by the same reference signs, and the overlapping description is omitted.

Figure 19B:
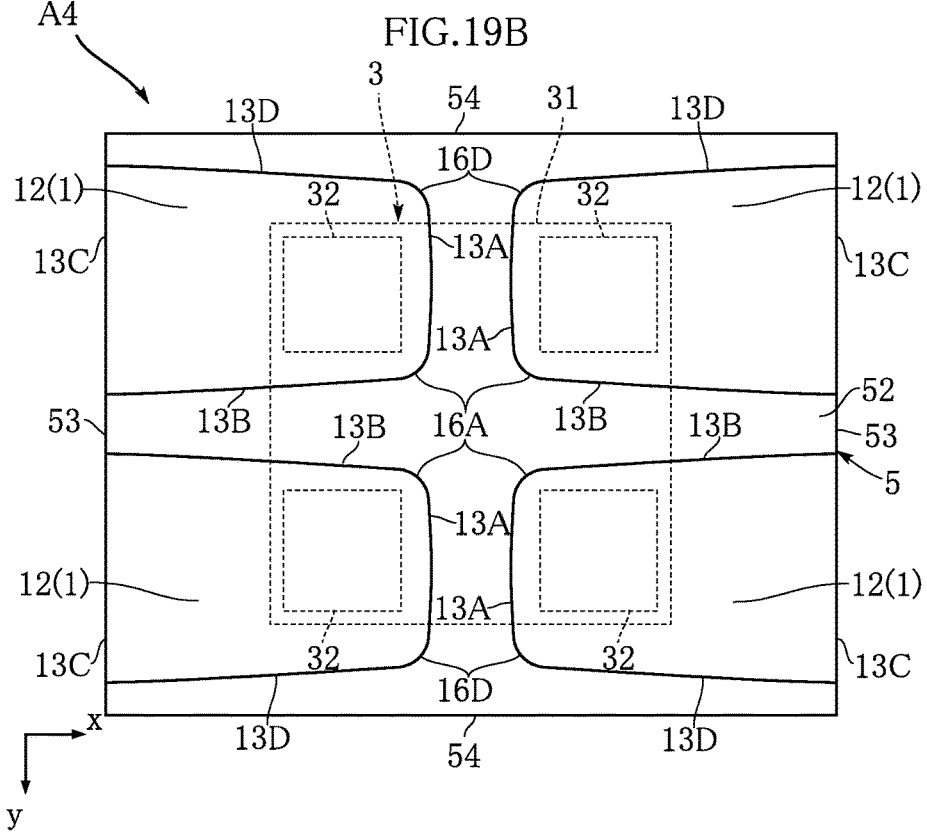
FIG. 19B is a bottom view showing a variation of the structure shown in FIG. 19A.

In the semiconductor device A4, the first side surface 13A, the second side surface 13B and the fourth side surface 13D of each terminal 1 are covered with the sealing resin 5. The third side surface 13C of each terminal 1 is exposed from the sealing resin 5 and flush with the first side surface 53. As shown in FIG. 19B, in the semiconductor device A4, each terminal 1 may have a fourth curved portion 16D. The fourth curved portion 16D may be a chamfered portion of the terminal 1 and is positioned at the boundary between the first side surface 13A and the fourth side surface 13D.

The advantages of the semiconductor device A4 are described below.

The semiconductor device A4 also achieves thickness reduction of the device. Moreover, since the fourth side surface 13D of each terminal 1 is covered with the sealing resin 5, the terminal 1 is prevented from becoming detached from the sealing resin 5 in the y direction.

Figure 20A:
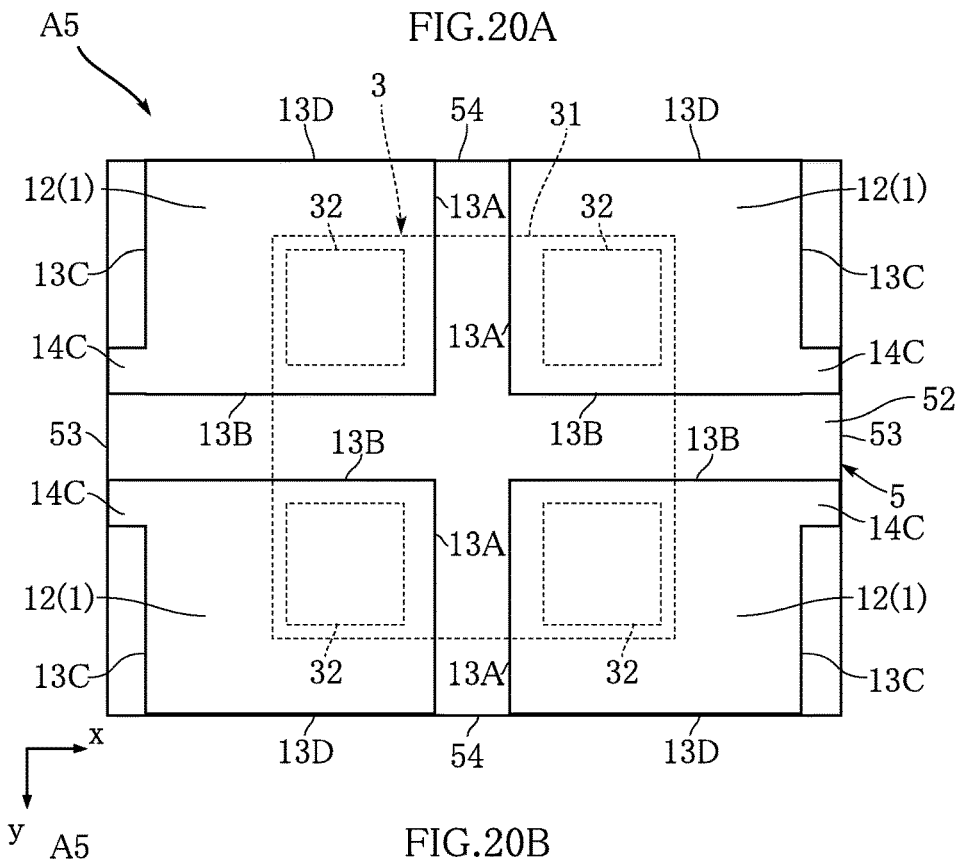
FIG. 20A is a bottom view of a semiconductor device according to a fifth embodiment.

Referring to FIG. 20A (and FIG. 20B), a semiconductor device A5 according to a fifth embodiment is described. In these figures, the elements that are identical or similar to those of the foregoing semiconductor device A1 are denoted by the same reference signs, and the overlapping description is omitted.

Figure 20B:
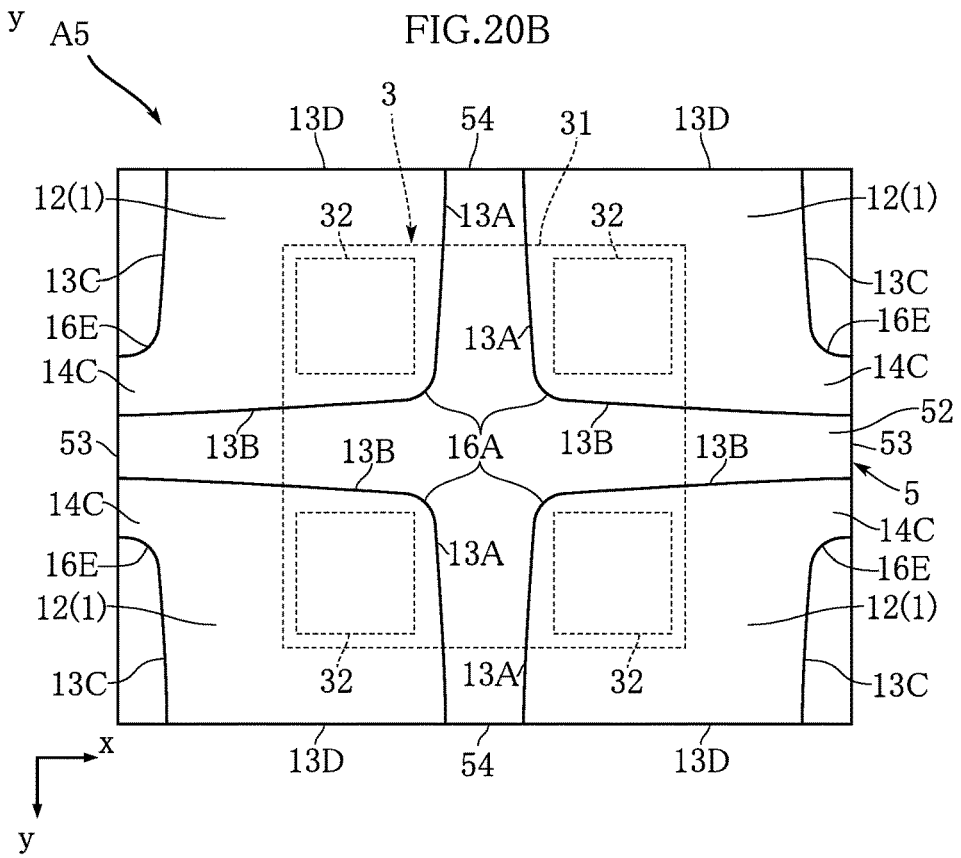
FIG. 20B is a bottom view showing a variation of the structure shown in FIG. 20A.

The semiconductor device A5 differs from the foregoing semiconductor device A1 in structure of the terminals 1. In the semiconductor device A5, each terminal 1 has an extension 14C. The extension 14C extends from the third side surface 13C. The third side surface 13C is covered with the sealing resin 5. The (end surface of the) extension 14C is exposed from the first side surface 53 of the sealing resin 5. The end surface of the extension 14C is flush with the first side surface 53 of the sealing resin 5. As shown in FIG. 20B, in the semiconductor device A5, each terminal 1 may have a fifth curved portion 16E. The fifth curved portion 16E may be a chamfered portion of the terminal 1 and is positioned at the boundary between the third side surface 13C and the extension 14C.

The advantages of the semiconductor device A5 are described below.

The semiconductor device A5 also achieves thickness reduction of the device. In manufacturing the semiconductor device A5, the extension 14C can be used for connecting the portion to become the terminal 1 to the nearby frame portion.

Figure 21A:
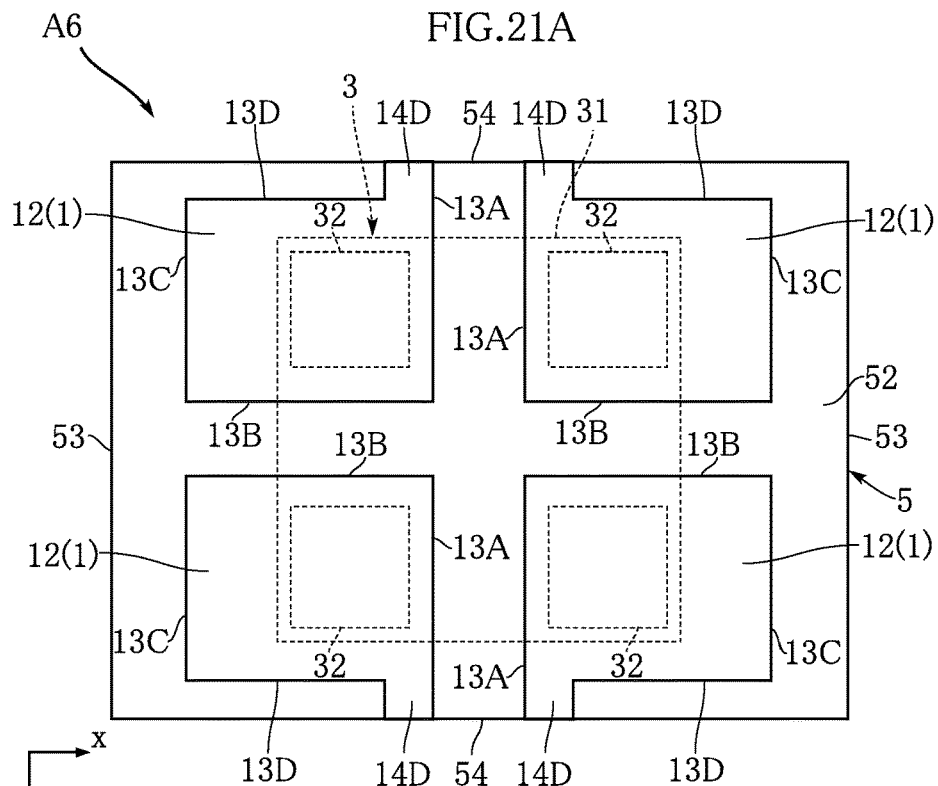
FIG. 21A is a bottom view of a semiconductor device according to a sixth embodiment.

Referring to FIG. 21A (and FIG. 21B), a semiconductor device A6 according to a sixth embodiment is described. In these figures, the elements that are identical or similar to those of the foregoing semiconductor device A1 are denoted by the same reference signs, and the overlapping description is omitted.

The semiconductor device A6 differs from the above-described semiconductor device A1 in structure of the terminals 1. In the semiconductor device A6, each terminal 1 has an extension 14D. The extension 14D extends from the fourth side surface 13D. The fourth side surface 13D is covered with the sealing resin 5. The (end surface of the) extension 14D is exposed from the second side surface 54 of the sealing resin 5. The end surface of the extension 14D is flush with the second side surface 54 of the sealing resin 5.

Figure 21B:
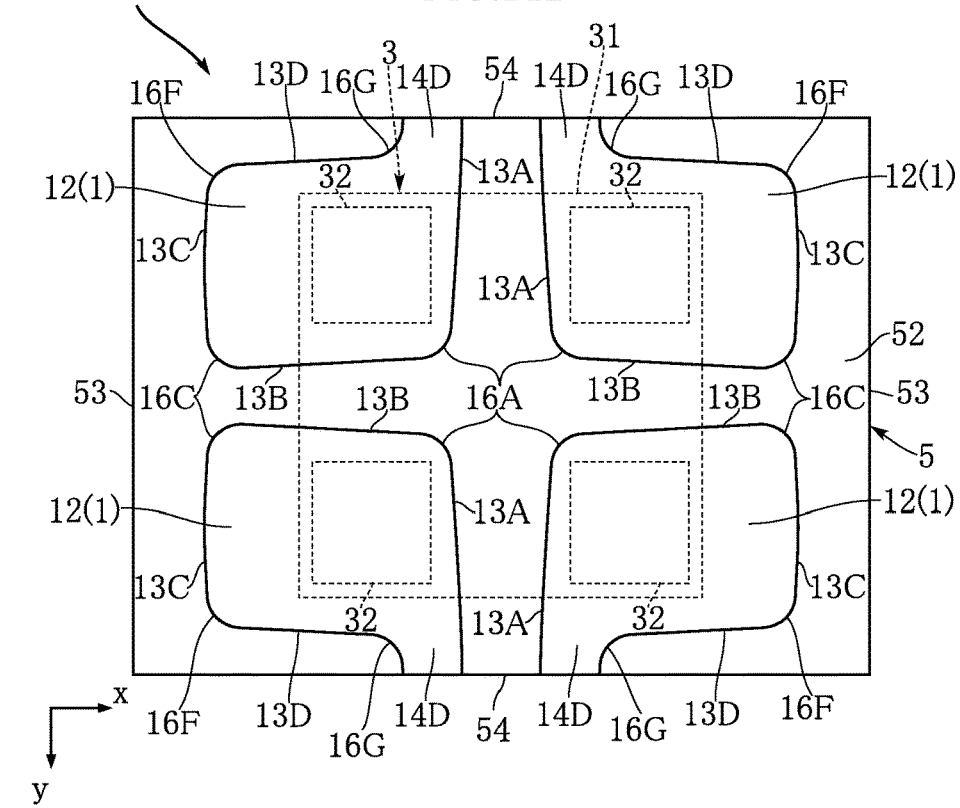
FIG. 21B is a bottom view showing a variation of the structure shown in FIG. 21A.

As shown in FIG. 21B, in the semiconductor device A6, each terminal 1 may have a sixth curved portion 16F and a seventh curved portion 16G. Each of the sixth curved portion 16F and the seventh curved portion 16G may be a chamfered portion of the terminal 1. The sixth curved portion 16F is positioned at the boundary between the third side surface 13C and the fourth side surface 13D. The seventh curved portion 16G is positioned at the boundary between the fourth side surface 13D and the extension 14D.

The advantages of the semiconductor device A6 are described below.

The semiconductor device A6 also achieves thickness reduction of the device. In manufacturing the semiconductor device A6, the extension 14D can be used for connecting the portion to become the terminal 1 to the nearby frame portion.

Figure 22:
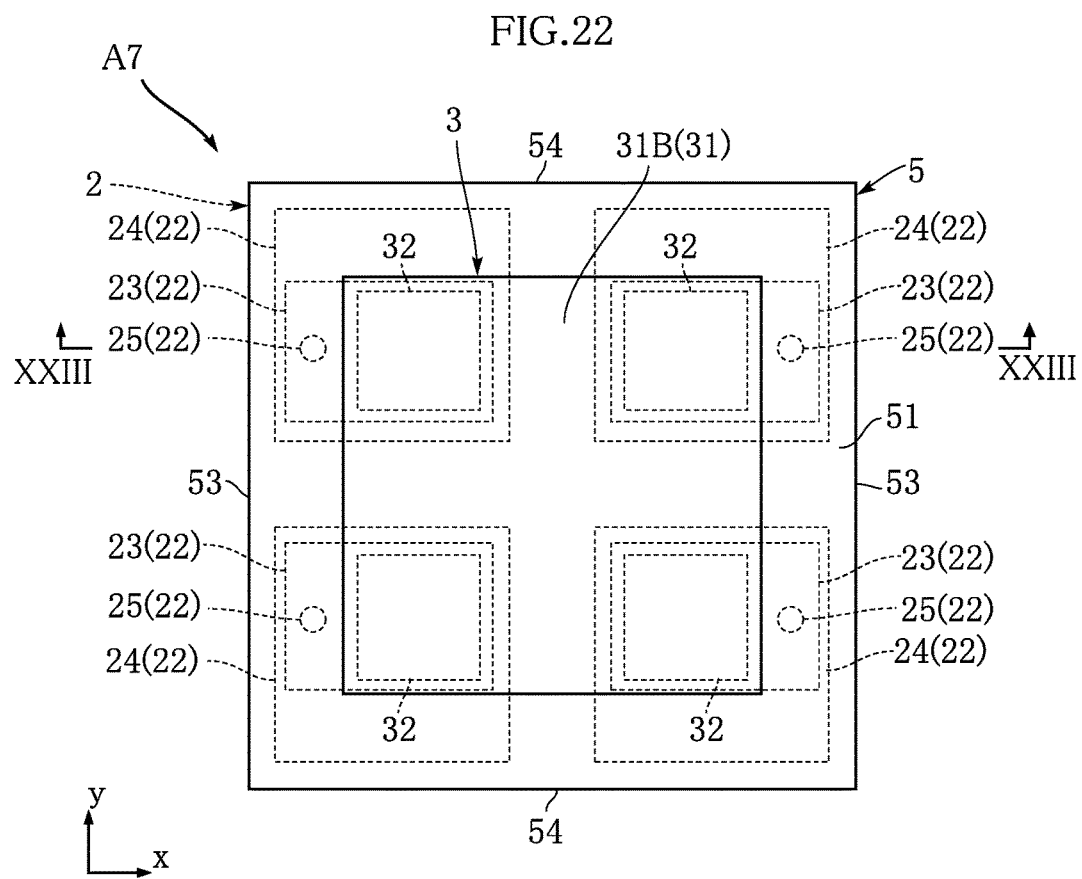
FIG. 22 is a plan view of a semiconductor device according to a seventh embodiment.
Figure 23:
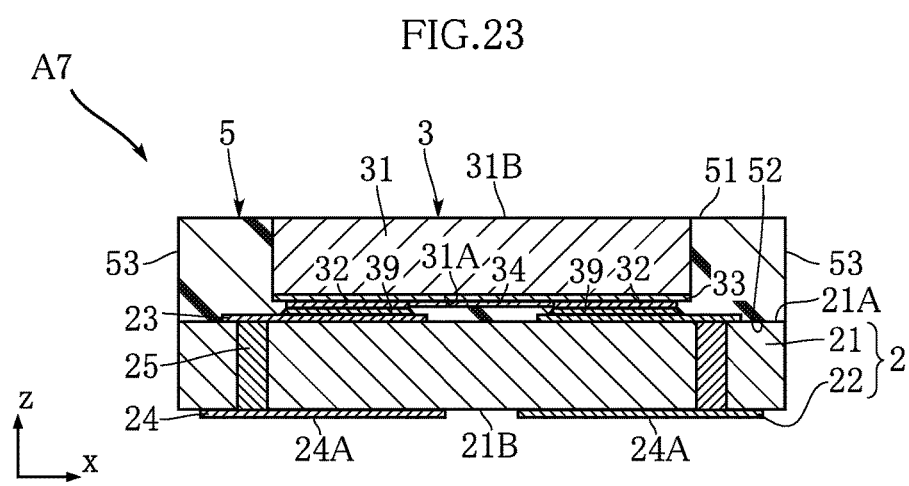
FIG. 23 is a sectional view taken along line XXIII-XXIII in FIG. 22.

Referring to FIGS. 22 and 23, a semiconductor device A7 according to a seventh embodiment is described. In these figures, the elements that are identical or similar to those of the foregoing semiconductor device A1 are denoted by the same reference signs, and the overlapping description is omitted.

The semiconductor device A7 includes a substrate 2, a Hall element 3 and a sealing resin 5.

The substrate 2 includes a base 21 and a wiring 22. The substrate 2 is rectangular as viewed in the z direction, having a pair of sides along the x direction and a pair of sides along the y direction. As viewed in the z direction, the periphery of the substrate 2 coincides with the periphery of the sealing resin 5. The substrate 2 is square as viewed in the z direction and is similar in shape to the Hall element 3.

The base 21 has a base obverse surface 21A and a base reverse surface 21B. The base obverse surface 21A and the base reverse surface 21B face away from each other in the z direction. In the semiconductor device A7, the base obverse surface 21A and the base reverse surface 21B are perpendicular to the z direction. The base 21 is made of an electrically insulating material such as glass epoxy resin or ceramics, for example.

The wiring 22 provides a conduction path between the wiring board on which the semiconductor device A7 is mounted and the Hall element 3. In the semiconductor device A7, the wiring 22 has four obverse surface portions 23, four reverse surface portions 24, and four penetrating portions 25. The obverse surface portions 23 are formed on the base obverse surface 21A of the base 21. The reverse surface portions 24 are formed on the base reverse surface 21B of the base 21. The penetrating portions 25 penetrate the base 21 in the z direction and connect the obverse surface portions 23 and the reverse surface portions 24 to each other. The wiring 22 is made up of a plurality of metal layers formed by electroplating, for example. For example, the plurality of metal layers are a Cu layer, a Ni layer and a Au layer. The electrodes 32 of the Hall element 3 are bonded to the obverse surface portions 23 with a conductive bonding material 39. The surface of each reverse surface portion 24 that faces downward in FIG. 23 is a mount surface 24A. The mount surface 24A is used in mounting the semiconductor device A7 onto a wiring board.

The exposed surface 31B of the Hall element 3 is exposed from the obverse surface 51 of the sealing resin 5. The exposed surface 31B and the obverse surface 51 are flush with each other.

The advantages of the semiconductor device A7 are described below.

The semiconductor device A7 also achieves thickness reduction of the device. The use of the substrate 2 increases the mechanical strength of the semiconductor device A7.

Figure 24:
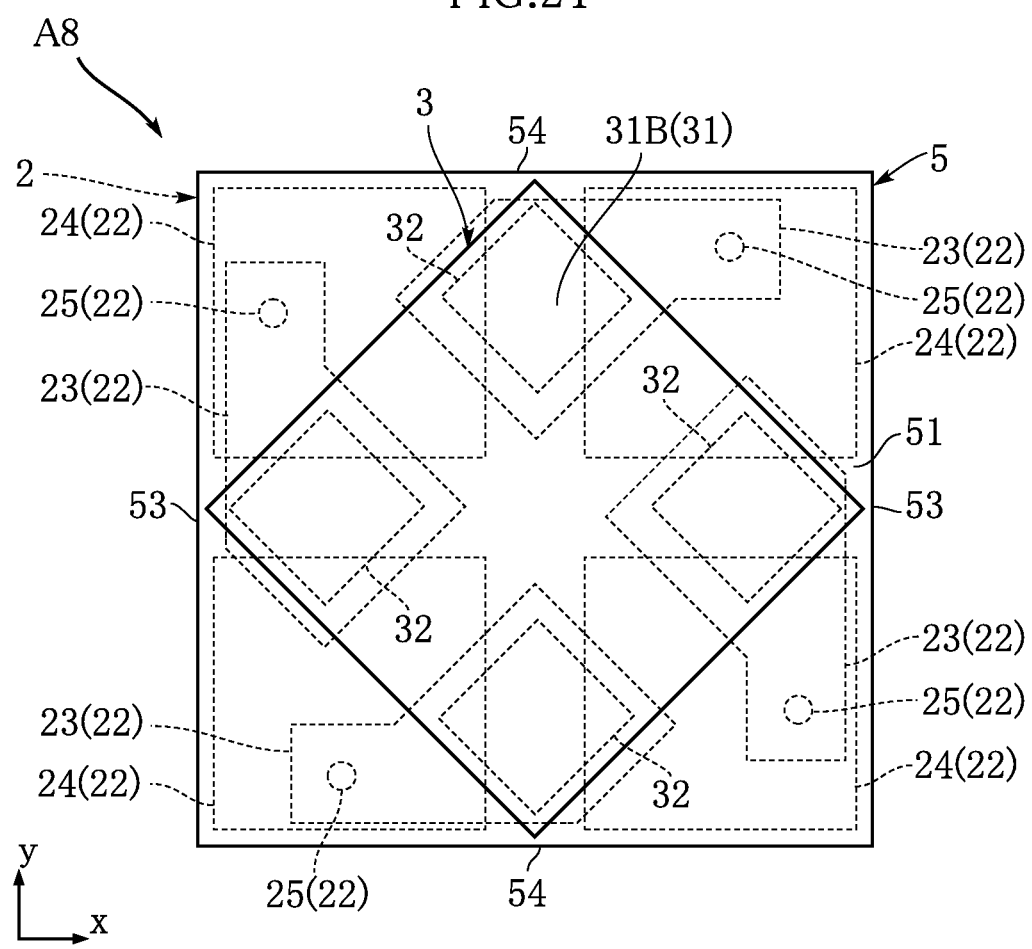
FIG. 24 is a plan view of a semiconductor device according to an eighth embodiment.

Referring to FIG. 24, a semiconductor device A8 according to an eighth embodiment is described. In these figures, the elements that are identical or similar to those of the foregoing semiconductor devices A1 and A7 are denoted by the same reference signs, and the overlapping description is omitted.

Similarly to the semiconductor device A7, the semiconductor device A8 includes a substrate 2, a Hall element 3 and a sealing resin 5. Each of the substrate 2 and the sealing resin 5 is rectangular as viewed in the z direction, having a pair of sides along the x direction and a pair of sides along the y direction. On the other hand, although the Hall element 3 is rectangular as viewed in the z direction, its four sides are not parallel to the x direction nor to the y direction but are inclined with respect to these directions. That is, as viewed in plan view, the Hall element 3 is inclined with respect to the substrate 2 (and/or the sealing resin 5). In the illustrated semiconductor device A8, the Hall element 3 is square as viewed in the z direction, and each of the four sides forms an inclination angle of 45° with respect to each of the x direction and the y direction. The inclination angle θ (not shown) of each side with respect to the x direction or the y direction is not limited to 45° and may be other values (e.g.) $0°<\theta<90°$).

Each obverse surface portion 23 of the wiring 22 of the substrate 2 extends from directly under the corresponding electrode 32 and its sufficiently large area overlaps with the reverse surface portion 24. In the semiconductor device A8 again, the penetrating portions 25 connect the obverse surface portions 23 and the reverse surface portions 24 to each other.

The advantages of the semiconductor device A8 are described below.

The semiconductor device A8 also achieves thickness reduction of the device. The use of the wiring 22 of the substrate 2 increases the degree of freedom of the arrangement of the Hall element 3.

Figure 25:
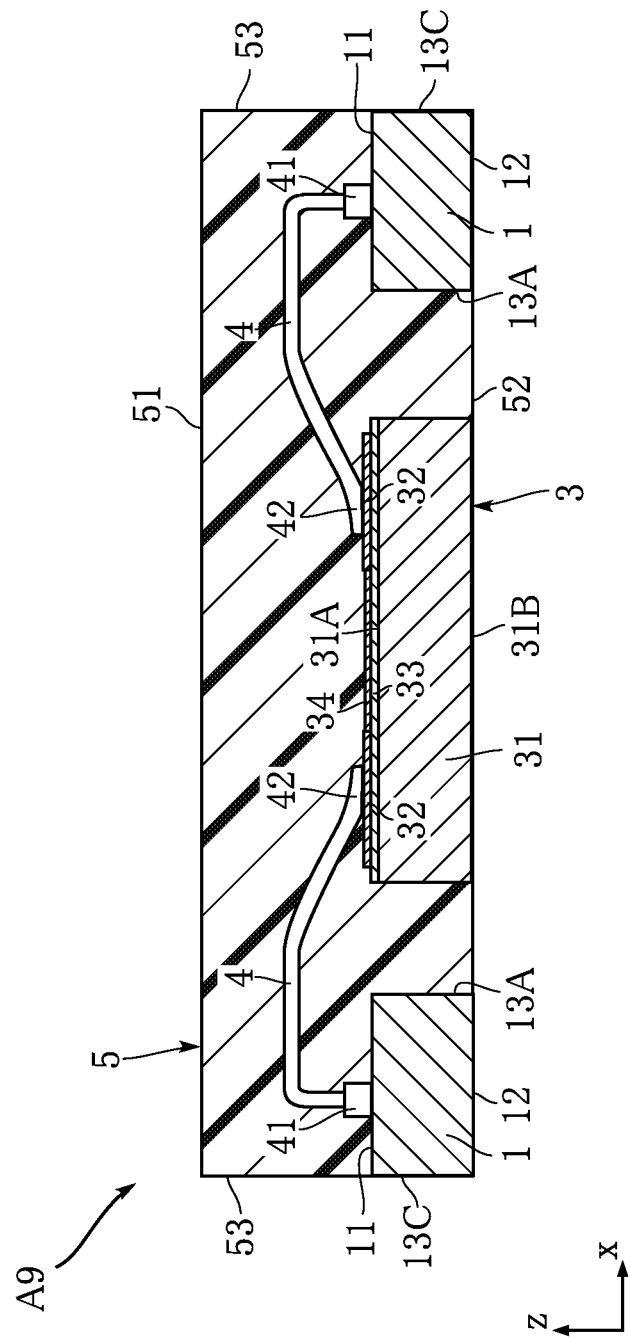
FIG. 25 is a sectional view of a semiconductor device according to a ninth embodiment.

Referring to FIG. 25, a semiconductor device A9 according to a ninth embodiment is described. In these figures, the elements that are identical or similar to those of the foregoing semiconductor device A1 are denoted by the same reference signs, and the overlapping description is omitted.

The semiconductor device A9 includes four terminals 1, a Hall element 3, four wires 4 and a sealing resin 5.

In the semiconductor device A9, the four terminals 1 are arranged at positions spaced apart from the Hall element 3 as viewed in the z direction. The mount surface 12 of each terminal 1 is exposed from the reverse surface 52 of the sealing resin 5 and flush with the reverse surface 52. In the semiconductor device A9, the exposed surface 31B of the element body 31 of the Hall element 3 is exposed from the reverse surface 52 of the sealing resin 5 and flush with the reverse surface 52. The functional surface 31A faces the same side as the obverse surfaces 11 of the terminals 1.

The wires 4 are connected to the obverse surfaces 11 of the terminals 1 and the electrodes 32 of the Hall element 3. For example, the material for the wires 4 is Au. Each of the wires 4 has a first bonding portion 41 and a second bonding portion 42. The first bonding portion 41 is the portion that was first bonded to an object in the wire bonding process and is bonded to the obverse surface 11 in the semiconductor device A9. The second bonding portion 42 is the portion that was bonded second in the wire bonding process and is bonded to the electrode 32 in the semiconductor device A9. The wires 4 are covered with the sealing resin 5.

Figure 26:
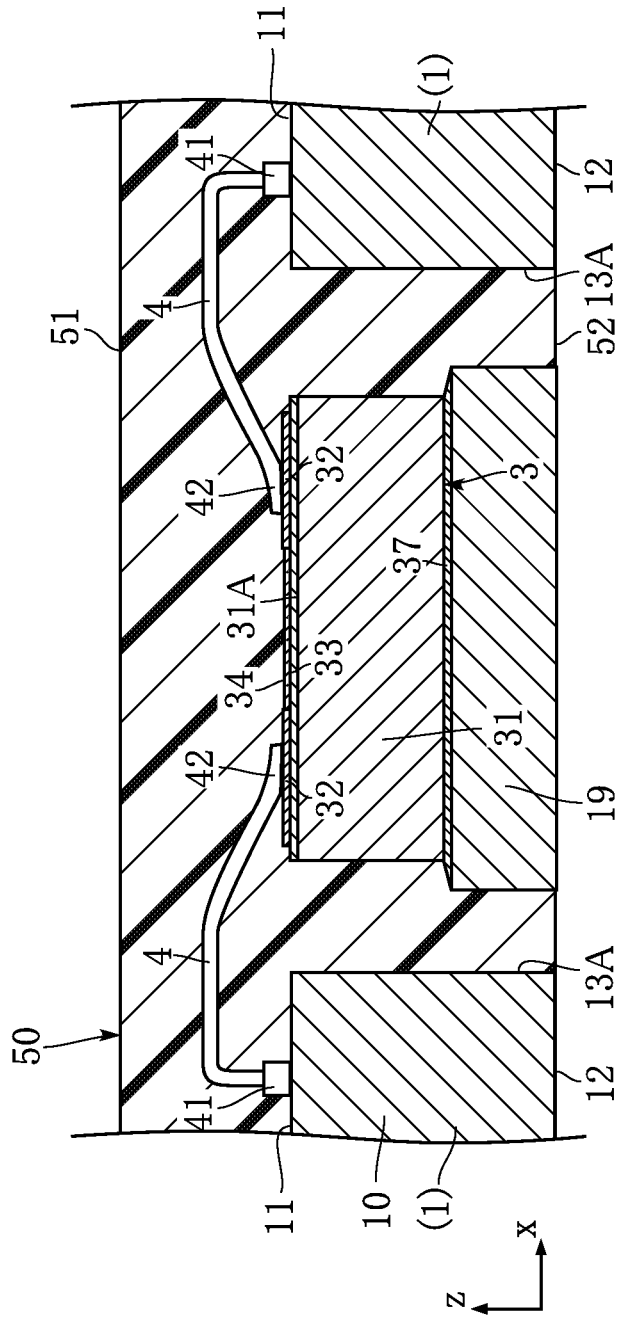
FIG. 26 is a sectional view for describing an example of a manufacturing method of the semiconductor device shown in FIG. 25.
Figure 27:
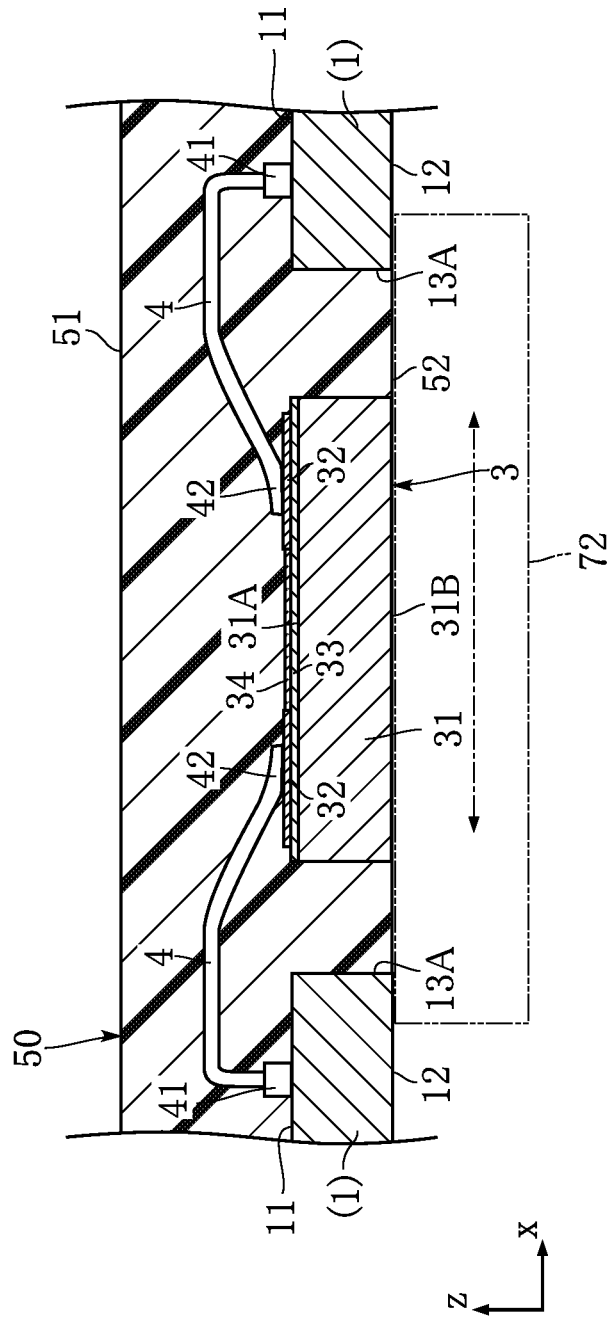
FIG. 27 is a sectional view for describing the example of the manufacturing method of the semiconductor device shown in FIG. 25.

Referring next to FIGS. 26 and 27, an example of a method for manufacturing the semiconductor device A9 is described.

First, a lead frame 10 for forming the terminals 1 is prepared, as shown in FIG. 26. The lead frame 10 has an island 19. The island 19 is provided at a position surrounded by the four terminals 1 as viewed in the z direction. Subsequently, a Hall element 3 is bonded to the island 19. Specifically, in this bonding process, a portion of the element body 31 of the Hall element 3 that is opposite to the functional surface 31A is bonded with a bonding material 37. The bonding material 37 may be either electrically conductive or electrically insulating. Then, the wires 4 are bonded to the electrodes 32 and the obverse surfaces 11. A resin layer 50 is then formed to cover a portion of the lead frame 10, the Hall element and the wires 4. Though not illustrated, a support member for supporting the lead frame 10 may be used.

Subsequently, a grinding step is performed as shown in FIG. 27. In this grinding step, the lead frame 10 and the resin layer 50 are ground from the side opposite the functional surface 31A by using a grinding means 72, for example. By this grinding step, the island 19 of the lead frame 10 is completely removed, and the exposed surface 31B is formed at the element body 31. Further, the mount surfaces 12 are formed at portions of the lead frame 10 that are to become the terminals 1, and the reverse surface 52 is formed at the resin layer 50. As a result of this grinding step, the exposed surface 31B of the element body 31 of the Hall element 3 is exposed from the reverse surface 52 of the sealing resin 5 to be flush with the reverse surface 52. The mount surfaces 12 of the terminals 1 are exposed from the reverse surface 52 to be flush with the reverse surface 52. Thereafter, the lead frame 10 and the resin layer 50 are cut, whereby the semiconductor device A9 is obtained.

The advantages of the semiconductor device A9 are described below.

The semiconductor device A9 also achieves thickness reduction of the device. In the semiconductor device A9, the exposed surface 31B is exposed from the sealing resin 5 while being flush with one surface of the sealing resin 5. For example, the exposed surface 31B is exposed from either one of the obverse surface 51 and the reverse surface 52. As will be understood from the semiconductor device A9, as a means for electrically connecting the Hall element 3 to the terminals 1, wires 4 may be used instead of the conductive bonding material 39 (semiconductor devices A1-A8).

Figure 28:
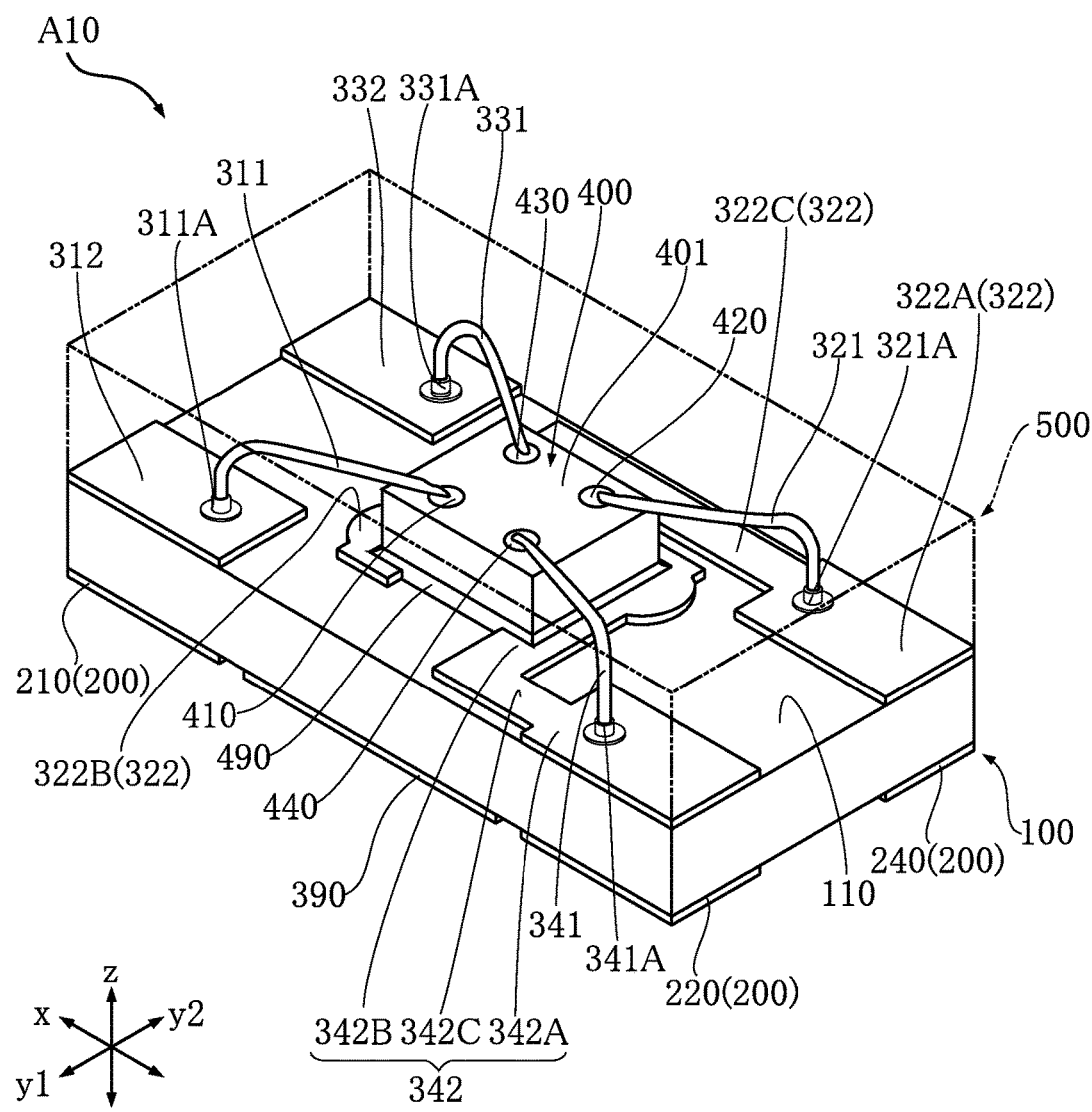
FIG. 28 is a perspective view of a semiconductor device (as seen through a sealing resin) according to a tenth embodiment.
Figure 29:
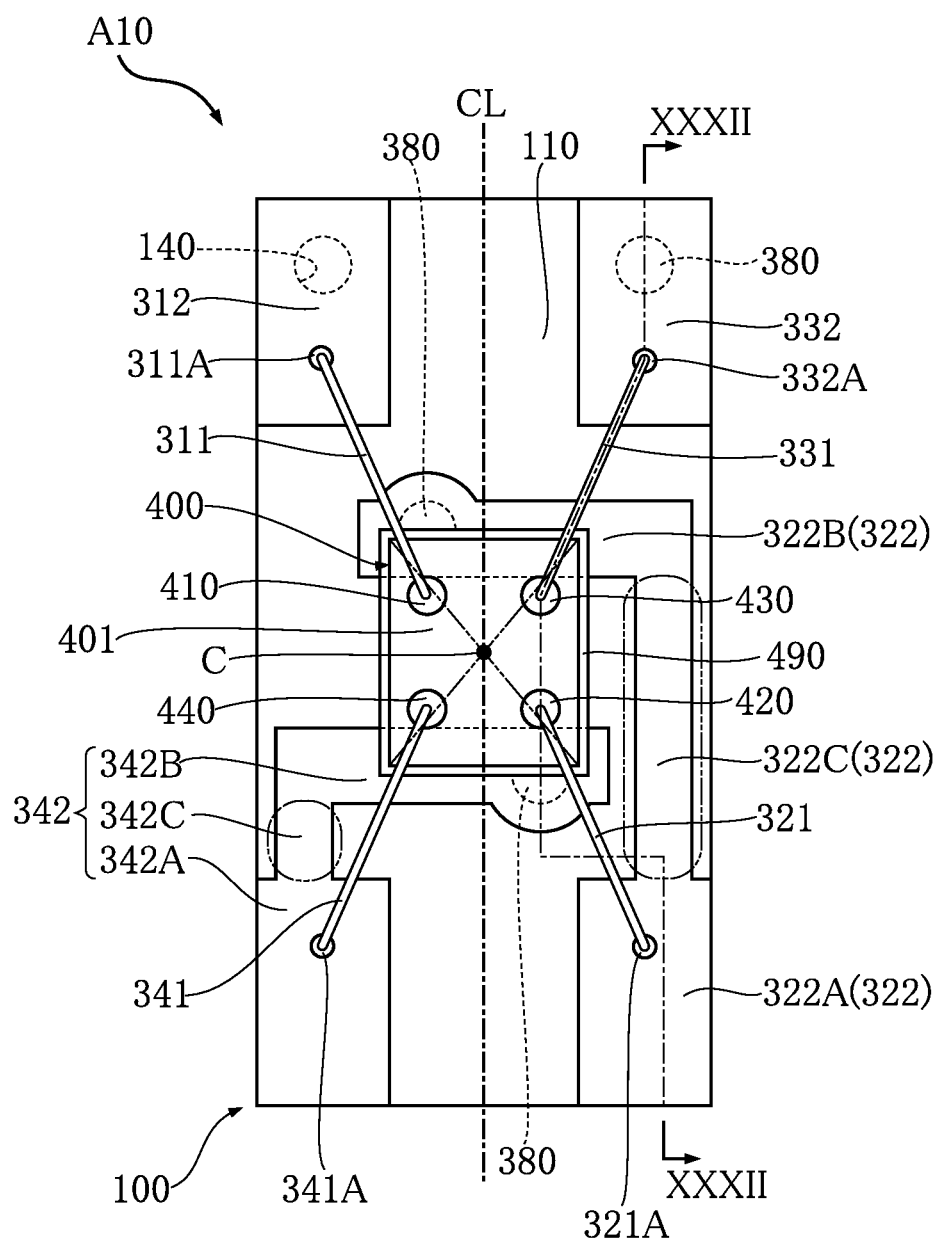
FIG. 29 is a plan view of the semiconductor device (as seen through a sealing resin) shown in FIG. 28.
Figure 30:
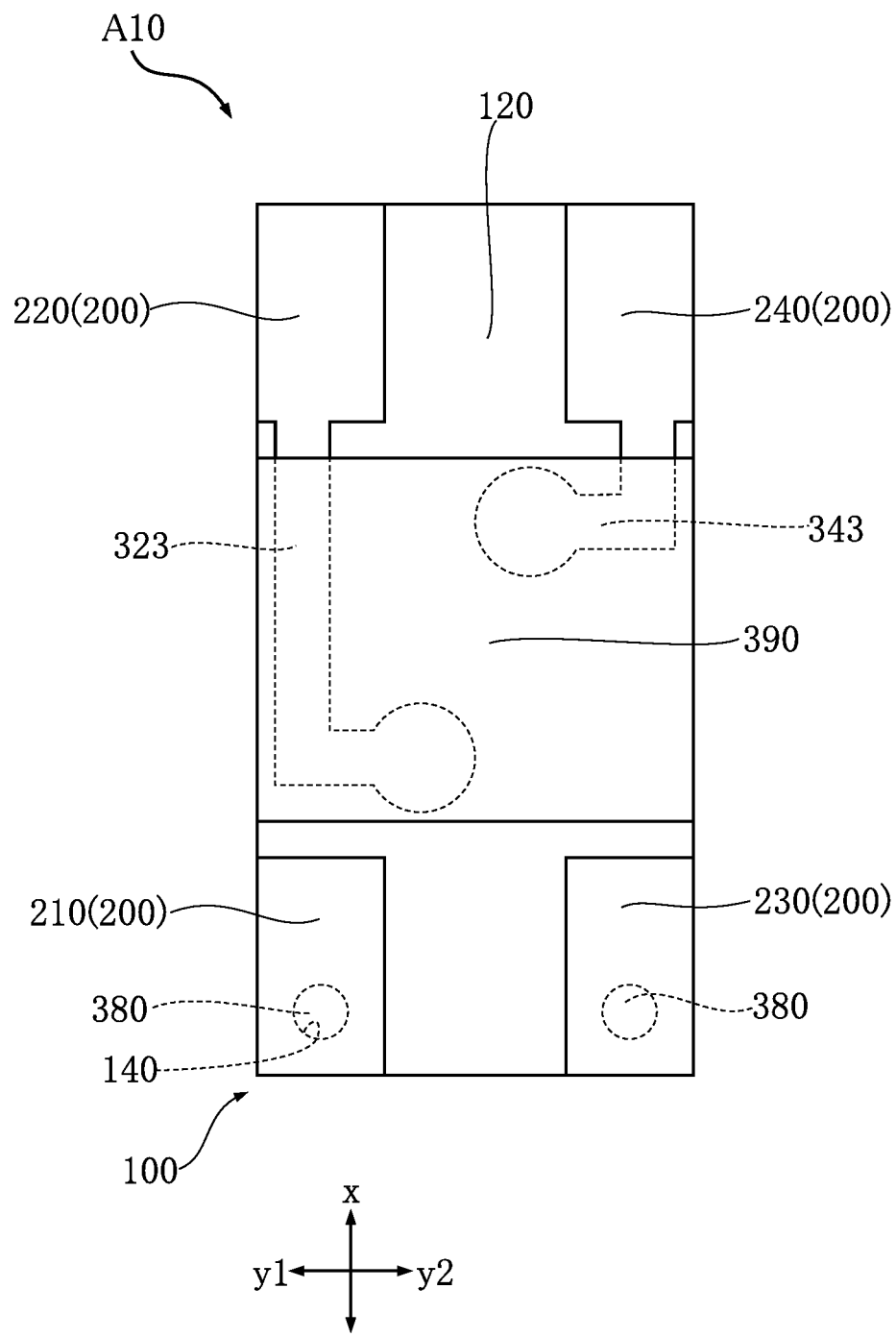
FIG. 30 is a bottom view of the semiconductor device shown in FIG. 28.
Figure 31:
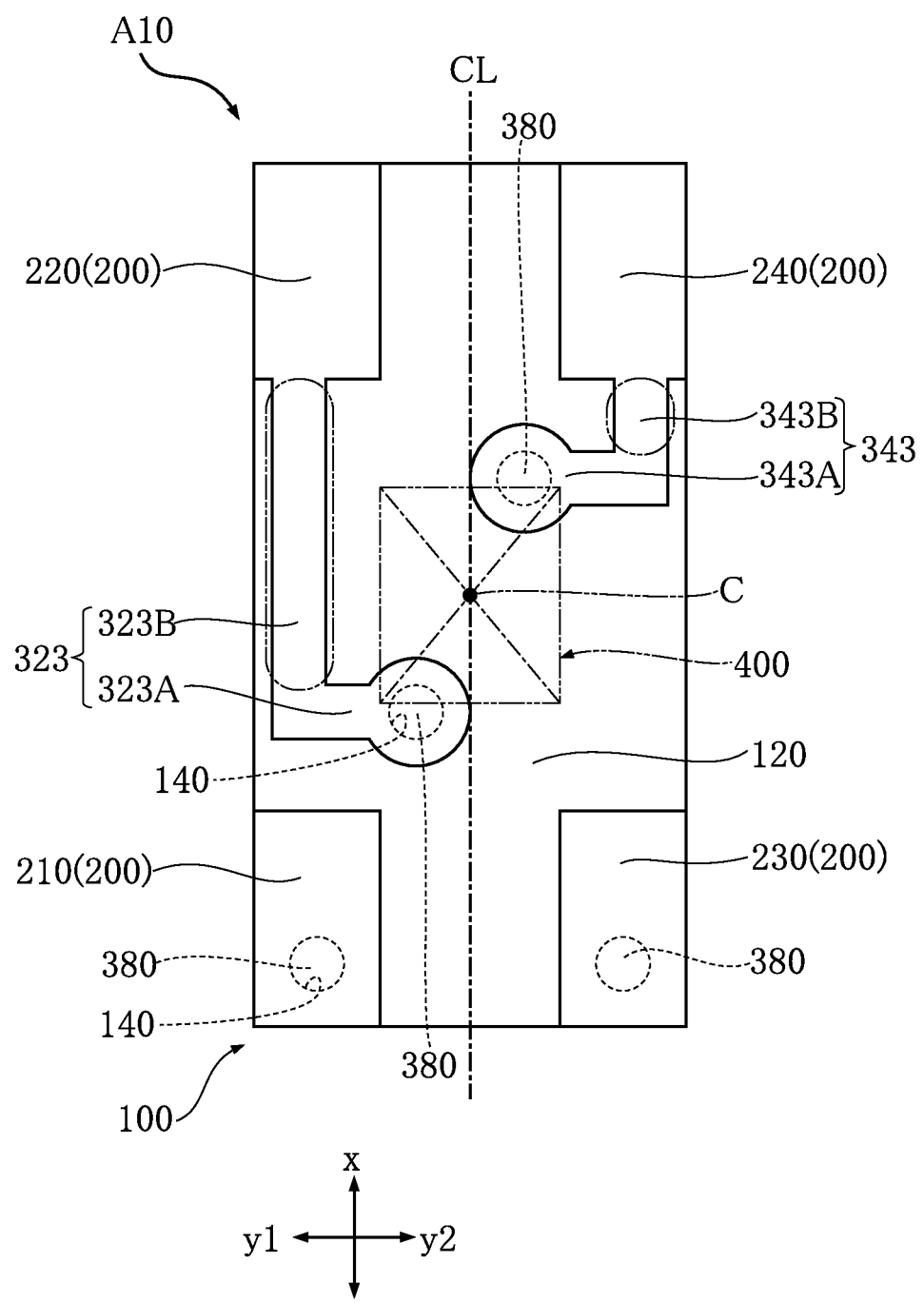
FIG. 31 is a bottom view of the semiconductor device shown in FIG. 28 (an insulating film omitted)

Referring to FIGS. 28-32, a semiconductor device A10 according to a tenth embodiment is described. The semiconductor device A10 includes a substrate 100, a plurality of terminals 200, a first through a fourth conduction paths, an insulating film 390, a Hall element 400 and a sealing resin 500. For the convenience of understanding, FIGS. 28 and 29 show the semiconductor device as seen through the sealing resin 500. In FIG. 28, the sealing resin 500 is illustrated by an imaginary line (two-dot chain line). In FIG. 31, the insulating film 390 is omitted.

The substrate 100 is an electrically insulating member, on which the terminals 200 are arranged and the Hall element 400 is mounted. The substrate 100 may be made of glass epoxy resin, for example. The substrate 100 has an obverse surface 110 and a reverse surface 120 facing away from each other in the direction z. The Hall element 400 is mounted on the obverse surface 110. The terminals 200 are arranged on the reverse surface 120.

As shown in FIGS. 29-32, the substrate 100 is formed with a plurality of through-holes 140. Each of the through-holes 140 extends from the obverse surface 110 to the reverse surface 120 (see FIG. 32), penetrating the substrate 100 in the direction z (thickness direction). The through-holes 140 may be cylindrical, for example. In each of the through-holes 140 is arranged a through-wiring 380, which also extends from the obverse surface 110 to the reverse surface 120, penetrating the substrate 100. The material for the through-wiring 380 may be Cu, for example. The through-wiring 380 can provide electrical conduction between a conductor provided on the obverse surface 110 and a conductor provided on the reverse surface 120. In the illustrated example, four through-holes (and four through-wirings 380) are provided (see e.g. the reference sign 380 in FIG. 31).

As shown in FIGS. 28, 30, 31 and 32, the terminals 200 are electrically conductive members that are electrically connected to the Hall element 400. In mounting the semiconductor device A10 onto a wiring board, the terminals 200 are connected to the wiring of the wiring board. The terminals 200 may be made up of a plurality of metal layers laminated one on top of another. Examples of the metal layers include a Cu layer, a Ni layer and a Sn alloy layer. The terminals 200 include a first terminal 210, a second terminal 220, a third terminal 230 and a fourth terminal 240. All of the first terminal 210, the second terminal 220, the third terminal 230 and the fourth terminal 240 are rectangular as viewed in plan.

A first conduction path electrically connects a first electrode 410 provided at the Hall element 400 and the first terminal 210 to each other. In the semiconductor device A10, the first conduction path is made up of a first wire 311, a first obverse surface wiring 312 and a through-wiring 380. The first wire 311 connects the first electrode 410 to the first obverse surface wiring 312. The material for the first wire 311 may be Au, for example. As shown in FIGS. 28 and 29, the ball bonding portion 311A of the first wire 311 is connected to the first obverse surface wiring 312. The first obverse surface wiring 312 is arranged on the obverse surface 110 and rectangular as viewed in plan. The first obverse surface wiring 312 may be made up of a plurality of metal layers laminated one on top of another. Examples of the metal layers include a Cu layer, a Ni layer and a Ag layer. The through-wiring 380 electrically connects the first obverse surface wiring 312 and the first terminal 210 to each other.

A second conduction path electrically connects a second electrode 420 provided at the Hall element 400 and the second terminal 220 to each other. In the semiconductor device A10, the second conduction path is made up of a second wire 321, a second obverse surface wiring 322, a through-wiring 380 and a second reverse surface wiring 323. The second wire 321 connects the second electrode 420 to the second obverse surface wiring 322. The material for the second wire 321 is the same as the material for the first wire 311. As shown in FIGS. 28 and 29, the ball bonding portion 321A of the second wire 321 is connected to the second obverse surface wiring 322.

The second obverse surface wiring 322 is arranged on the obverse surface 110. The second obverse surface wiring 322 may be made up of a plurality of metal layers laminated one on top of another. The constitution of the metal layers is the same as that of the first obverse surface wiring 312. As shown in FIGS. 28 and 29, the second obverse surface wiring 322 includes a pad portion 322A, a connecting portion 322B, and a coupling portion 322C. A ball bonding portion 321A of the second wire 321 is connected to the pad portion 322A. The pad portion 322A is rectangular as viewed in plan. A through-wiring 380 is connected to the connecting portion 322B. The connecting portion 322B extends in the direction y2 from the position to which the through-wiring 380 is connected. The coupling portion 322C is in the form of a strip extending in the direction x as viewed in plan and connects the pad portion 322A and the connecting portion 322B to each other. In FIG. 29, the region corresponding to the coupling portion 322C is surrounded by a two-dot chain line.

The second reverse surface wiring 323 is arranged on the reverse surface 120. The second reverse surface wiring 323 may be made up of a plurality of metal layers laminated one on top of another. Examples of the metal layers include a Cu layer and a Ni layer. As shown in FIG. 31, the second reverse surface wiring 323 includes a connecting portion 323A and a coupling portion 323B. A through-wiring 380 is connected to the connecting portion 323A. The connecting portion 323A extends in the direction y1 from the position to which the through-wiring 380 is connected. The coupling portion 323B is in the form of a strip extending in the direction x as viewed in plan and connects the second terminal 220 and the connecting portion 323A to each other. In FIG. 31, the region corresponding to the coupling portion 323B is surrounded by a two-dot chain line. The through-wiring 380 electrically connects the connecting portion 322B of the second obverse surface wiring 322 and the connecting portion 323A of the second reverse surface wiring 323 to each other.

A third conduction path electrically connects a third electrode 430 provided at the Hall element 400 and the third terminal 230 to each other. In the semiconductor device A10, the third conduction path is made up of a third wire 331, a third obverse surface wiring 332 and a through-wiring 380. The third wire 331 connects the third electrode 430 to the third obverse surface wiring 332. The material for the third wire 331 is the same as the material for the first wire 311. As shown in FIGS. 28 and 29, the ball bonding portion 331A of the third wire 331 is connected to the third obverse surface wiring 332. The third obverse surface wiring 332 is arranged on the obverse surface 110 and rectangular as viewed in plan. The third obverse surface wiring 332 may be made up of a plurality of metal layers laminated one on top of another. The constitution of the metal layers is the same as that of the first obverse surface wiring 312. The through-wiring 380 electrically connects the third obverse surface wiring 332 and the third terminal 230 to each other.

A fourth conduction path electrically connects a fourth electrode 440 provided at the Hall element 400 and the fourth terminal 240 to each other. In the semiconductor device A10, the fourth conduction path is made up of a fourth wire 341, a fourth obverse surface wiring 342, a through-wiring 380 and a fourth reverse surface wiring 343. The fourth wire 341 connects the fourth electrode 440 to the fourth obverse surface wiring 342. The material for the fourth wire 341 is the same as the material for the first wire 311. As shown in FIGS. 28 and 29, the ball bonding portion 341A of the fourth wire 341 is connected to the fourth obverse surface wiring 342.

The fourth obverse surface wiring 342 is arranged on the obverse surface 110. The fourth obverse surface wiring 342 may be made up of a plurality of metal layers laminated one on top of another. The constitution of the metal layers is the same as that of the first obverse surface wiring 312. The fourth obverse surface wiring 342 has a pad portion 342A, a connecting portion 342B and a coupling portion 342C. A ball bonding portion 341A of the fourth wire 341 is connected to the pad portion 342A. The pad portion 342A is rectangular as viewed in plan. A through-wiring 380 is connected to the connecting portion 342B. The connecting portion 342B extends in the direction y2 from the position to which the through-wiring 380 is connected. The coupling portion 342C is in the form of a strip extending in the direction x as viewed in plan and connects the pad portion 342A and the connecting portion 342B to each other. In FIG. 29, the region corresponding to the coupling portion 342C is surrounded by a two-dot chain line.

The fourth reverse surface wiring 343 is arranged on the reverse surface 120. The fourth reverse surface wiring 343 may be made up of a plurality of metal layers laminated one on top of another. The constitution of the metal layers is the same as that of the second reverse surface wiring 323. As shown in FIG. 31, the fourth reverse surface wiring 343 has a connecting portion 343A and a coupling portion 343B. A through-wiring 380 is connected to the connecting portion 343A. The connecting portion 343A extends in the direction y2 from the position to which the through-wiring 380 is connected. The coupling portion 343B is in the form of a strip extending in the direction x as viewed in plan and connects the fourth terminal 240 and the connecting portion 343A to each other. In FIG. 31, the region corresponding to the coupling portion 343B is surrounded by a two-dot chain line. The through-wiring 380 electrically connects the connecting portion 342B of the fourth obverse surface wiring 342 and the connecting portion 343A of the fourth reverse surface wiring 343 to each other.

As shown in FIG. 30, an insulating film 390 covering the second reverse surface wiring 323 and the fourth reverse surface wiring 343 is provided on the reverse surface 120. For example, the insulating film 390 may be a solder resist film.

As shown in FIGS. 28 and 29, the Hall element 400 is rectangular as viewed in plan. The Hall element 400 has an element obverse surface 401 facing in the direction z. In the semiconductor device A10, the first electrode 410, the second electrode 420, the third electrode 430 and the fourth electrode 440 are provided on the element obverse surface 401. A current (Hall current) is caused to flow through the first electrode 410 and the second electrode 420 of these electrodes. The electromotive force (Hall voltage) generated by Hall effect is applied to the third electrode 430 and the fourth electrode 440. The first electrode 410 is electrically connected to the first terminal 210 via the first conduction path (311, 312, 380). The second electrode 420 is electrically connected to the second terminal 220 via the second conduction path (321, 322, 380, 323). The third electrode 430 is electrically connected to the third terminal 230 via the conduction path (331, 332, 380). The fourth electrode 440 is electrically connected to the fourth terminal 240 via the fourth conduction path (341, 342, 380, 343). The Hall element 400 is provided with a magnetosensitive layer for detecting changes in magnetic flux density.

Figure 32:
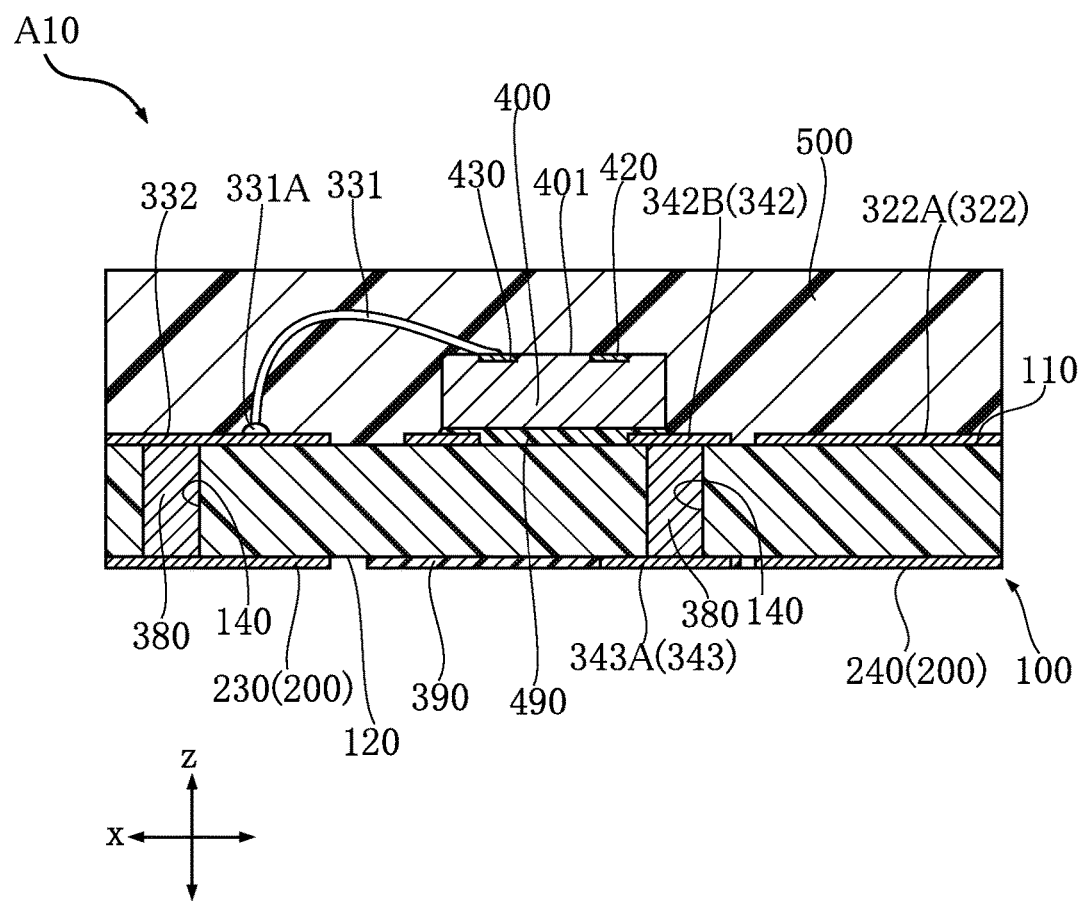
FIG. 32 is a sectional view taken along line XXXII-XXXII in FIG. 29.

As shown in FIGS. 28, 29 and 32, the Hall element 400 is mounted on the obverse surface 110 via a bonding layer 490. In the semiconductor device A10, the Hall element 400 is mounted on a portion of the connecting portion 322B of the second obverse surface wiring 322 and a portion of the connecting portion 342B of the fourth obverse surface wiring 342. The bonding layer 490 is electrically insulating. The material for the bonding layer 490 may be epoxy resin or polyimide, for example.

As shown in FIG. 32, the sealing resin 500 entirely covers the Hall element 400. The sealing resin 500 is a synthetic resin having electrically insulating and thermosetting properties. Examples of the synthetic resin include black epoxy resin. In the semiconductor device A10, the sealing resin 500 is formed in contact with the obverse surface 110 and covers (the elements constituting) the first conduction path, the second conduction path, the third conduction path and the fourth conduction path arranged on the obverse surface 110.

As shown in FIGS. 29 and 31, the first terminal 210 and the second terminal 220 are positioned on the left (direction y1 side) of the central axis CL (that is parallel to the direction x and extends through the center C of the Hall element 400), whereas the third terminal 230 and the fourth terminal 240 are positioned on the right (direction Y2 side) of the central axis CL. For example, the center C of the Hall element 400 may be the intersection of the diagonals (two-dot chain lines) of the Hall element 400 (see FIG. 31).

As shown in FIGS. 29 and 31, as viewed in plan, the second conduction path (321, 322, 380, 323) is arranged across the central axis CL. That is, the second conduction path (321, 322, 380, 323) is provided over the opposite sides (the direction y1 side and the direction y2 side) of the central axis CL. Specifically, a portion of the second conduction path (a single continuous conduction path) is arranged on the direction y1 side of the central axis CL, while remaining portions of the second conduction path are arranged on the direction y1 side of the central axis CL. Similarly, the fourth conduction path (341, 342, 380, 343) is provided on the opposite sides of the central axis CL.

The advantages of the semiconductor device A10 are described below.

In the semiconductor device A10, the first terminal 210 electrically connected to the first electrode 410 and the second terminal 220 electrically connected to the second electrode 420 are positioned on the same side (the direction y1 side) of the central axis CL of the Hall element 400, as viewed in plan. (The first terminal 210 and the second terminal 220 supply Hall current to the Hall element 400.) The third terminal 230 electrically connected to the third electrode 430 and the fourth terminal 240 electrically connected to the fourth electrode 440 are positioned on the same side (the direction y2 side) of the central axis CL, as in plan. (To the third terminal 230 and the fourth terminal 240 is applied the electromotive force generated at the Hall element 400 due to Hall effect.) With this arrangement, in mounting the semiconductor device A10 onto the wiring board, the terminals 200 to be electrically connected to the device driving circuitry 611 (see FIG. 6) are collected on one side of the central axis CL, whereas the terminals 200 to be electrically connected to the voltage detecting circuitry 612 (see FIG. 6) are collected on the other side. This allows wiring on the wiring board that is the mounting target to be simplified.

Moreover, the above-described arrangement prevents the detection accuracy of the voltage detecting circuitry 612 from being deteriorated (interfered) due to noise. Specifically, the wiring board on which the semiconductor device A10 is to be mounted includes a current-supplying wiring electrically connected to the device driving circuitry 611, and this wiring is used to supply a current (Hall current) to the semiconductor device A10. The noise generated due to this current may deteriorate the detection accuracy of the voltage detecting circuitry 612. However, the above-described arrangement achieves proper separation of the path for supplying the Hall current and the path for detecting the Hall voltage (connected to the voltage detecting circuitry 612). Thus, the voltage detecting circuitry 612 (or the Hall element) is protected from adverse effects of noise generated due to Hall current.

As shown in FIG. 30, the insulating film 390 is provided on the reverse surface 120 and covers the second reverse surface wiring 323 and the fourth reverse surface wiring 343. By the provision of the insulating film 390, when the semiconductor device A10 is mounted on the wiring board, the second reverse surface wiring 323 and the fourth reverse surface wiring 343 are prevented from being electrically connected to each other via solder.

Figure 33:
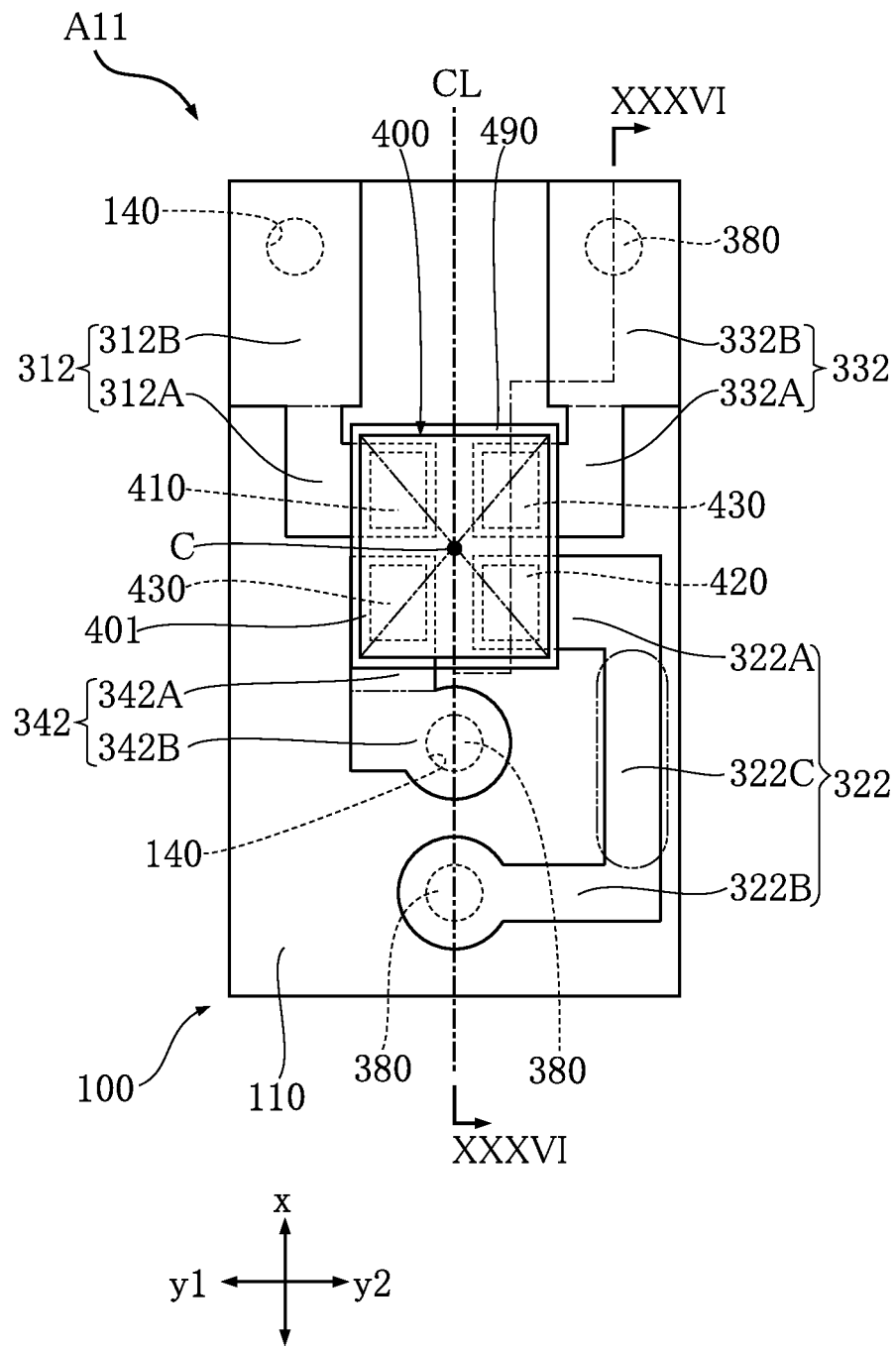
FIG. 33 is a plan view of a semiconductor device (as seen through a sealing resin) according to an eleventh embodiment.
Figure 34:
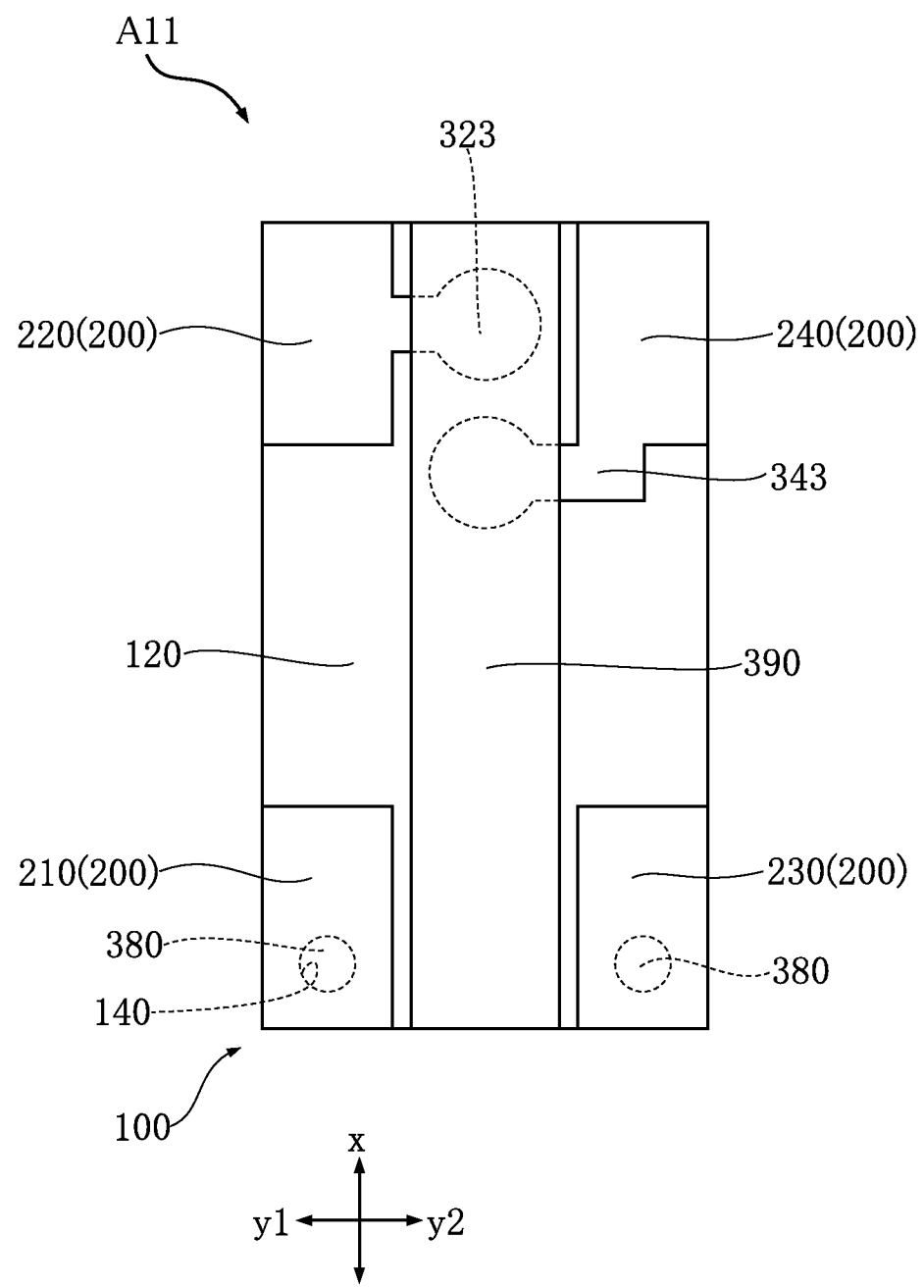
FIG. 34 is a bottom view of the semiconductor device shown in FIG. 33.
Figure 35:
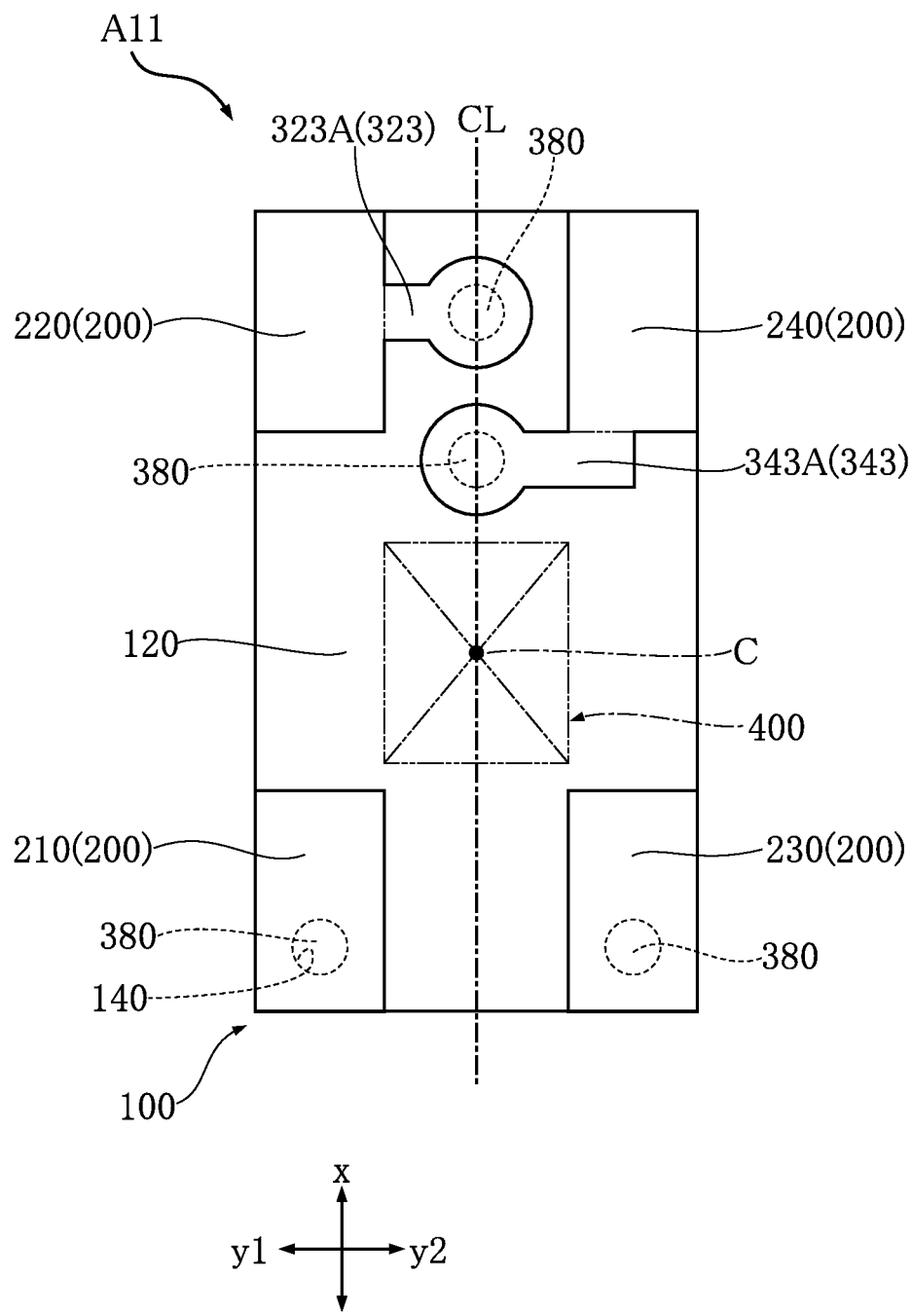
FIG. 35 is a bottom view of the semiconductor device shown in FIG. 33 (an insulating film omitted)

Referring to FIGS. 33-36, a semiconductor device A11 according to an eleventh embodiment is described. In these figures, the elements that are identical or similar to those of the foregoing semiconductor device A10 are denoted by the same reference signs, and the overlapping description is omitted. For the convenience of understanding, FIG. 33 shows the semiconductor device as seen through the sealing resin 500. In FIG. 35, the insulating film 390 is omitted.

Figure 36:
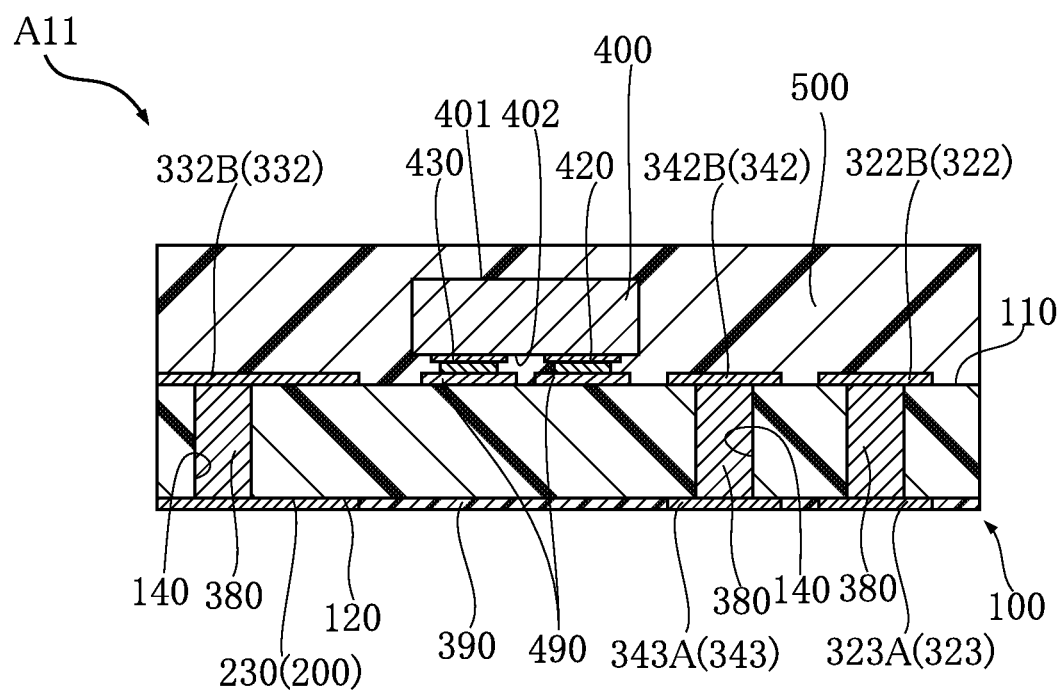
FIG. 36 is a sectional view taken along line XXXVI-XXXVI in FIG. 33.

The semiconductor device A11 differs from the above-described semiconductor device A10 in structures of the Hall element 400 and the first through the fourth conduction paths. As shown in FIGS. 33 and 36, in the semiconductor device A11, the first electrode 410, the second electrode 420, the third electrode 430 and the fourth electrode 440 are provided on the element reverse surface 402 of the Hall element 400. The Hall element 400 is mounted on the obverse surface 110 by flip chip bonding. The first electrode 410 is connected to the first obverse surface wiring 312 via a bonding layer 490. The second electrode 420 is connected to the second obverse surface wiring 322 via the bonding layer 490. The third electrode 430 is connected to the third obverse surface wiring 332 via the bonding layer 490. The fourth electrode 440 is connected to the fourth obverse surface wiring 342 via the bonding layer 490. The bonding layer 490 is electrically conductive and may be made of solder, for example. In the semiconductor device A11, the first through the fourth wires (see FIG. 29) are not used. That is, each of the first through the fourth conduction paths of the semiconductor device A11 does not include a wire.

As shown in FIG. 33, the first obverse surface wiring 312 of the semiconductor device A11 has a pad portion 312A and a connecting portion 312B. To the pad portion 312A is connected the first electrode 410. The pad portion 312A is L-shaped in plan view. To the connecting portion 312B is connected a through-wiring 380. The connecting portion 312B is rectangular as viewed in plan. The third obverse surface wiring 332 of the semiconductor device A11 has a pad portion 332A and a connecting portion 332B. To the pad portion 332A is connected the third electrode 430. The pad portion 332A is L-shaped in plan view. To the connecting portion 332B is connected a through-wiring 380. The connecting portion 332B is rectangular as viewed in plan. In FIG. 33, the boundary between the pad portion 312A and the connecting portion 312B and the boundary between the pad portion 332A and the connecting portion 332B are indicated by two-dot chain lines.

As shown in FIG. 33, in the second obverse surface wiring 322 of the semiconductor device A11, a pad portion 322A extends in the direction y1 from a coupling portion 322C. To the pad portion 322A is connected the second electrode 420. In FIG. 33, the region corresponding to the coupling portion 322C is surrounded by a two-dot chain line. In the fourth obverse surface wiring 342 of the semiconductor device A11, a pad portion 342A extends in the direction x from a connecting portion 342B. To the pad portion 342A is connected the fourth electrode 440. In FIG. 33, the boundary between the pad portion 342A and the connecting portion 342B is indicated by a two-dot chain line.

As will be understood from FIG. 35, the second reverse surface wiring 323 of the semiconductor device A11 does not include a member corresponding to the coupling portion 323B shown in FIG. 31 (a strip-shaped portion extending in parallel to the central axis CL). The fourth reverse surface wiring 343 of the semiconductor device A11 does not include a member corresponding to the coupling portion 343B shown in FIG. 31. In FIG. 35, the boundary between the connecting portion 323A of the second reverse surface wiring 323 and the second terminal 220 and the boundary between the connecting portion 343A of the fourth reverse surface wiring 343 and the fourth terminal 240 are indicated by two-dot chain lines. As shown in FIG. 34, the insulating film 390 of the semiconductor device A11 is in the form of a strip extending in the direction x as viewed in plan.

As shown in FIGS. 33 and 35, in the semiconductor device A11 again, each of the second conduction path (322, 380, 323) and the fourth conduction path (342, 380, 343) is positioned over both the direction y1 side and the direction y2 side of the central axis CL.

The advantages of the semiconductor device A11 are described below.

Similarly to the above-described semiconductor device A10, in the semiconductor device A11, both of the first terminal 210 electrically connected to the first electrode 410 and the second terminal 220 electrically connected to the second electrode 420 are positioned on the direction y1 side of the central axis CL of the Hall element 400, as viewed in plan. Further, both of the third terminal 230 electrically connected to the third electrode 430 and the fourth terminal 240 electrically connected to the fourth electrode 440 are positioned on the direction y2 side of the central axis CL, as viewed in plan. Thus, in the semiconductor device A11 again, wiring on the wiring board that is the mounting target can be simplified.

In the semiconductor device A11, the Hall element 400 is mounted on the obverse surface 110 by flip chip bonding, and the connection does not use a wire. This allows the dimensions of the semiconductor device A11 to be made smaller than the dimensions of the semiconductor device A10.

Figure 37:
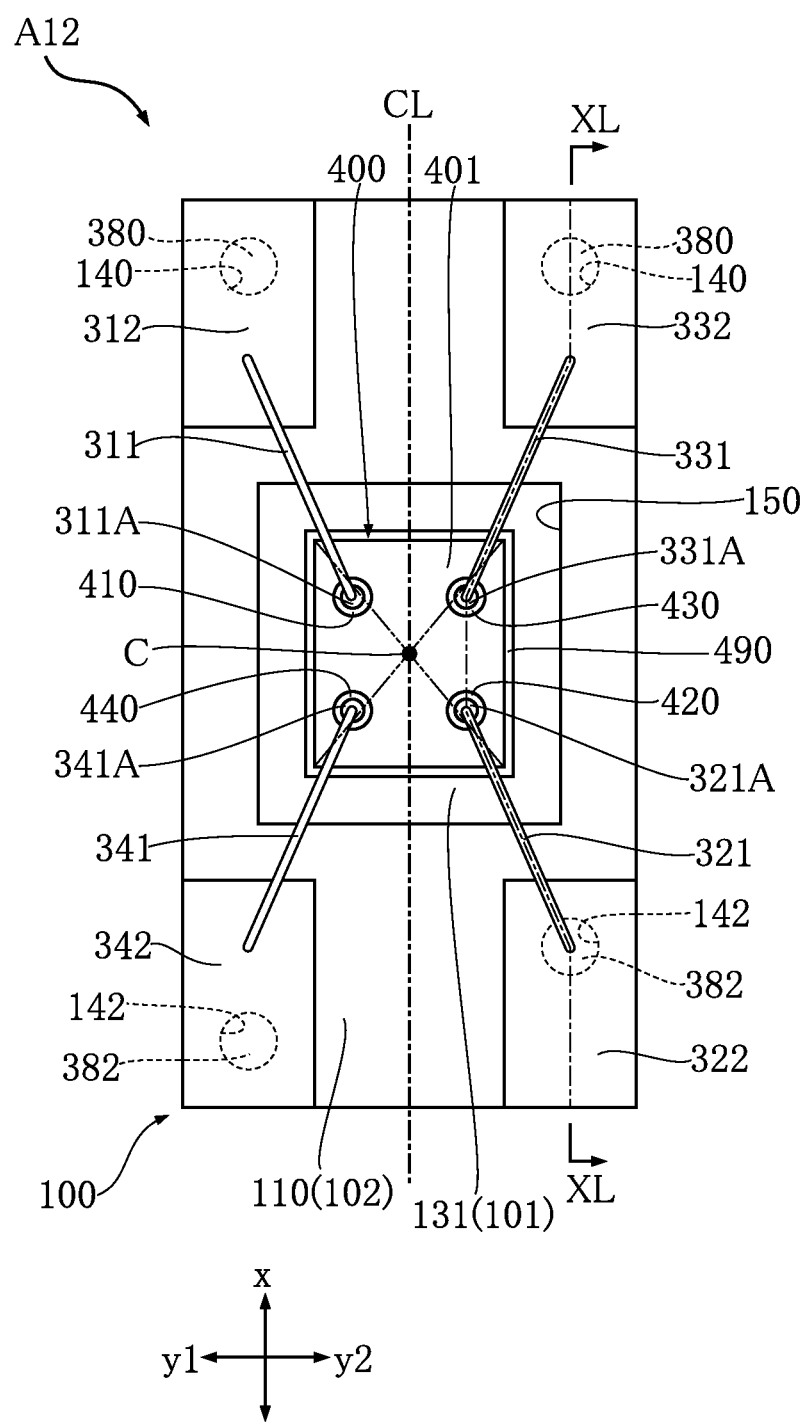
FIG. 37 is a plan view of a semiconductor device (as seen through a sealing resin) according to a twelfth embodiment.

Referring to FIGS. 37-40, a semiconductor device A12 according to a twelfth embodiment is described. In these figures, the elements that are identical or similar to those of the foregoing semiconductor device A10 are denoted by the same reference signs, and the overlapping description is omitted. For the convenience of understanding, FIG. 37 shows the semiconductor device as seen through the sealing resin 500.

Figure 38:
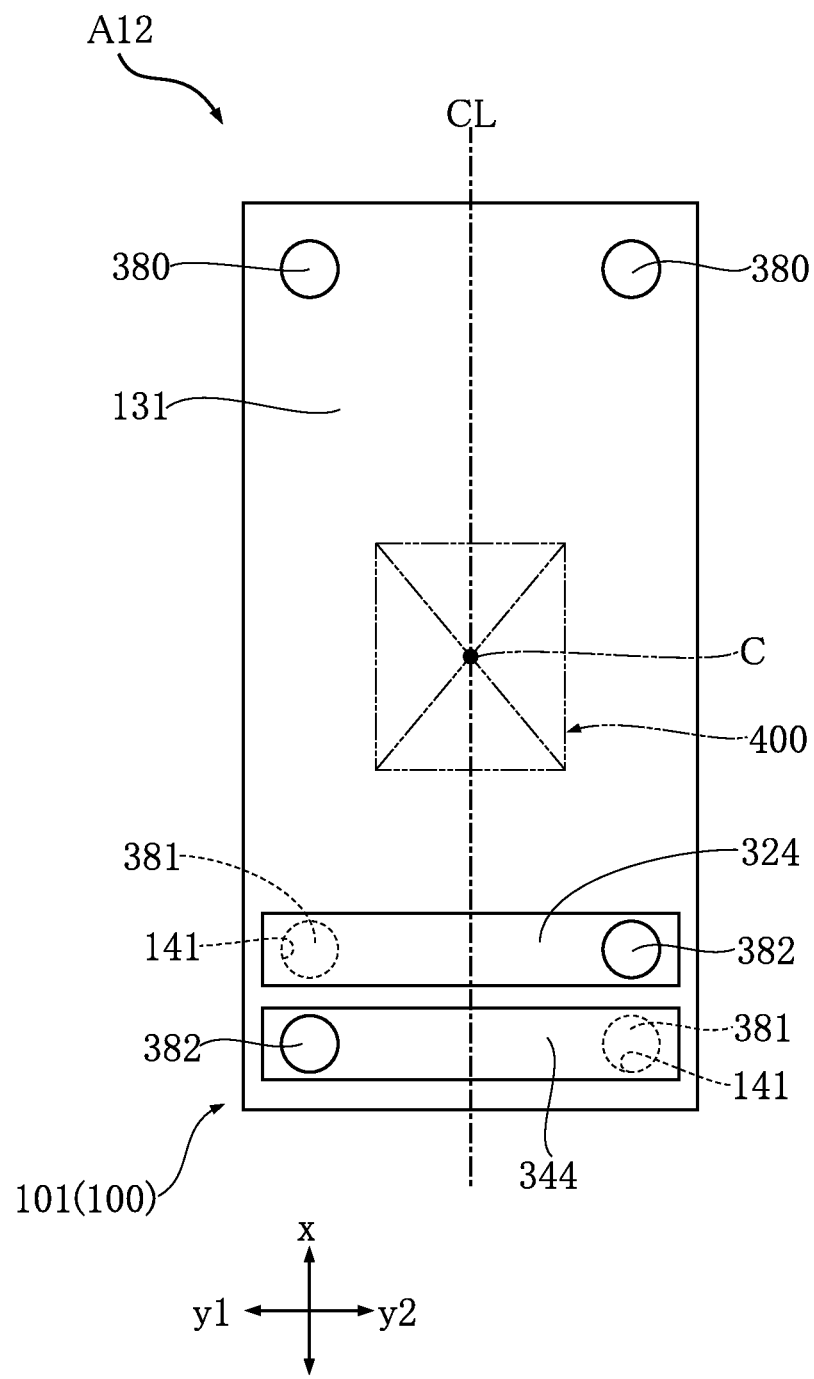
FIG. 38 is a plan view of a first substrate of the semiconductor device shown in FIG. 37.
Figure 40:
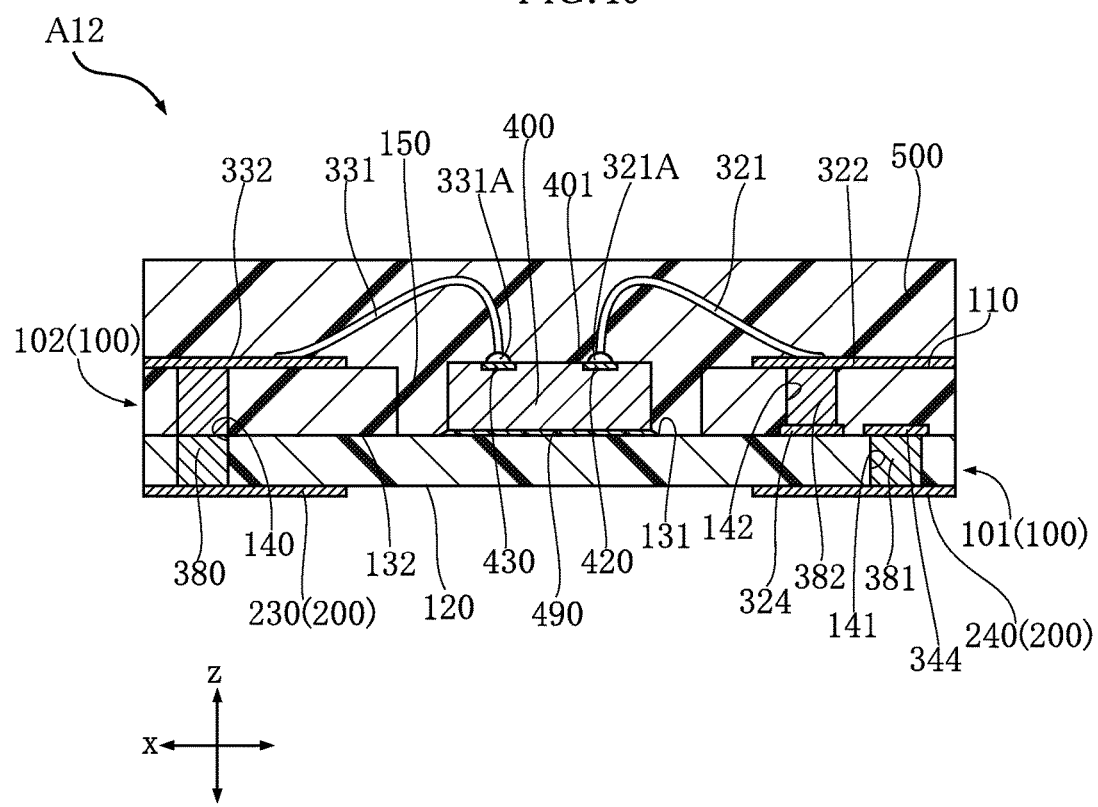
FIG. 40 is a sectional view taken along line XL-XL in FIG. 37.

The semiconductor device A12 differs from the above-described semiconductor device A10 in structures of the substrate 100 and the first through the fourth conduction paths. As shown in FIG. 40, the substrate 100 of the semiconductor device A12 includes a first substrate 101 and a second substrate 102. Both of the first substrate 101 and the second substrate 102 are made of an electrically insulating material (e.g. glass epoxy resin). The first substrate 101 has an obverse surface (first intermediate surface) 131 and a reverse surface 120 facing away from each other in the direction z. As shown in FIG. 38, on the first intermediate surface 131 are arranged a second intermediate wiring 324, which is a constituent element of the second conduction path, and a fourth intermediate wiring 344, which is a constituent element of the fourth conduction path. Both of the second intermediate wiring 324 and the fourth intermediate wiring 344 are in the form of a strip extending over both the direction y1 side and the direction y2 side of the central axis CL, as viewed in plan. The material for the second intermediate wiring 324 and the fourth intermediate wiring 344 may be Cu, for example.

Figure 39:
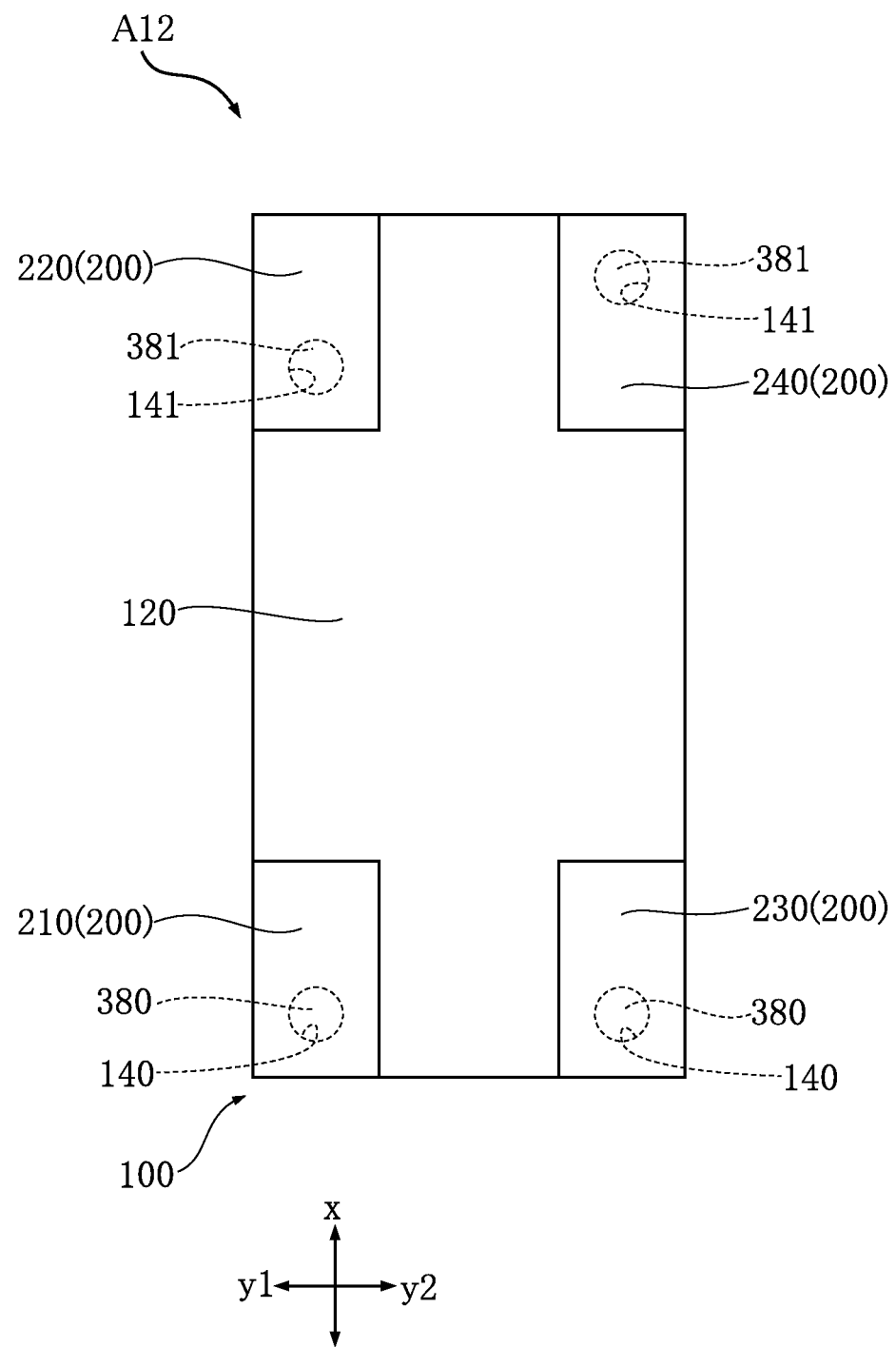
FIG. 39 is a bottom view of the semiconductor device shown in FIG. 37.

As shown in FIGS. 38-40, the first substrate 101 is formed with two through-holes 141 penetrating from the first intermediate surface 131 to the reverse surface 120. In each of the through-holes 141 is arranged a through-wiring 381. The material for the through-wirings 381 is the same as the material for the through-wirings 380 described above. One of the two through-wirings 381 (a constituent element of the second conduction path) electrically connects the second intermediate wiring 324 and the second terminal 220 to each other, whereas the other one of the two through-wirings (a constituent element of the fourth conduction path) electrically connects the fourth intermediate wiring 344 and the fourth terminal 240 to each other.

As shown in FIG. 39, on the reverse surface 120 are arranged the first terminal 210, the second terminal 220, the third terminal 230 and the fourth terminal 240. The semiconductor device A12 is not provided with the reverse surface wirings 323, 343 and the insulating film 390 shown in FIG. 34.

As shown in FIGS. 37 and 40, the second substrate 102 has an obverse surface 110 and a reverse surface (second intermediate surface) 132 facing away from each other in the direction z. The second intermediate surface 132 faces the first intermediate surface 131 of the first substrate 101. In the semiconductor device A12, the second substrate 102 is pressure-bonded to the first substrate 101 so that the first intermediate surface 131 and the second intermediate surface 132 are bonded to each other, forming the single substrate 100. Both of the second intermediate wiring 324 and the fourth intermediate wiring 344 are sandwiched between the first intermediate surface 131 and the second intermediate surface 132. The second substrate 102 is formed with two through-holes 142 penetrating from the obverse surface 110 to the second intermediate surface 132. In each of the through-holes 142 is arranged a through-wiring 382. The material for the through-wirings 382 is the same as the material for the through-wirings 380 described above. One of the two through-wirings 382 (a constituent element of the second conduction path) electrically connects the second obverse surface wiring 322 and the second intermediate wiring 324 to each other, whereas the other one of the two through-wirings (a constituent element of the fourth conduction path) electrically connects the fourth obverse surface wiring 342 and the fourth intermediate wiring 344 to each other.

As shown in FIGS. 37 and 40, the second substrate 102 is formed with a mounting hole 150 penetrating from the obverse surface 110 to the second intermediate surface 132 so that a portion of the first intermediate surface 131 of the first substrate 101 is exposed. The Hall element 400 is mounted on the exposed portion of the first intermediate surface 131 via a bonding layer 490. In the semiconductor device A12, the bonding layer 490 may be either electrically conductive or electrically insulating. When the bonding layer 490 is electrically conductive, its material may be Ag paste, for example. When the bonding layer 490 is electrically insulating, its material may be epoxy resin or polyimide, for example, similarly to the material for the bonding layer 490 of the semiconductor device A10.

As shown in FIG. 37, all of the first obverse surface wiring 312, the second obverse surface wiring 322, the third obverse surface wiring 332 and the fourth obverse surface wiring 342 are rectangular as viewed in plan. The ball bonding portion 311A of the first wire 311 is connected to the first electrode 410, and the ball bonding portion 321A of the second wire 321 is bonded to the second electrode 420. Similarly, the ball bonding portion 331A of the third wire 331 is connected to the third electrode 430, and the ball bonding portion 341A of the fourth wire 341 is bonded to the fourth electrode 440.

As shown in FIGS. 37 and 38, in the semiconductor device A12 again, both of the second conduction path and the fourth conduction path are positioned over both the direction y1 side and the direction y2 side of the central axis CL, as viewed in plan.

The advantages of the semiconductor device A12 are described below.

Similarly to the above-described semiconductor device A10, in the semiconductor device A12, both of the first terminal 210 electrically connected to the first electrode 410 and the second terminal 220 electrically connected to the second electrode 420 are positioned on the direction y1 side of the central axis CL of the Hall element 400, as viewed in plan.

Further, the both of the third terminal 230 electrically connected to the third electrode 430 and the fourth terminal 240 electrically connected to the fourth electrode 440 are positioned on the direction y2 side of the central axis CL, as viewed in plan. Thus, in the semiconductor device A12 again, wiring on the wiring board that is the mounting target can be simplified.

In the semiconductor device A12, the substrate 100 includes a first substrate 101 and a second substrate 102. On the first intermediate surface 131 of the first substrate 101 are arranged the second intermediate wiring 324 and the fourth intermediate wiring 344. In each of the through-holes 141 of the first substrate 101, the through-wiring 381 is arranged that is electrically connected to either one of the second intermediate wiring 324 and the fourth intermediate wiring 344. In each of the through-holes 142 of the second substrate 102, the through-wiring 382 is arranged that is electrically connected to either one of the second intermediate wiring 324 and the fourth intermediate wiring 344. This arrangement allows the shapes of the second obverse surface wiring 322 and the fourth obverse surface wiring 342 to be made simpler than those of the second obverse surface wiring 322 and the fourth obverse surface wiring 342 of the semiconductor device A11. At the reverse surface 120, the second reverse surface wiring 323, the fourth reverse surface wiring 343 and the insulating film 390 described above may not be provided.

The second substrate 102 is provided with the mounting hole 150 that can house the Hall element 400. This arrangement prevents the thickness of the semiconductor device A12 from becoming excessively large.

Referring to FIGS. 41A-43B, a semiconductor device A13 according to a thirteenth embodiment is described. In these figures, the elements that are identical or similar to those of the foregoing semiconductor device A10 are denoted by the same reference signs, and the overlapping description is omitted. For the convenience of understanding, FIGS. 41A, 41B, 43A and 43B show the semiconductor device as seen through the sealing resin 500. In FIGS. 41A, 41B, 43A and 43B, the sealing resin 500 is illustrated by an imaginary line.

Figure 43A:
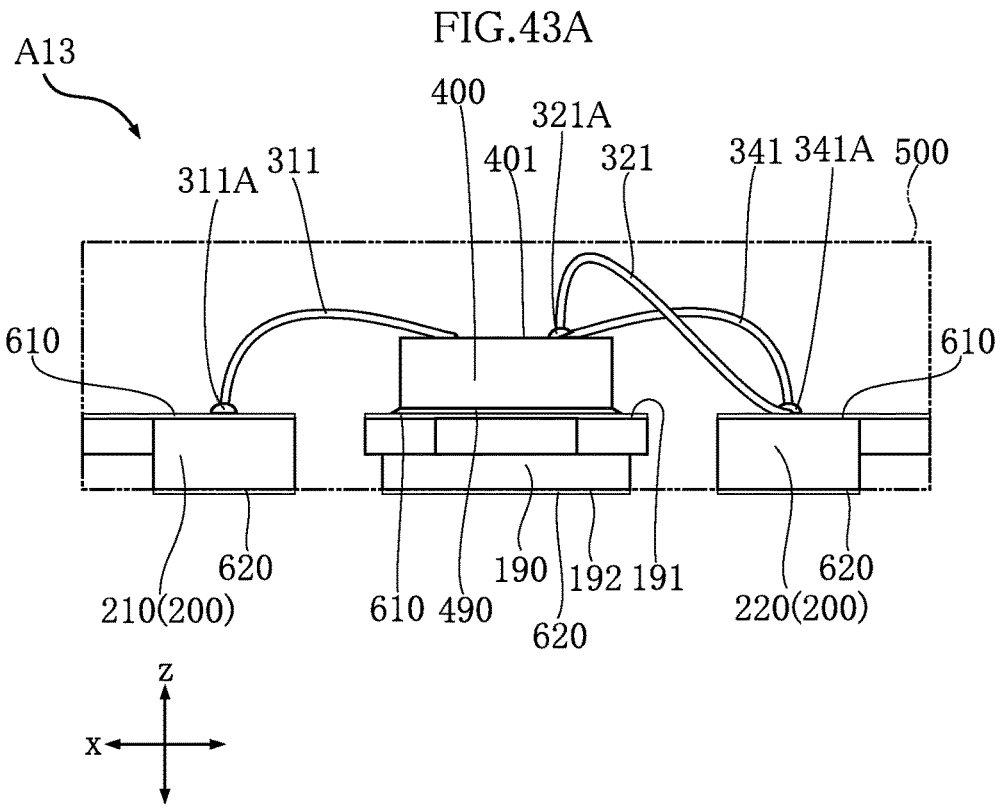
FIG. 43A is a left side view of the semiconductor device (as seen through a sealing resin) shown in FIG. 41A.

Unlike the semiconductor devices A11-A13, the semiconductor device A13 does not include the substrate 100 (see FIG. 43A). The semiconductor device A13 includes a die pad 190 on which the Hall element 400 is mounted. The semiconductor device A13 differs from the above-described semiconductor device A10 in structures of the terminals 200 and the first through the fourth conduction paths. The die pad 190 and the terminals 200 are made of a same lead frame. The first conduction path consists solely of the first wire 311. Similarly, the second conduction path consists solely of the second wire 321, the third conduction path consists solely of the third wire 331, and the fourth electrode path consists solely of the fourth wire 341. The die pad 190 has a pad obverse surface 191 and a pad reverse surface 192 facing away from each other in the direction z. The pad obverse surface 191 is covered with a plating layer 610. The material for the plating layer 610 may be Ag, for example. The Hall element 400 is mounted on the plating layer 610 (and hence on the pad obverse surface 191) via a bonding layer 490. In the semiconductor device A13, the bonding layer 490 may be either electrically conductive or electrically insulating. When the bonding layer 490 is electrically conductive, its material may be Ag paste, for example. When the bonding layer 490 is electrically insulating, its material is the same as the material for the bonding layer 490 of the semiconductor device A10, which may be epoxy resin or polyimide, for example. The pad reverse surface 192 is covered with a plating layer 620. The terminals 200 may be made up of a plurality of metal layers laminated one on top of another. Examples of the metal layers include a Ni layer and a Sn alloy layer.

As shown in FIG. 43A, in any of the first terminal 210, the second terminal 220, the third terminal 230 and the fourth terminal 240, the surface that faces the same direction as the pad obverse surface is covered with a plating layer 610. In any of the first terminal 210, the second terminal 220, the third terminal 230 and the fourth terminal 240, the surface that faces the same direction as the pad reverse surface 192 is covered with a plating layer 620.

Figure 41A:
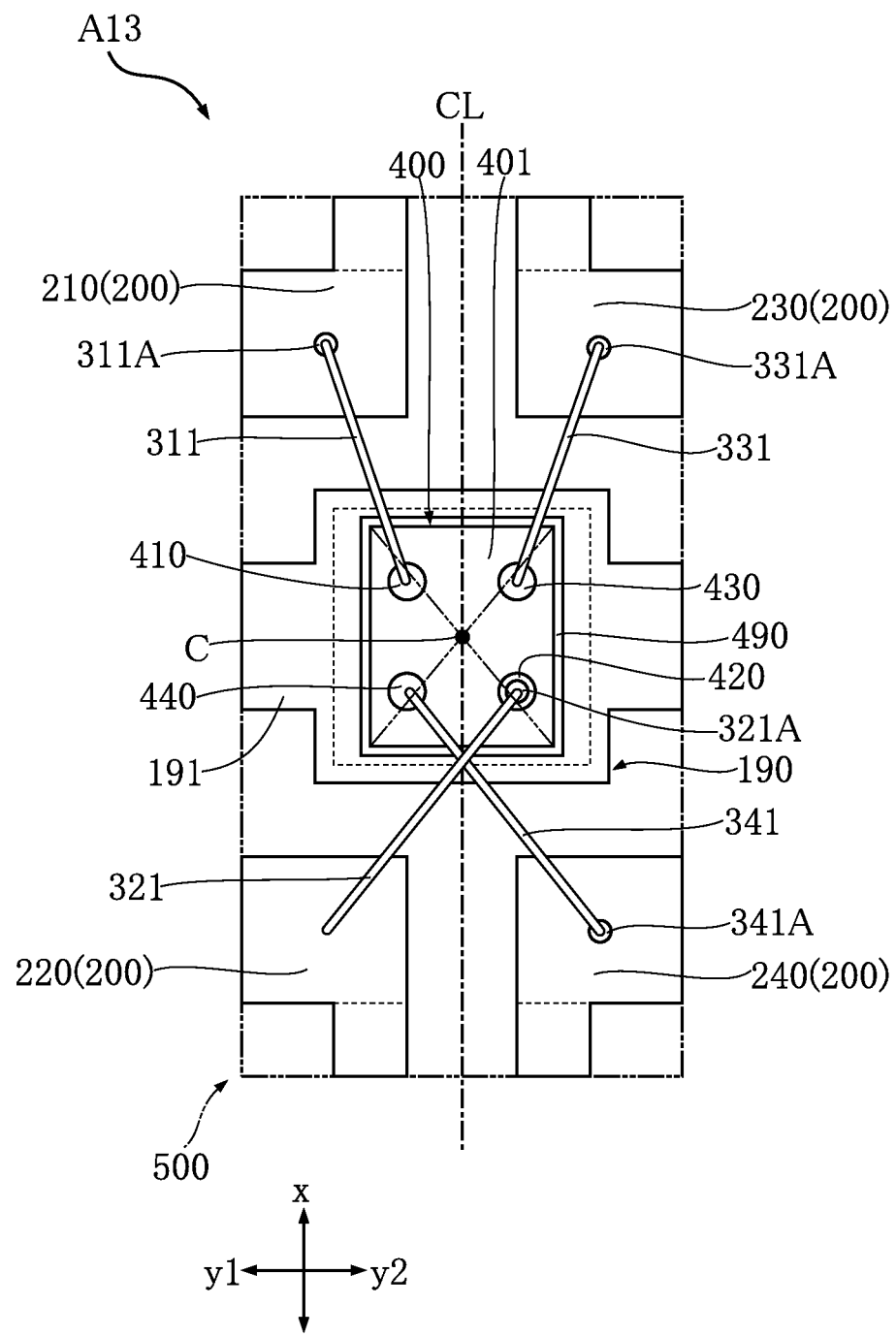
FIG. 41A is a plan view of a semiconductor device (as seen through a sealing resin) according to a thirteenth embodiment.

As shown in FIG. 41A, in the semiconductor device A13, both of the second wire 321 (second conduction path) and the fourth wire 341 (the fourth conduction path) cross the central axis CL. Thus, in the semiconductor device A13 again, both of the second conduction path and the fourth conduction path are positioned over both the direction y1 side and the direction y2 side of the central axis CL, as viewed in plan.

As shown in FIG. 41A, the ball bonding portion 311A of the first wire 311 is connected to the first terminal 210. The ball bonding portion 321A of the second wire 321 is connected to the second electrode 420. The ball bonding portion 331A of the third wire 331 is connected to the third terminal 230. The ball bonding portion 341A of the fourth wire 341 is connected to the fourth terminal 240. As shown in FIG. 43A, the second wire 321 extends over the fourth wire 341.

Figure 41B:
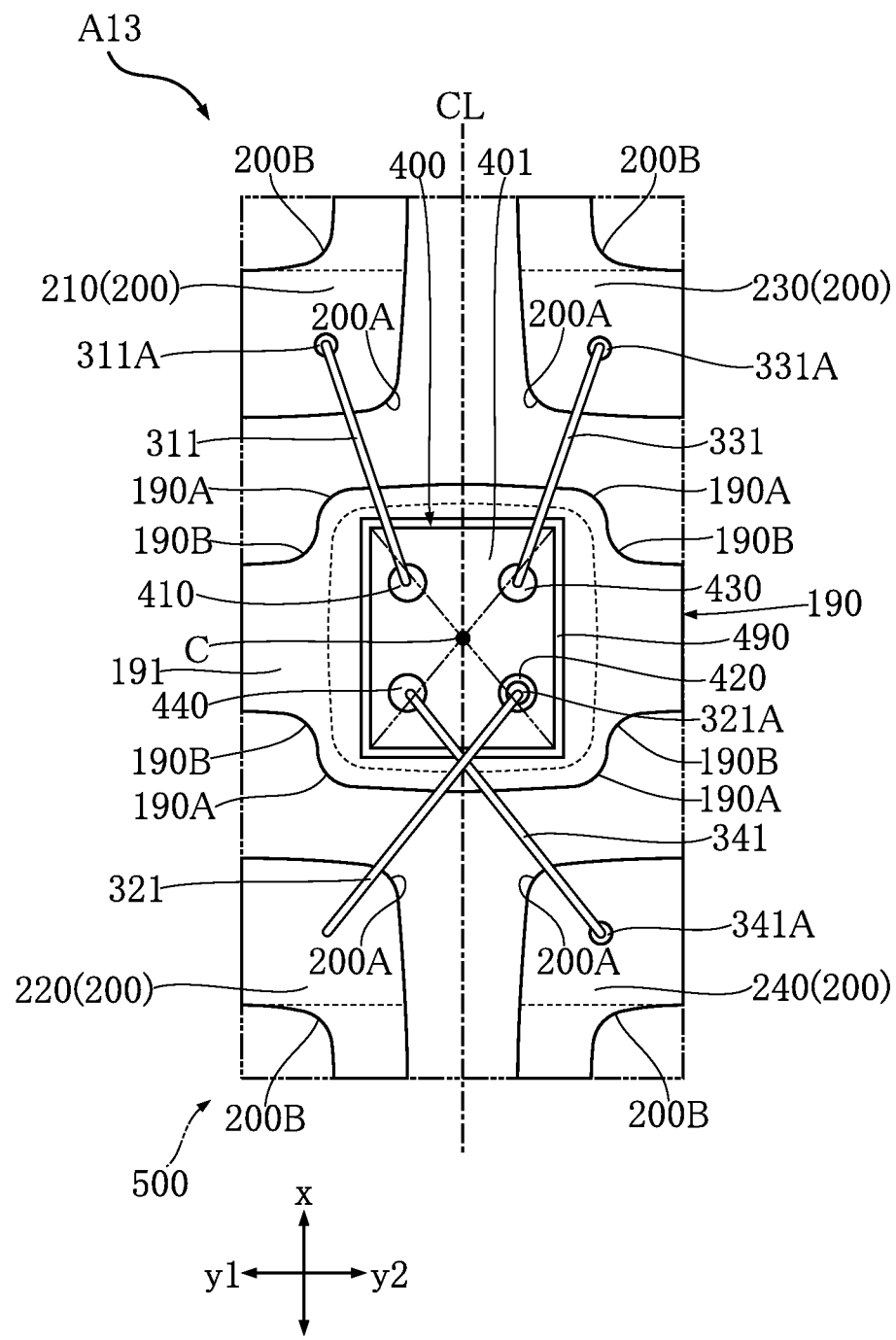
FIG. 41B is a plan view showing a variation of the structure shown in FIG. 41A.
Figure 42A:
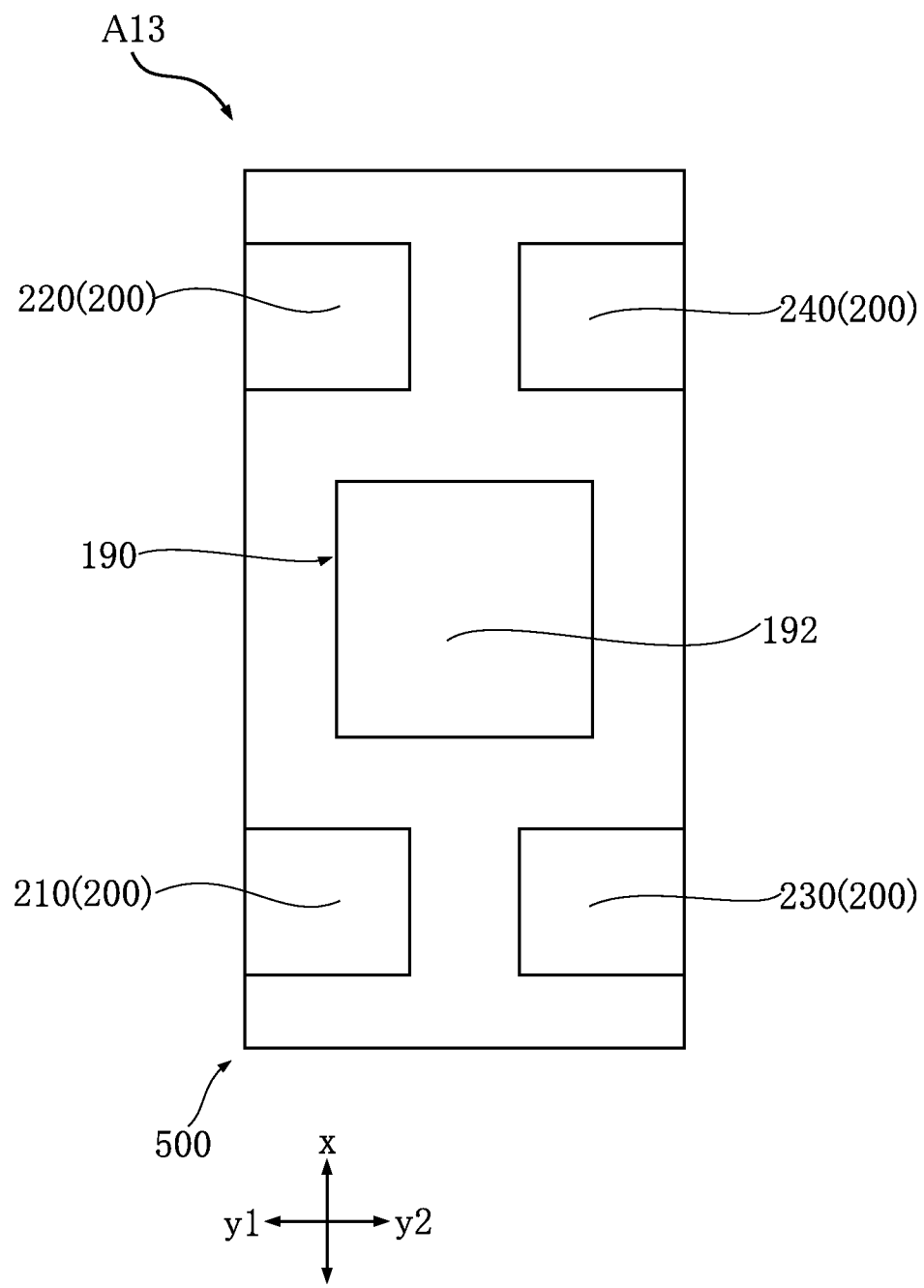
FIG. 42A is a bottom view of the semiconductor device shown in FIG. 41A.
Figure 43B:
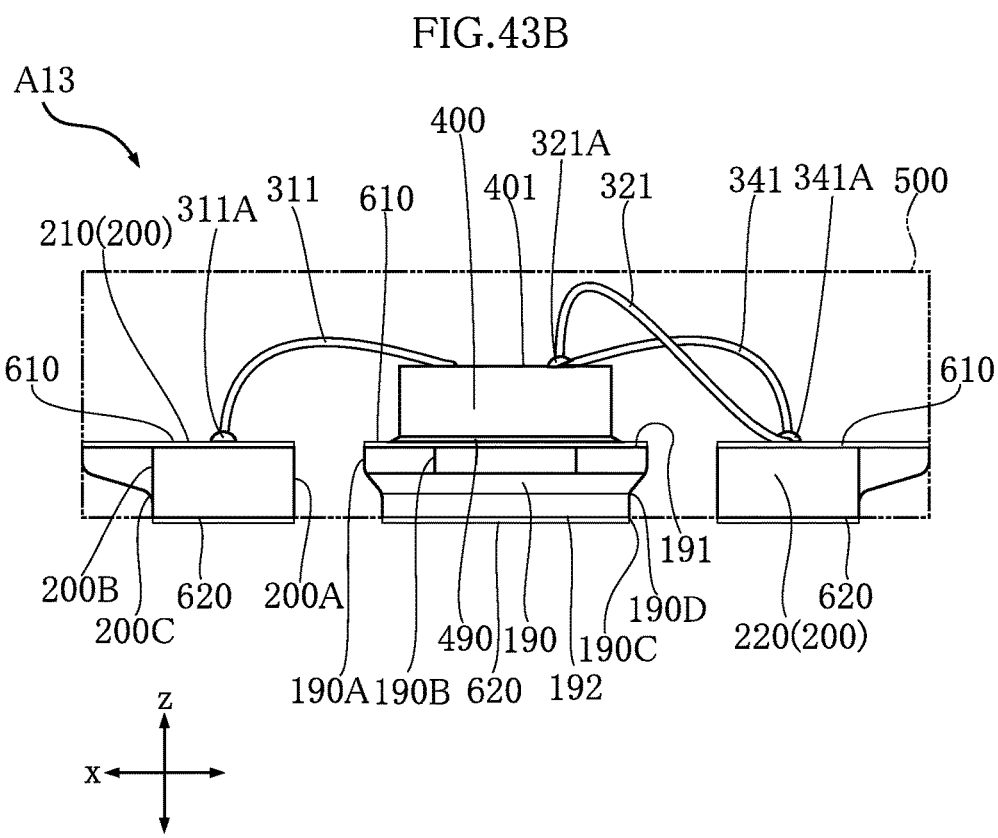
FIG. 43B is a left side view showing a variation of the structure shown in FIG. 43A.

As shown in FIGS. 41B, 42B and 43B, in the semiconductor device A13, each terminal 200 may have a first curved portion 200A, a second curved portion 200B and a third curved portion 200C. All of the first curved portion 200A, the second curved portion 200B and the third curved portion 200C are chamfered portions. Each of the first curved portions 200A forms a convex surface facing the Hall element 400. Each of the second curved portions 200B forms a concave surface dented inward of the terminal 200 as viewed in plan. The first curved portion 200A and the second curved portion 200B are connected to both of the surface of the terminal 200 that faces the same direction as the pad obverse surface 191 and the surface of the terminal 200 that faces the same direction as the pad reverse surface 192. The third curved portion 200C forms a concave surface positioned, in the direction z, between the surface of the terminal 200 that faces the same direction as the pad obverse surface 191 and the surface of the terminal 200 that faces the same direction as the pad reverse surface 192.

As shown in FIGS. 41B, 42B and 43B, in the semiconductor device A13, the die pad 190 may have first curved portions 190A, second curved portions 190B, third curved portions 190C and fourth curved portions 190D. All of the first curved portions 190A, the second curved portions 190B, the third curved portions 190C and the fourth curved portions 190D are chamfered portions of the die pad 190. Each of the first curved portions 190A forms a convex surface facing the terminal 200. Each of the second curved portions 190B forms a concave surface dented inward of the die pad 190 as viewed in plan. Both of the first curved portion 190A and the second curved portion 190B are connected to the pad obverse surface 191. Each of the third curved portions 190C is a convex surface facing the terminal 200. The third curved portion 190C is connected to the pad reverse surface 192. Each of the fourth curved portions 190D forms a concave surface positioned between the pad obverse surface 191 and the pad reverse surface 192 in the direction z.

The advantages of the semiconductor device A13 are described below.

Similarly to the semiconductor device A10, in the semiconductor device A13, both of the first terminal 210 electrically connected to the first electrode 410 and the second terminal 220 electrically connected to the second electrode 420 are positioned on the direction y1 side of the central axis CL of the Hall element 400, as viewed in plan. Further, both of the third terminal 230 electrically connected to the third electrode 430 and the fourth terminal 240 electrically connected to the fourth electrode 440 are positioned on the direction y2 side of the central axis CL, as viewed in plan. Thus, in the semiconductor device A13 again, wiring on the wiring board that is the mounting target can be simplified.

The semiconductor device A13 does not include a substrate 100 but instead includes a die pad 190 on which the Hall element 400 is mounted. The die pad 190 and the terminals 200 are made of a same lead frame. This allows each of the first through the fourth conduction paths to be made up of a wire alone. Thus, the structure of the semiconductor device A13 can be made simpler than that of the semiconductor device A11.

Figure 44A:
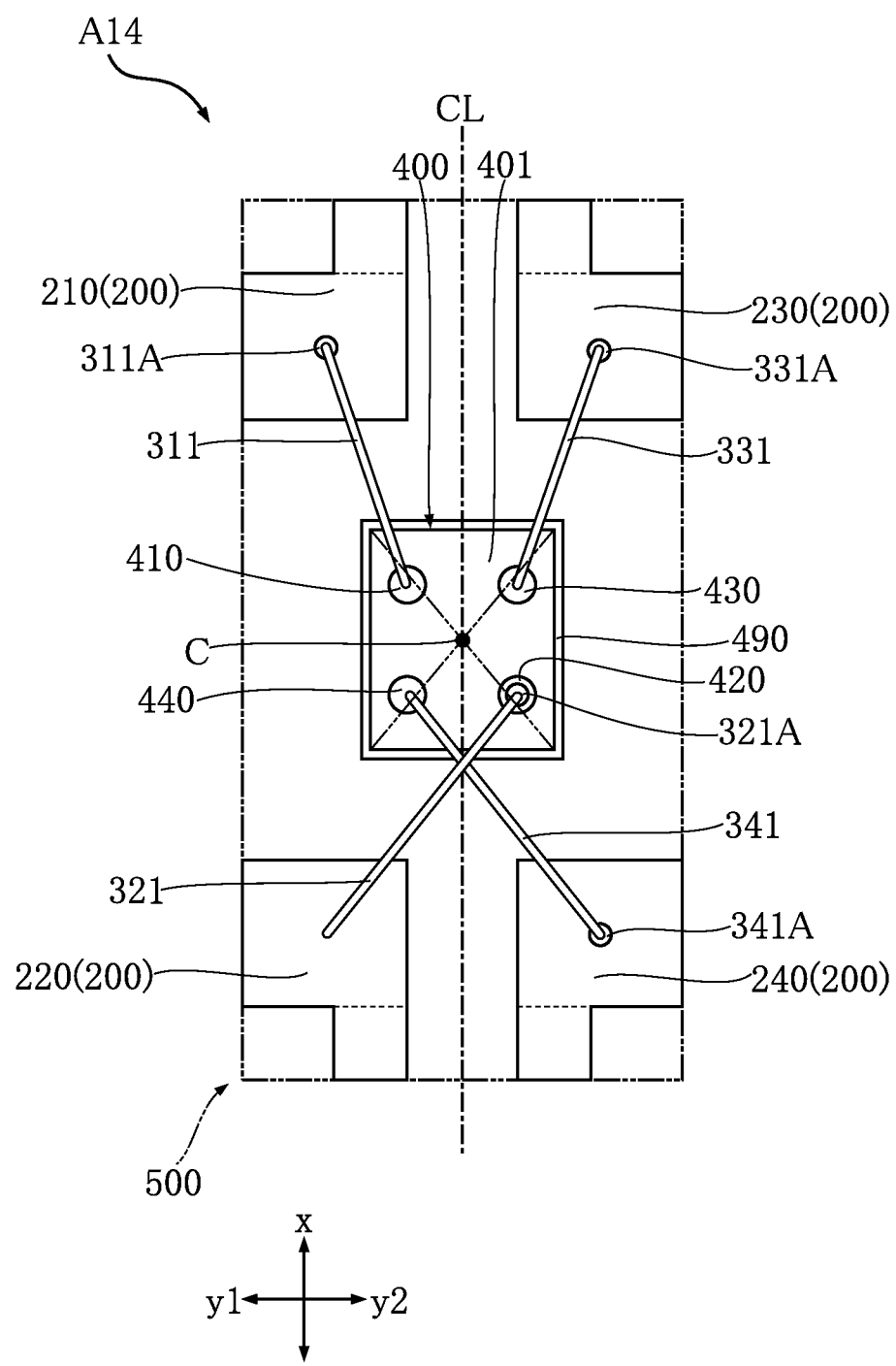
FIG. 44A is a plan view of a semiconductor device (as seen through a sealing resin) according to a fourteenth embodiment.
Figure 44B:
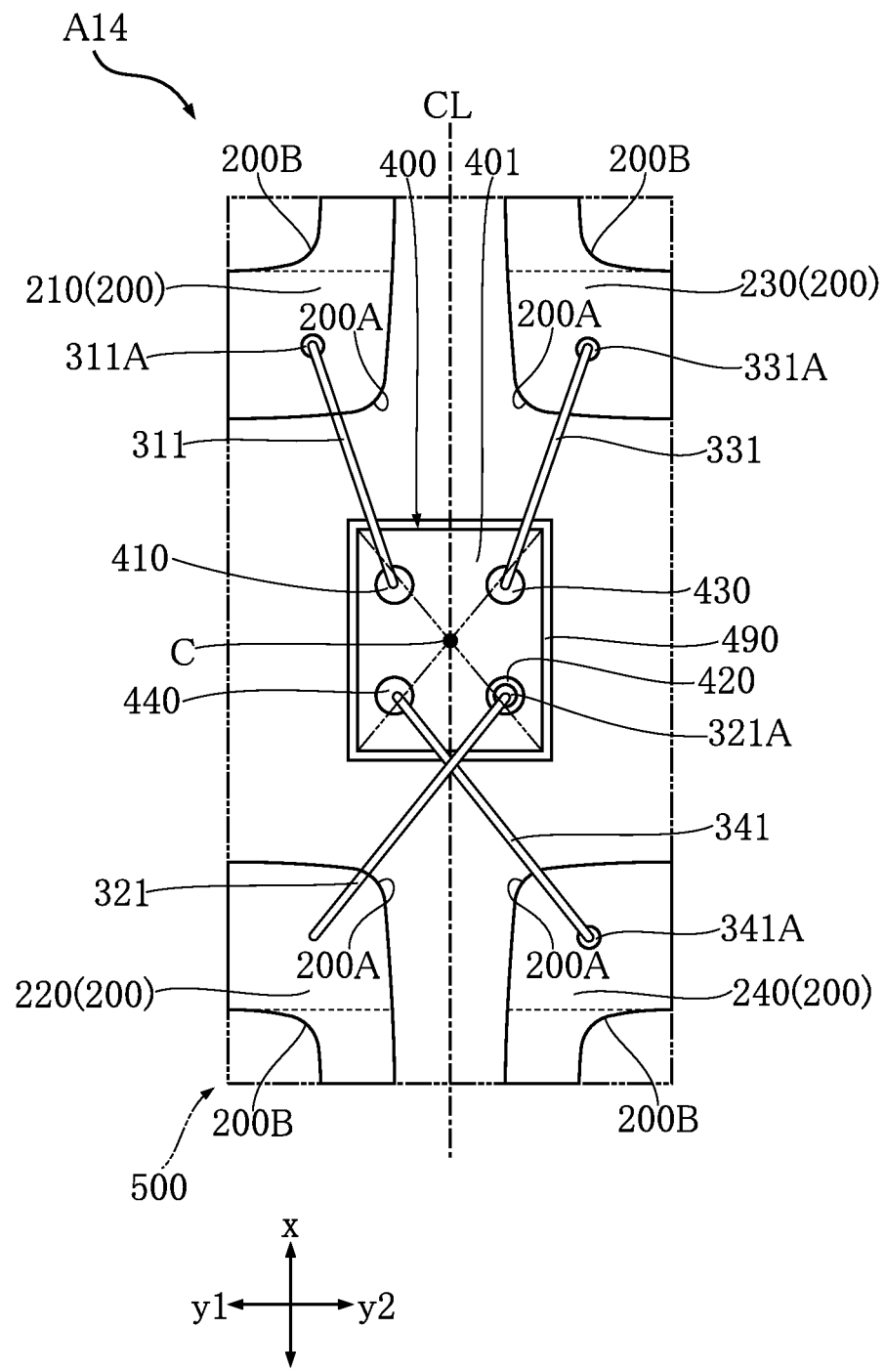
FIG. 44B is a plan view showing a variation of the structure shown in FIG. 44A.
Figure 45A:
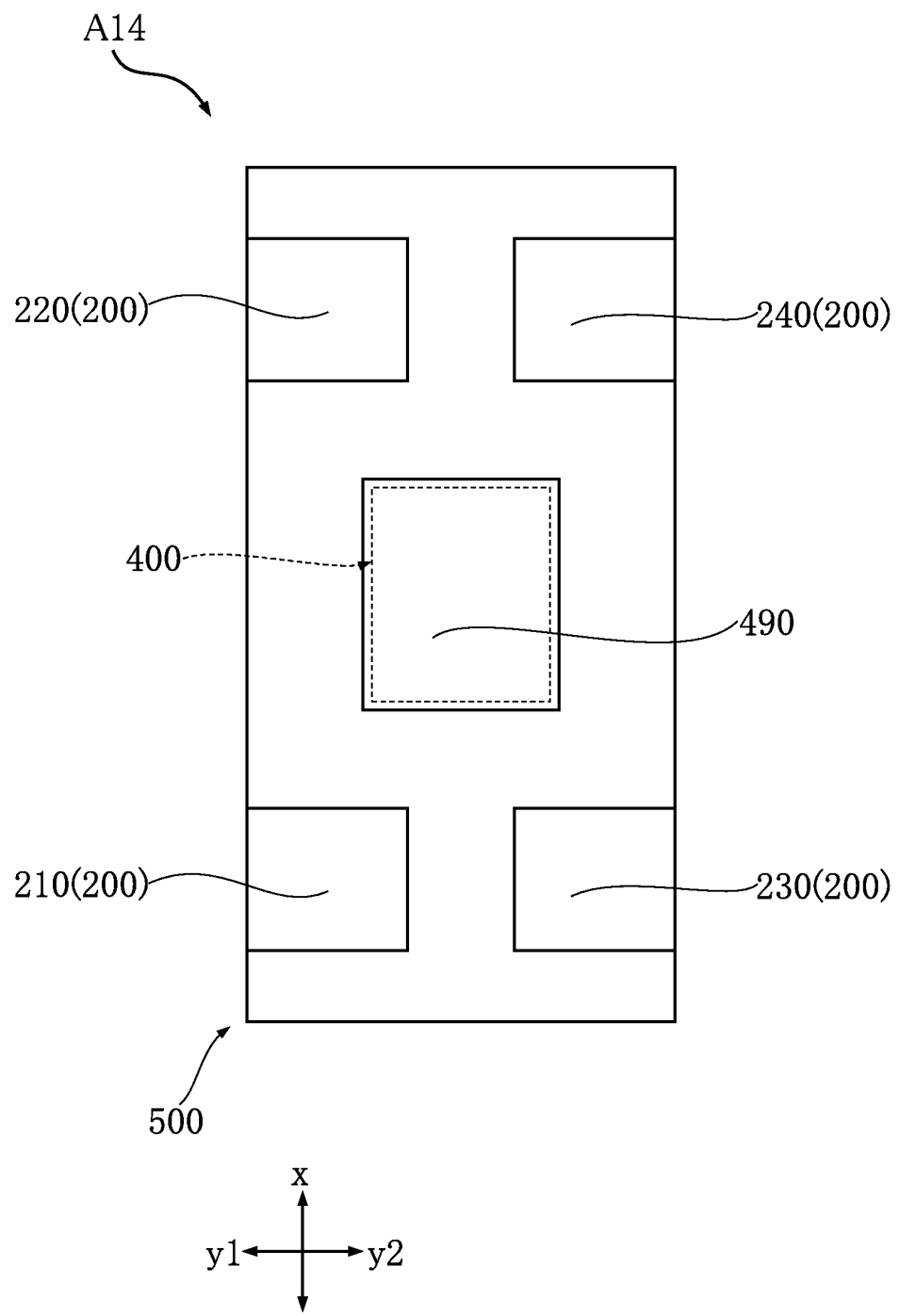
FIG. 45A is a bottom view of the semiconductor device shown in FIG. 44A.
Figure 46A:
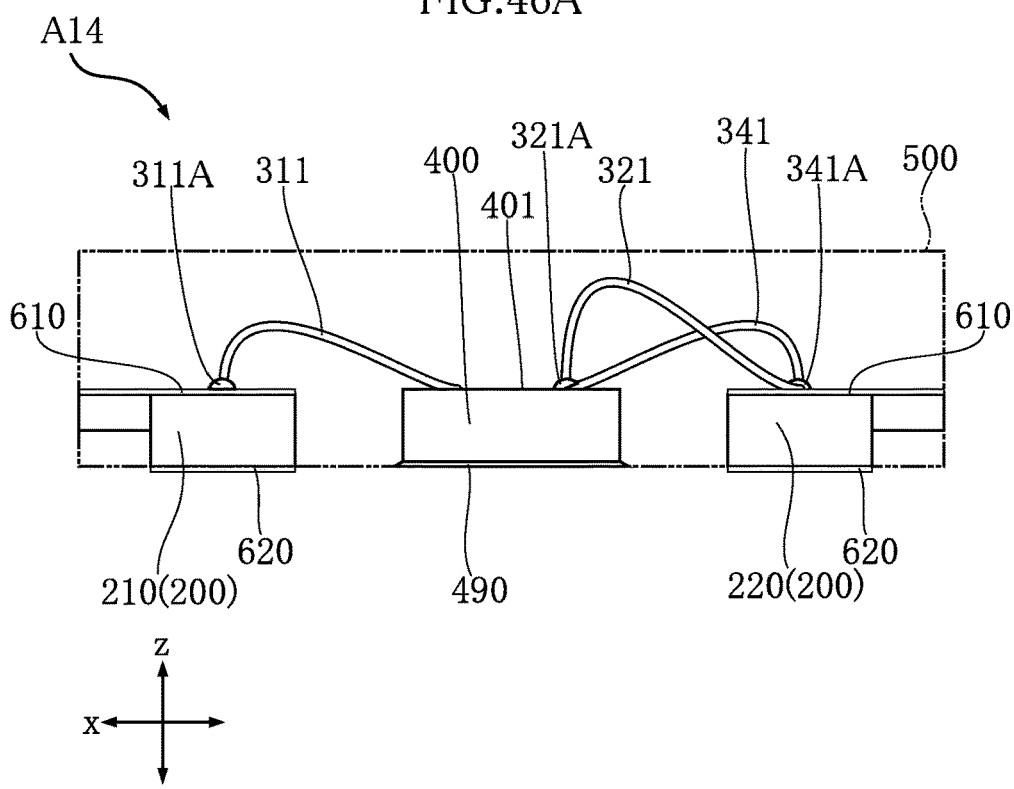
FIG. 46A is a left side view of the semiconductor device (as seen through a sealing resin) shown in FIG. 44A.
Figure 46B:
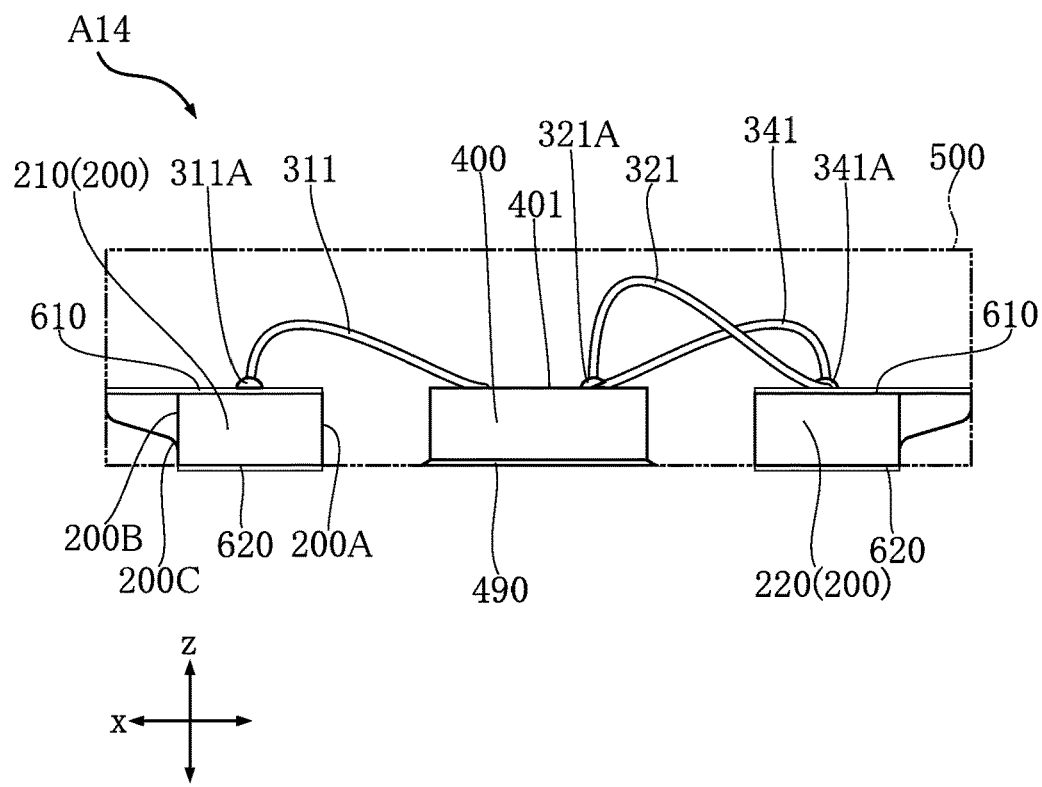
FIG. 46B is a left side view showing a variation of the structure shown in FIG. 46A.

Referring to FIGS. 44A, 45A and 46A (as well as FIGS. 44B, 45B and 46B showing variations), a semiconductor device A14 according to a fourteenth embodiment is described. In these figures, the elements that are identical or similar to those of the foregoing semiconductor device A10 are denoted by the same reference signs, and the overlapping description is omitted. For the convenience of understanding, FIGS. 44A, 44B, 46A and 46B show the semiconductor device as seen through the sealing resin 500. In FIGS. 44A, 44B, 46A and 46B, the sealing resin 500 is illustrated by an imaginary line.

As shown in FIGS. 44A-46B, unlike the semiconductor device A13, the semiconductor device A14 does not include a die pad 190, and the bonding layer 490 is exposed from the sealing resin 500 (see FIGS. 45A and 45B). In the semiconductor device A14, the bonding layer 490 may be either electrically conductive or electrically insulating. When the bonding layer 490 is electrically conductive, its material may be Ag paste, for example. When the bonding layer 490 is electrically insulating, its material is the same as the material for the bonding layer 490 of the semiconductor device A10, which may be epoxy resin or polyimide, for example.

As shown in FIGS. 44A, 44B, 46A and 46B, the manner of connection of the first wire 311, the second wire 321, the third wire 331 and the fourth wire 341 is the same as that of the wires in the semiconductor device A13. Thus, in the semiconductor device A14 again, both of the second conduction path and the fourth conduction path are positioned over both the direction y1 side and the direction y2 side of the central axis CL, as viewed in plan.

The advantages of the semiconductor device A14 are described below.

Similarly to the semiconductor device A10, in the semiconductor device A14, both of the first terminal 210 electrically connected to the first electrode 410 and the second terminal 220 electrically connected to the second electrode 420 are positioned on the direction y1 side of the central axis CL of the Hall element 400, as viewed in plan. Further, both of the third terminal 230 electrically connected to the third electrode 430 and the fourth terminal 240 electrically connected to the fourth electrode 440 are positioned on the direction y2 side of the central axis CL, as viewed in plan. Thus, in the semiconductor device A14 again, wiring on the wiring board that is the mounting target can be simplified.

Unlike the semiconductor device A13, the semiconductor device A14 does not include a die pad 190. Thus, the structure of the semiconductor device A14 can be made simpler than that of the semiconductor device A13. The dimension of the semiconductor device A14 in the direction z can be made smaller than that of the semiconductor device A13.

Figure 47A:
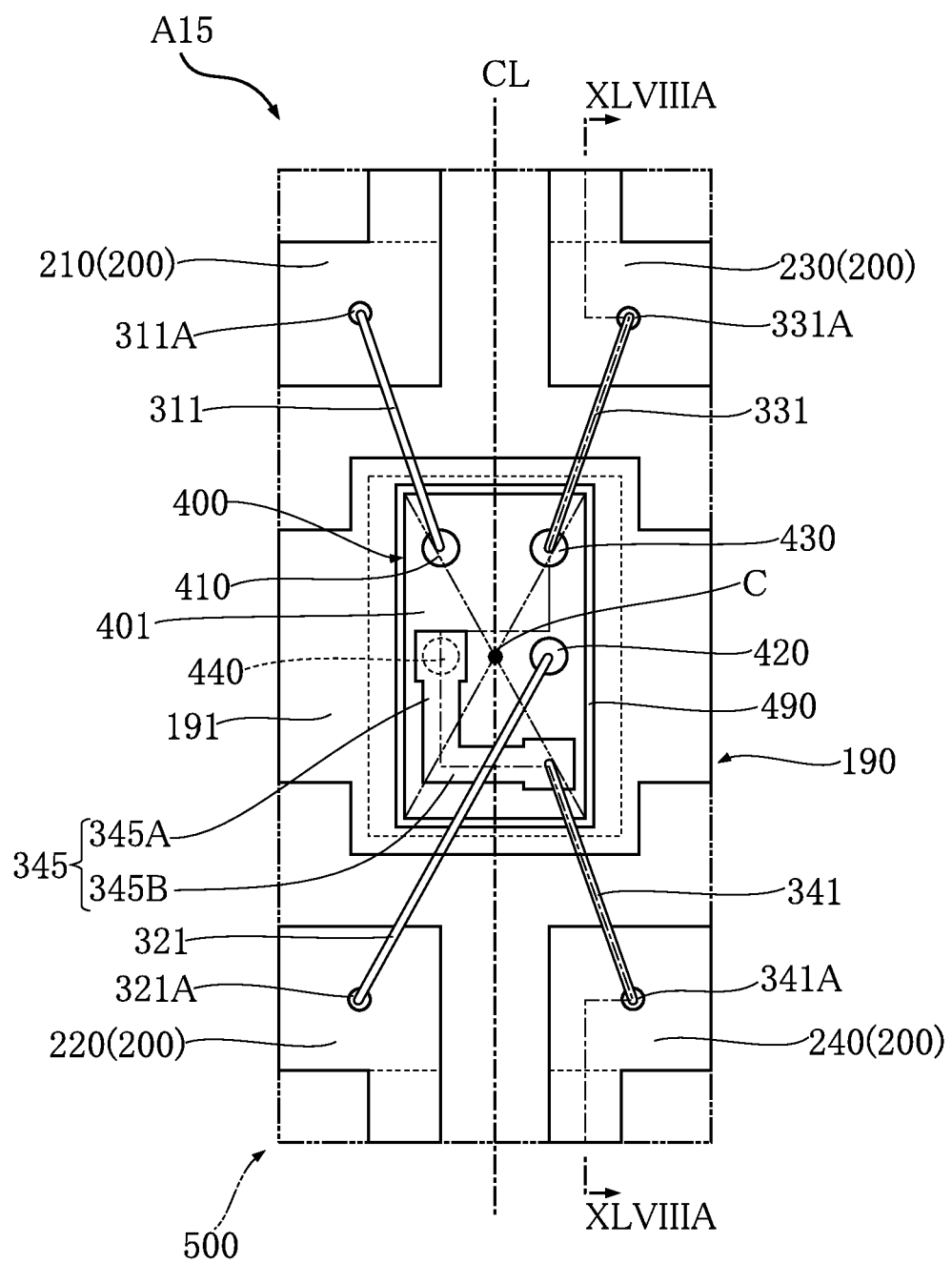
FIG. 47A is a plan view of a semiconductor device (as seen through a sealing resin) according to a fifteenth embodiment.
Figure 47B:
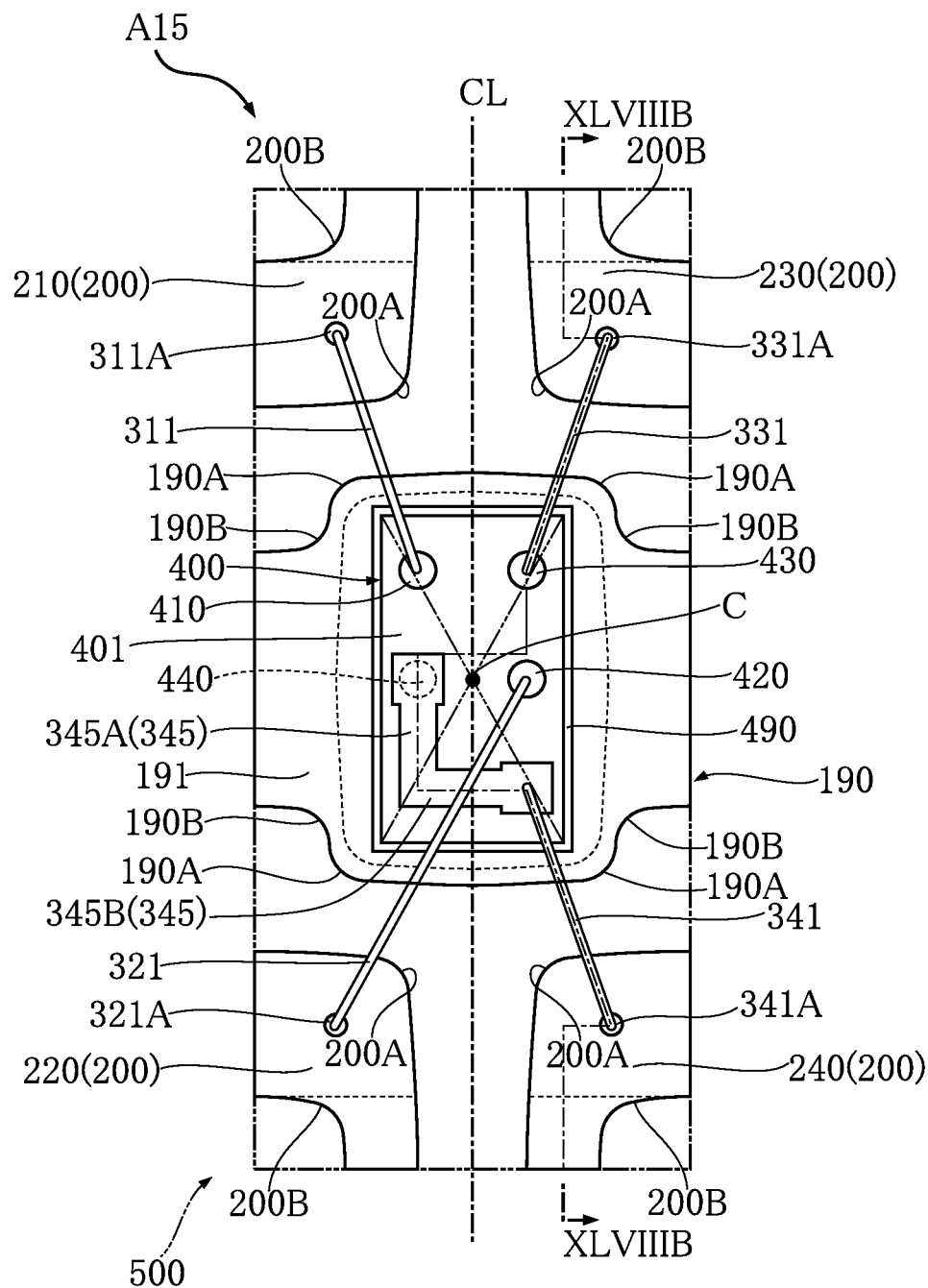
FIG. 47B is a plan view showing a variation of the structure shown in FIG. 47A.
Figure 48A:
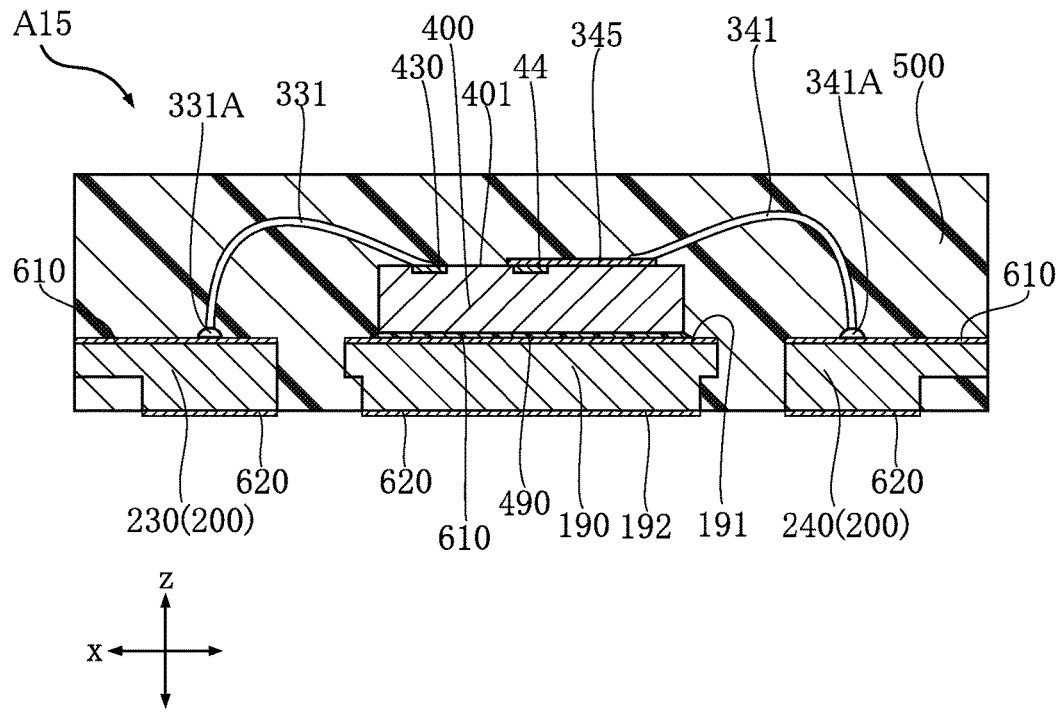
FIG. 48A is a sectional view taken along line XLVIIIA-XLVIIIA in FIG. 47A.
Figure 48B:
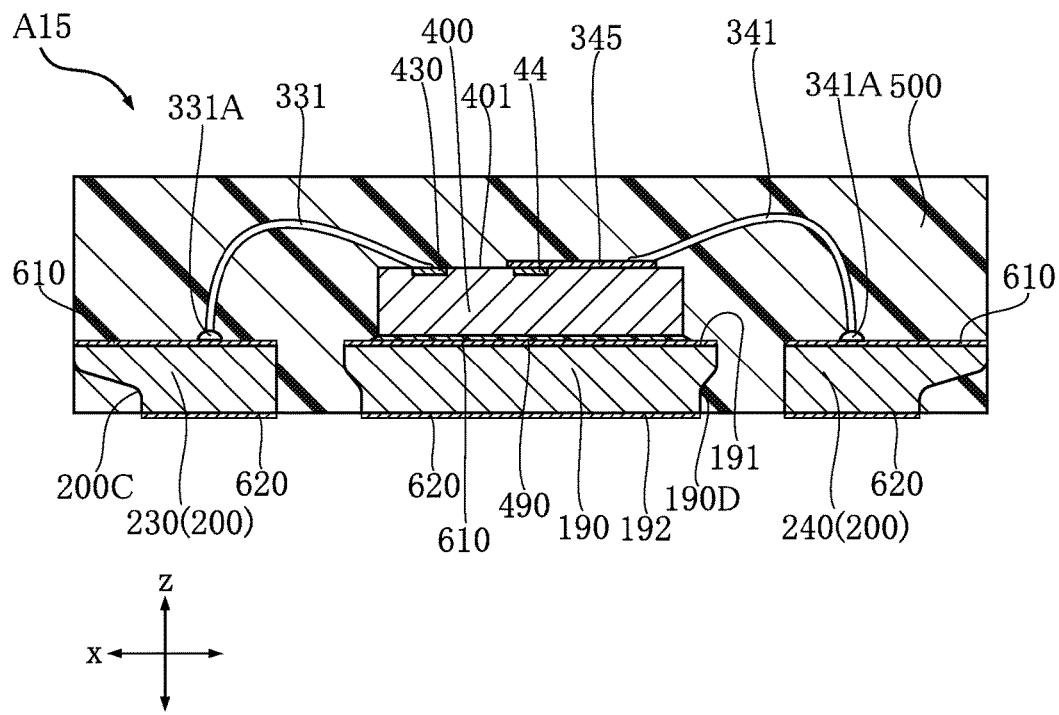
FIG. 48B is a sectional view taken along line XLVIIIB-XLVIIIB in FIG. 47B.

Referring to FIGS. 47A and 48A (as well as FIGS. 47B and 48B showing variations), a semiconductor device A15 according to a fifteenth embodiment is described. In these figures, the elements that are identical or similar to those of the foregoing semiconductor device A10 are denoted by the same reference signs, and the overlapping description is omitted. For the convenience of understanding, FIGS. 47A and 47B show the semiconductor device as seen through the sealing resin 500. In FIGS. 48A and 48B, the sealing resin 500 is illustrated by an imaginary line.

As shown in FIGS. 47A-48B, the semiconductor device A15 differs from the semiconductor device A13 in structure of the fourth conduction path and the Hall element 400. In the semiconductor device A15, the fourth conduction path is made up of a fourth wire 341 and an element obverse surface wiring 345. The element obverse surface wiring 345 is provided on the element obverse surface 401 of the Hall element 400 and connected to the fourth electrode 440. The material for the element obverse surface wiring 345 may be Al, for example.

As shown in FIGS. 47A (and 47B), the element obverse surface wiring 345 includes a first extension 345A and a second extension 345B. The first extension 345A extends from the fourth electrode 440 in parallel to the direction x (central axis CL). The second extension 345B is connected to one end of the first extension 345A and extends in the direction y across the central axis CL. One end of the fourth wire 341 is connected to one end of the second extension 345B that is located on the direction y2 side of the central axis CL. In the semiconductor device A15, as viewed in plan, the second wire 321 does not cross the fourth wire 341 but crosses the element obverse surface wiring 345. Since the Hall element 400 is provided with the element obverse surface wiring 345, the dimension in plan view of the Hall element 400 of the semiconductor device A15 can be larger than that of the Hall element 400 of the semiconductor device A13.

As shown in FIG. 47A (and FIG. 47B), the ball bonding portion 311A of the first wire 311 is connected to the first terminal 210. The ball bonding portion 321A of the second wire 321 is connected to the second terminal 220. The ball bonding portion 331A of the third wire 331 is connected to the third terminal 230. The ball bonding portion 341A of the fourth wire 341 is connected to the fourth terminal 240.

As shown in FIG. 47A (and FIG. 47B), in the semiconductor device A15 again, both of the second conduction path and the fourth conduction path are positioned over both the direction y1 side and the direction y2 side of the central axis CL, as viewed in plan.

The advantages of the semiconductor device A15 are described below.

Similarly to the semiconductor device A10, in the semiconductor device A15, both of the first terminal 210 electrically connected to the first electrode 410 and the second terminal 220 electrically connected to the second electrode 420 are positioned on the direction y1 side of the central axis CL of the Hall element 400, as viewed in plan. Further, both of the third terminal 230 electrically connected to the third electrode 430 and the fourth terminal 240 electrically connected to the fourth electrode 440 are positioned on the direction y2 side of the central axis CL, as viewed in plan. Thus, in the semiconductor device A15 again, wiring on the wiring board that is the mounting target can be simplified.

In the semiconductor device A15, the second wire 321 and the fourth wire 341 do not cross each other as viewed in plan and are prevented from approaching undesirably close to each other. Thus, the semiconductor device A15 enhances the reliability of the device.

The present disclosure is not limited to the foregoing embodiments. The specific structure of each part of the present disclosure can be changed in design in various ways.

The present disclosure includes embodiments described in the following clauses.

Clause 1A.
A semiconductor device comprising:
a Hall element including a functional surface and at least one electrode provided on the functional surface;
a sealing resin including a resin obverse surface and a resin reverse surface spaced apart from each other in a thickness direction, the sealing resin covering at least a portion of the Hall element; and
at least one mount surface electrically connected to the electrode and exposed from the resin reverse surface,
wherein the Hall element includes an exposed surface opposite to the functional surface, the exposed surface being flush with either one of the resin obverse surface and the resin reverse surface.

Clause 2A.
The semiconductor device according to clause 1A, further comprising at least one terminal made of a metal, the terminal providing the mount surface,
wherein the electrode is bonded to the terminal with a conductive bonding material, and
the exposed surface of the Hall element is exposed from the resin obverse surface.

Clause 3A.
The semiconductor device according to clause 2A, wherein the Hall element includes a pair of first sides along a first direction and a pair of second sides along a second direction perpendicular to the first direction, as viewed in plan, and
the sealing resin includes a pair of first resin side surfaces spaced apart from each other in the first direction and a pair of second resin side surfaces spaced apart from each other in the second direction, as viewed in plan.

Clause 4A.
The semiconductor device according to clause 3A, wherein the Hall element is similar in shape to the sealing resin as viewed in plan.

Clause 5A.
The semiconductor device according to clause 4A, wherein the Hall element and the sealing resin are square as viewed in plan.

Clause 6A.
The semiconductor device according to any one of clauses 3A-5A, further comprising a first additional terminal and a second additional terminal,
wherein the terminal includes a first side surface and a third side surface spaced apart from each other in the first direction, and a second side surface and a fourth side surface spaced apart from each other in the second direction,
the first side surface of the terminal faces the first additional terminal in the first direction, and
the second side surface of the terminal faces the second additional terminal in the second direction.

Clause 7A.
The semiconductor device according to clause 6A, wherein the third side surface of the terminal is exposed from and flush with one of the paired first resin side surfaces.

Clause 8A.
The semiconductor device according to clause 6A or 7A, wherein the fourth side surface of the terminal is exposed from and flush with one of the paired second resin side surfaces.

Clause 9A.
The semiconductor device according to clause 6A, wherein the third side surface of the terminal is covered with the sealing resin, and
the terminal includes an extension extending from the third side surface and exposed from one of the first resin side surfaces.

Clause 10A.
The semiconductor device according to clause 6A, wherein the fourth side surface of the terminal is covered with the sealing resin, and
the terminal includes an extension extending from the fourth side surface and exposed from one of the second resin side surfaces.

Clause 11A.
The semiconductor device according to any one of clauses 6A-10A, wherein the terminal includes a first thin portion formed along the first side surface, the first thin portion having a thickness smaller than a distance between the functional surface and the exposed surface and being covered with the sealing resin from the resin reverse surface.

Clause 12A.
The semiconductor device according to clause 11A, wherein the electrode partially overlaps with the first thin portion as viewed in plan.

Clause 13A.
The semiconductor device according to any one of clauses 6A-11A, wherein the terminal includes a second thin portion formed along the second side surface, the second thin portion having a thickness smaller than a distance between the functional surface and the exposed surface and being covered with the sealing resin from the resin reverse surface.

Clause 14A.
The semiconductor device according to clause 13A, wherein the electrode partially overlaps with the second thin portion as viewed in plan.

Clause 15A.

The semiconductor device according to clause 1A, further comprising a substrate including a base and a wiring, the base including a base obverse surface and a base reverse surface spaced apart from each other in the thickness direction, the wiring including an obverse surface portion formed on the base obverse surface, a reverse surface portion formed on the base reverse surface, and a penetrating portion penetrating the base and connecting the obverse surface portion and the reverse surface portion to each other, wherein the resin reverse surface and the base obverse surface face each other, the electrode is bonded to the obverse surface portion of the wiring pattern with a conductive bonding material, and the exposed surface of the Hall element is exposed from the resin obverse surface.

Clause 16A.

The semiconductor device according to clause 15A, wherein a periphery of the substrate coincides with a periphery of the sealing resin as viewed in plan.

Clause 17A.

The semiconductor device according to clause 16A, wherein both of the Hall element and the substrate are rectangular and the Hall element is inclined with respect to the substrate, as viewed in plan.

Clause 18A.

The semiconductor device according to any one of clauses 2A-17A, further comprising a protective layer covering both the exposed surface of the Hall element and the resin obverse surface.

Clause 1B.

A semiconductor device comprising:

a Hall element, and a plurality of terminals electrically connected to the Hall element, wherein the Hall element is provided with a first electrode and a second electrode through which Hall current flows, and a third electrode and a fourth electrode to which an electromotive force generated by Hall effect is applied, the plurality of terminals include a first terminal electrically connected to the first electrode, a second terminal electrically connected to the second electrode, a third terminal electrically connected to the third electrode, and a fourth terminal electrically connected to the fourth electrode, and as viewed in plan, the first terminal and the second terminal are positioned on an opposite side of the third terminal and the fourth terminal across a central axis extending through a center of the Hall element.

Clause 2B.

The semiconductor device according to clause 1B, further comprising a second conduction path electrically connecting the second electrode and the second terminal to each other, and a fourth conduction path electrically connecting the fourth electrode and the fourth terminal to each other, wherein each of the second conduction path and the fourth conduction path is arranged across the central axis as viewed in plan.

Clause 3B.

The semiconductor device according to clause 2B, further comprising a substrate including an obverse surface and a reverse surface spaced apart from each other in a thickness direction, wherein the plurality of terminals are arranged on the reverse surface.

Clause 4B.

The semiconductor device according to clause 3B, wherein the second conduction path includes a second obverse surface wiring arranged on the obverse surface and a second reverse surface wiring arranged on the reverse surface, and the fourth conduction path includes a fourth obverse surface wiring arranged on the obverse surface and a fourth reverse surface wiring arranged on the reverse surface.

Clause 5B.

The semiconductor device according to clause 4B, wherein the substrate is provided with at least two through-wirings extending from the obverse surface to the reverse surface through the substrate, one of the through-wirings electrically connecting the second obverse surface wiring and the second reverse surface wiring to each other, and the other one of the through-wirings electrically connecting the fourth obverse surface wiring and the fourth reverse surface wiring to each other.

Clause 6B.

The semiconductor device according to clause 4B or 5B, further comprising an insulating film covering the second reverse surface wiring and the fourth reverse surface wiring.

Clause 7B.

The semiconductor device according to clause 3B, wherein the substrate includes a first substrate providing the reverse surface and a second substrate providing the obverse surface, the first substrate includes a first intermediate surface opposite to the reverse surface, the second substrate including a second intermediate surface opposite to the obverse surface, the first intermediate surface and the second intermediate surface facing each other, the second conduction path includes a second obverse surface wiring arranged on the obverse surface and a second intermediate wiring arranged on the first intermediate surface, and the fourth conduction path includes a fourth obverse surface wiring arranged on the obverse surface and a fourth intermediate wiring arranged on the first intermediate surface.

Clause 8B.

The semiconductor device according to clause 7B, wherein the first substrate is provided with at least two first through-wirings extending through the first substrate from the first intermediate surface to the reverse surface, the second substrate is provided with at least two second through-wirings extending through the second substrate from the obverse surface to the second intermediate surface, one of the at least two first through-wirings electrically connects the second intermediate wiring and the second terminal to each other, the other one of the first through-wirings electrically connecting the fourth intermediate wiring and the fourth terminal to each other, and one of the at least two second through-wirings electrically connects the second obverse surface wiring and the second intermediate wiring to each other, the other one of the second through-wirings electrically connecting the fourth obverse surface wiring and the fourth intermediate wiring to each other.

Clause 9B.

The semiconductor device according to clause 8B, wherein the second substrate is provided with a mounting hole penetrating the second substrate from the obverse surface to the second intermediate surface, a portion of the first intermediate surface of the first substrate is exposed through the mounting hole, and the Hall element is mounted on said portion of the first intermediate surface.

Clause 10B.

The semiconductor device according to any one of clauses 4B-9B, wherein the second conduction path further includes a second wire connecting the second electrode and the second obverse surface wiring to each other, and
the fourth conduction path further includes a fourth wire connecting the fourth electrode and the fourth obverse surface wiring to each other.

Clause 11B.

The semiconductor device according to any one of clauses 4B-6B, wherein the Hall element is mounted on the obverse surface by flip chip bonding.

Clause 12B.

The semiconductor device according to clause 2B, wherein each of the second conduction path and the fourth conduction path comprises a wire.

Clause 13B.

The semiconductor device according to clause 2B, wherein the Hall element includes an element obverse surface, and
the fourth conduction path includes an element obverse surface wiring provided on the element obverse surface, the element obverse surface wiring including a first extension connected to the fourth electrode and extending in parallel to the central axis and a second extension connected to the first extension and extending across the central axis.

Clause 14B.

The semiconductor device according to clause 13B, wherein the second conduction path comprises a wire, and the fourth conduction path further includes a fourth wire connecting the second extension of the element obverse surface wiring and the fourth terminal to each other.

Clause 15B.

The semiconductor device according to any one of clauses 12B-14B, further comprising a die pad on which the Hall element is mounted.

Clause 16B.

The semiconductor device according to any one of clauses 1B-15B, further comprising a sealing resin covering the Hall element.

The invention claimed is:

1. A semiconductor device comprising:
   a Hall element including a functional surface and at least one electrode provided on the functional surface;
   a sealing resin including a resin obverse surface and a resin reverse surface spaced apart from each other in a thickness direction, the sealing resin covering at least a portion of the Hall element; and
   at least one mount surface electrically connected to the electrode and exposed from the resin reverse surface,
   wherein the Hall element includes an exposed surface opposite to the functional surface, the exposed surface being flush with either one of the resin obverse surface and the resin reverse surface,
   as viewed in the thickness direction, the sealing resin surrounds the Hall element and overlaps with the Hall element.

2. The semiconductor device according to claim 1, further comprising at least one terminal made of a metal, the terminal providing the mount surface,
   wherein the electrode is bonded to the terminal with a conductive bonding material, and
   the exposed surface of the Hall element is exposed from the resin obverse surface.

3. The semiconductor device according to claim 2, wherein the Hall element includes a pair of first sides along a first direction and a pair of second sides along a second direction perpendicular to the first direction, as viewed in plan, and
   the sealing resin includes a pair of first resin side surfaces spaced apart from each other in the first direction and a pair of second resin side surfaces spaced apart from each other in the second direction, as viewed in plan.

4. The semiconductor device according to claim 3, wherein the Hall element is similar in shape to the sealing resin as viewed in plan.

5. The semiconductor device according to claim 4, wherein the Hall element and the sealing resin are square as viewed in plan.

6. The semiconductor device according to claim 3, further comprising a first additional terminal and a second additional terminal,
   wherein the terminal includes a first side surface and a third side surface spaced apart from each other in the first direction, and a second side surface and a fourth side surface spaced apart from each other in the second direction,
   the first side surface of the terminal faces the first additional terminal in the first direction, and
   the second side surface of the terminal faces the second additional terminal in the second direction.

7. The semiconductor device according to claim 6, wherein the third side surface of the terminal is exposed from and flush with one of the paired first resin side surfaces.

8. The semiconductor device according to claim 6, wherein the fourth side surface of the terminal is exposed from and flush with one of the paired second resin side surfaces.

9. The semiconductor device according to claim 6, wherein the third side surface of the terminal is covered with the sealing resin, and
   the terminal includes an extension extending from the third side surface and exposed from one of the first resin side surfaces.

10. The semiconductor device according to claim 6, wherein the fourth side surface of the terminal is covered with the sealing resin, and
    the terminal includes an extension extending from the fourth side surface and exposed from one of the second resin side surfaces.

11. The semiconductor device according to claim 6, wherein the terminal includes a first thin portion formed along the first side surface, the first thin portion having a thickness smaller than a distance between the functional surface and the exposed surface and being covered with the sealing resin from the resin reverse surface.

12. The semiconductor device according to claim 11, wherein the electrode partially overlaps with the first thin portion as viewed in plan.

13. The semiconductor device according to claim 6, wherein the terminal includes a second thin portion formed along the second side surface, the second thin portion having a thickness smaller than a distance between the functional surface and the exposed surface and being covered with the sealing resin from the resin reverse surface.

14. The semiconductor device according to claim 13, wherein the electrode partially overlaps with the second thin portion as viewed in plan.

15. The semiconductor device according to claim 1, further comprising a substrate including a base and a wiring, the base including a base obverse surface and a base reverse surface spaced apart from each other in the thickness direction, the wiring including an obverse surface portion formed on the base obverse surface, a reverse surface portion formed on the base reverse surface, and a penetrating portion penetrating the base and connecting the obverse surface portion and the reverse surface portion to each other,
- wherein the resin reverse surface and the base obverse surface face each other,
- the electrode is bonded to the obverse surface portion of the wiring pattern with a conductive bonding material, and
- the exposed surface of the Hall element is exposed from the resin obverse surface.

16. The semiconductor device according to claim 15, wherein a periphery of the substrate coincides with a periphery of the sealing resin as viewed in plan.

17. The semiconductor device according to claim 16, wherein both of the Hall element and the substrate are rectangular and the Hall element is inclined with respect to the substrate, as viewed in plan.

18. The semiconductor device according to claim 2, further comprising a protective layer covering both the exposed surface of the Hall element and the resin obverse surface.

19. The semiconductor device according to claim 1, further comprising a terminal electrically connected to the electrode, wherein the terminal has a periphery including a curved portion, as viewed in the thickness direction.

20. The semiconductor device according to claim 1, further comprising a terminal electrically connected to the electrode, wherein the Hall element comprises a magnetosensitive layer electrically connected to the electrode, and
- as viewed in the thickness direction, an entirety of the electrode overlaps with the magnetosensitive layer and the terminal.

* * * * *